United States Patent
Han et al.

(10) Patent No.: US 7,315,466 B2
(45) Date of Patent: Jan. 1, 2008

(54) SEMICONDUCTOR MEMORY DEVICE AND METHOD FOR ARRANGING AND MANUFACTURING THE SAME

(75) Inventors: Gong-Heum Han, Gyeonggi-do (KR); Hyou-Youn Nam, Gyeonggi-do (KR); Bo-Tak Lim, Gyeonggi-do (KR); Han-Byung Park, Gyeonggi-do (KR); Soon-Moon Jung, Gyeonggi-do (KR); Hoon Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 11/191,496

(22) Filed: Jul. 28, 2005

(65) Prior Publication Data

US 2006/0028861 A1 Feb. 9, 2006

(30) Foreign Application Priority Data

| Aug. 4, 2004 | (KR) | 10-2004-0016527 |
| May 9, 2005 | (KR) | 10-2005-0038621 |

(51) Int. Cl.
*G11C 11/00* (2006.01)
(52) U.S. Cl. .............. 365/154; 365/189.11; 365/177; 365/63
(58) Field of Classification Search .......... 365/154, 365/189.11, 177, 63; 257/E21.661, E27.098, 257/903
See application file for complete search history.

(56) References Cited

U.S. PATENT DOCUMENTS

| 4,680,609 A | 7/1987 | Calder et al. |
| 4,902,637 A | 2/1990 | Kondou et al. |

(Continued)

FOREIGN PATENT DOCUMENTS

| JP | 1998-270634 | 10/1998 |
| JP | 2002-026283 | 1/2002 |
| KR | 1019970030844 | 6/1997 |
| KR | 1998-064631 | 7/1998 |
| KR | 10-2001-0088672 A | 9/2001 |
| KR | 1020040054361 A | 6/2004 |

OTHER PUBLICATIONS

Jung et al., The Revolutionary and Truly 3-dimensional 25F² SRAM Technology with the smallest S³ (Stacked Single-crystal Si) Cell, 0.16 um², and SSTFT (Stacked Single-crystal Thin Film Transistor) for Ultra High Density SRAM, Symposium on VLSI Technology Digest of Technical Papers, 2004, pp. 228-229.
Partial European Search Report, European Application No. 05 01 6656, Apr. 13, 2007.

*Primary Examiner*—David Lam
(74) *Attorney, Agent, or Firm*—Myers Bigel Sibley & Sajovec PA

(57) ABSTRACT

A semiconductor device and method for arranging and manufacturing the same are disclosed. The semiconductor device includes a plurality of inverters including at least one first pull-up transistor and first pull-down transistor and inverting and outputting an input signal, respectively; and a plurality of NAND gates including at least two second pull-up transistor and second pull-down transistor and generating an output signal having a high level if at least one of at least two input signals has a low level, respectively, wherein the at least one first pull-up transistor and first pull-down transistor and the at least two second pull-up transistor and second pull-down transistor are stacked and arranged on at least two layers.

14 Claims, 56 Drawing Sheets

U.S. PATENT DOCUMENTS

| | | | |
|---|---|---|---|
| 5,200,921 A | * | 4/1993 | Okajima ................ 365/189.11 |
| 5,308,778 A | | 5/1994 | Fitch et al. |
| 5,532,957 A | * | 7/1996 | Malhi ........................ 365/154 |
| 5,714,394 A | | 2/1998 | Kadosh et al. |
| 5,807,791 A | | 9/1998 | Bertin et al. |
| 5,925,913 A | * | 7/1999 | Draper ....................... 257/344 |
| 6,172,381 B1 | | 1/2001 | Gardner et al. |
| 6,271,542 B1 | * | 8/2001 | Emma et al. ................. 257/67 |
| 6,678,184 B2 | * | 1/2004 | Lysinger et al. .............. 365/49 |
| 2002/0119640 A1 | | 8/2002 | Gonzalez |

* cited by examiner

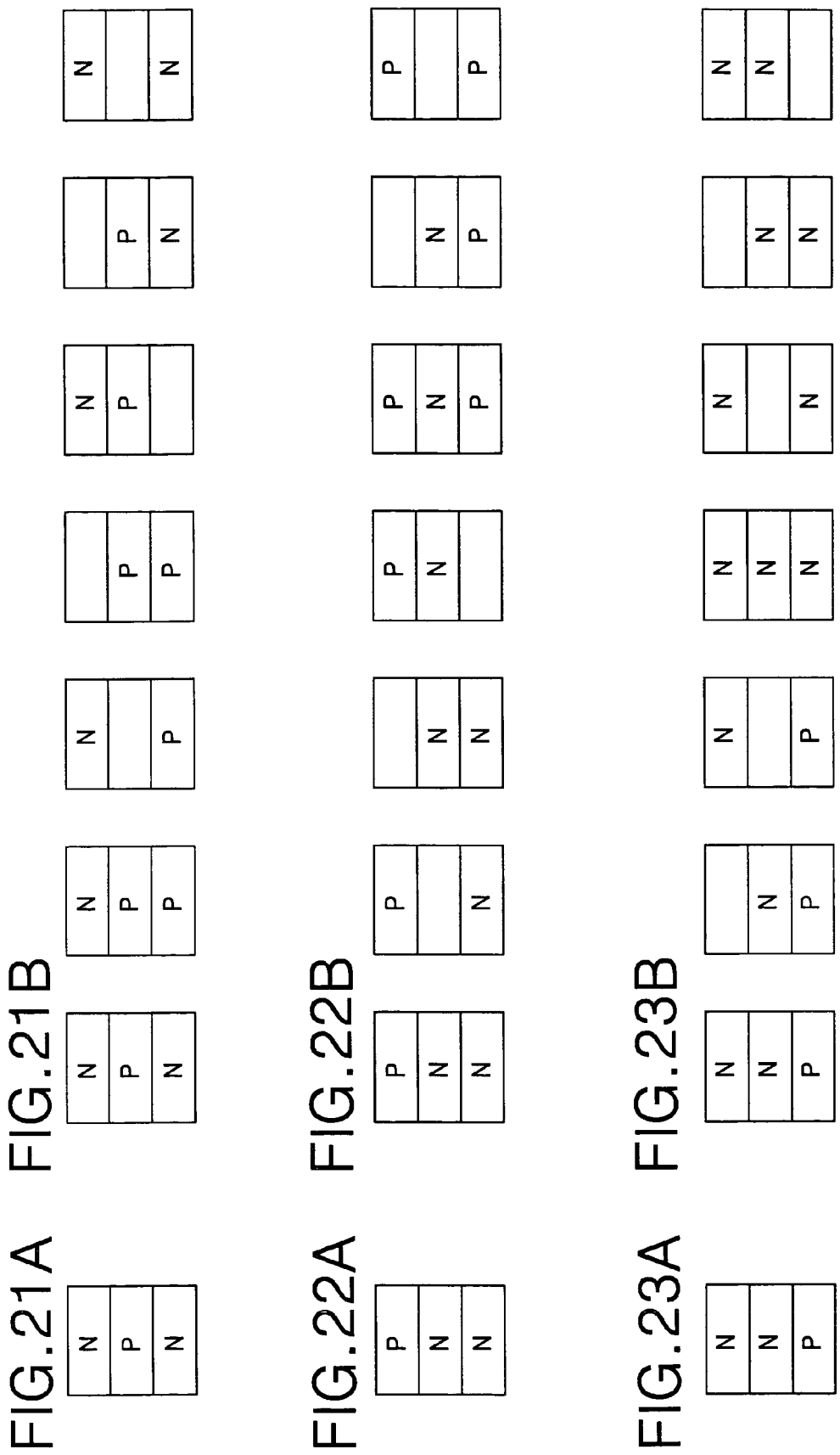

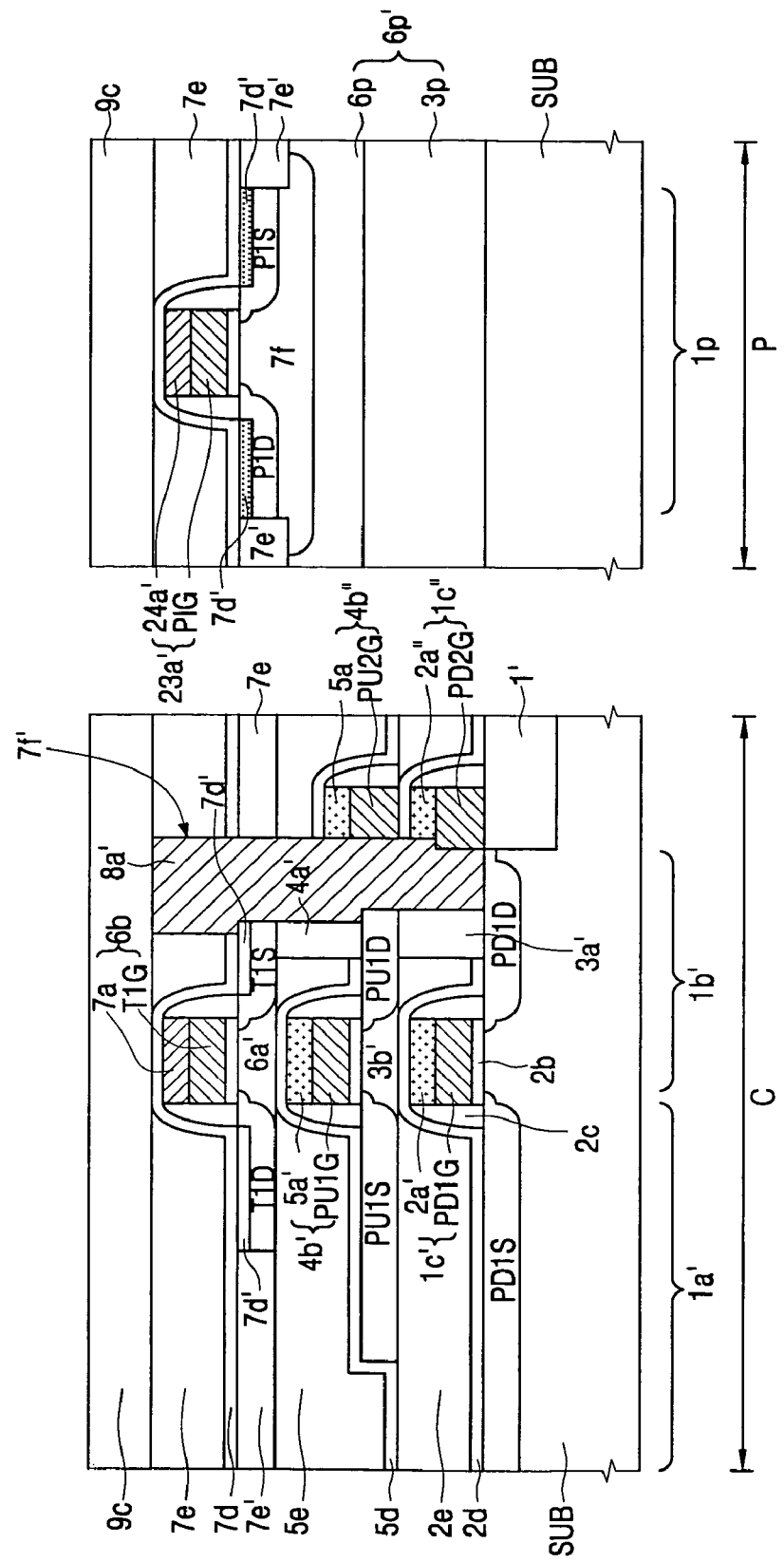

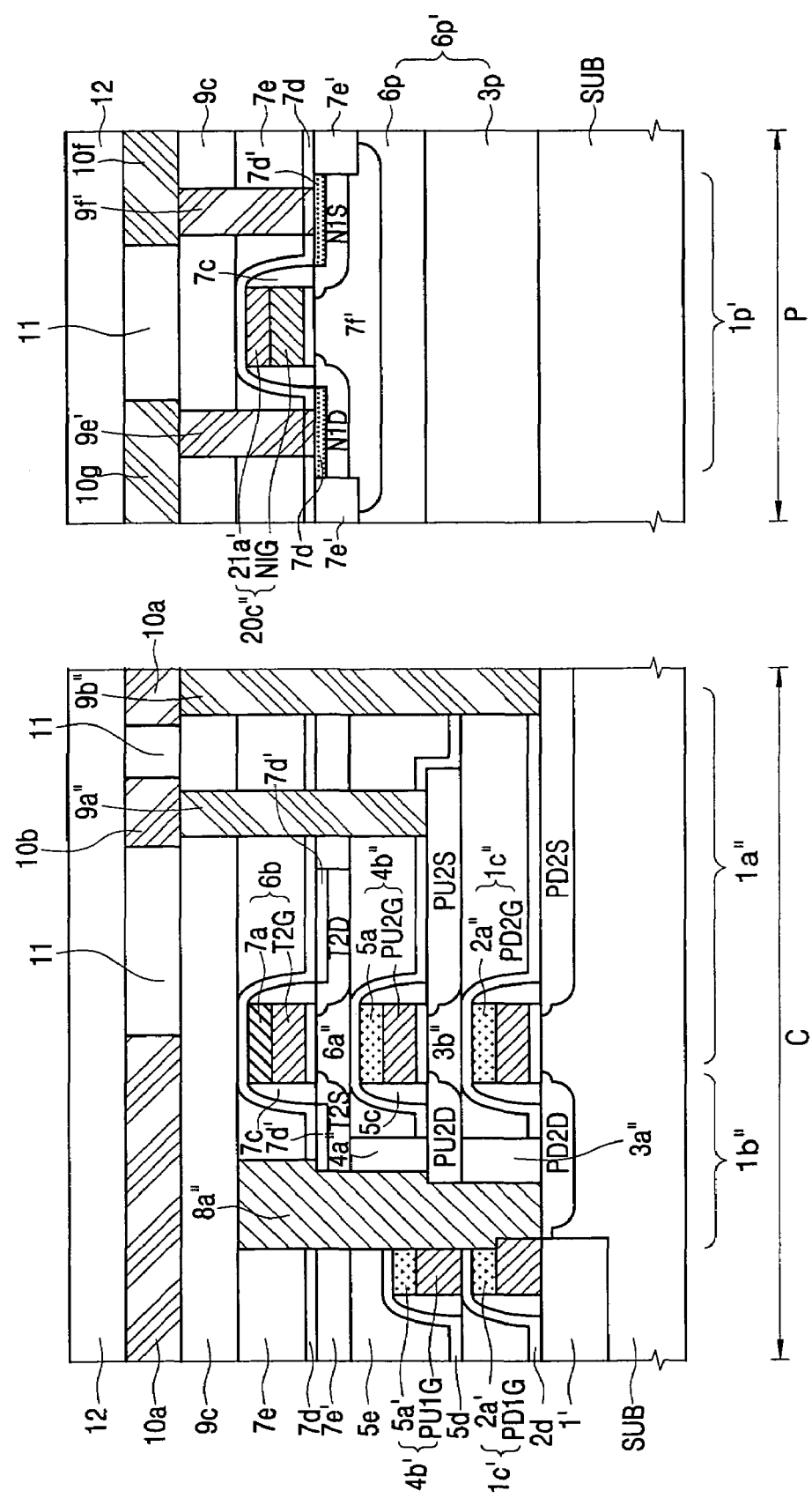

SEMICONDUCTOR MEMORY DEVICE AND METHOD FOR ARRANGING AND MANUFACTURING THE SAME

CROSS-REFERENCE TO RELATED APPLICATION

This application claims the benefit of Korean Patent Application Nos. 2004-61527, filed Aug. 4, 2004, and 2005-38621, filed May 9, 2005, the disclosures of which are hereby incorporated herein by reference.

FIELD OF THE INVENTION

The present invention relates to integrated circuit devices and, more particularly, to integrated circuit memory devices and methods of manufacturing integrated circuit memory devices.

BACKGROUND OF THE INVENTION

Conventional semiconductor memory devices may include a memory cell array having a plurality of memory cells, which store data and a peripheral circuit which controls data input/output to/from the memory cell array. A static memory cell (e.g., SRAM cell) includes a plurality of transistors, and a dynamic memory cell (e.g., DRAM cell) includes one transistor and one capacitor. The peripheral circuit may include an inverter, a NAND gate and a NOR gate, where each of the gates includes transistors. In the typical memory cell and peripheral circuit, all of a plurality of transistors are arranged on the same layer above a semiconductor substrate. Thus, as the capacity of the memory cell array (i.e., the number of the memory cells) is increased, the layout area size is also increased, which may lead to large chip size.

For the foregoing reason, research has been performed to reduce the layout area size even as a capacity of the memory cell array is increased. For example, a method of reducing layout area size of the memory cell array by stacking transistors in a memory cell has been introduced (see, e.g., FIGS. 5A and 6A).

However, if layout area size of the peripheral circuit as well as layout area size of the memory cell array is reduced, the total area size of the semiconductor memory device can be reduced as much. Besides, as transistors that form the memory cell are stacked, the transistors, which form the memory cell, should have different structure.

SUMMARY OF THE INVENTION

It is an object of the present invention to provide a semiconductor memory device which has a peripheral circuit suitable for a memory cell array having stacked transistors.

It is another object of the present invention to provide methods for arranging and manufacturing a semiconductor memory device which has a peripheral circuit suitable for a memory cell array having stacked transistors.

A first embodiment of the present invention includes a plurality of inverters including at least one first pull-up transistor and first pull-down transistor and inverting and outputting an input signal, respectively; and a plurality of NAND gates including at least two second pull-up transistor and second pull-down transistor and generating an output signal having a high level if at least one of at least two input signals has a low level, respectively, wherein the at least one first pull-up transistor and first pull-down transistor and the at least two second pull-up transistor and second pull-down transistor are stacked and arranged on at least two layers.

A second embodiment of a semiconductor device of the present invention includes a plurality of inverters including at least one first pull-up transistor and first pull-down transistor and inverting and outputting an input signal, respectively; a plurality of NAND gates including at least two second pull-up transistor and second pull-down transistor and generating an output signal having a high level if at least one of at least two input signals has a low level, respectively; and a plurality of NOR gates including at least two third pull-up transistor and third pull-down transistor and generating an output signal having a high level if all of at least two input signals have a low level, respectively, wherein the at least one first pull-up transistor and first pull-down transistor, the at least two second pull-up transistor and second pull-down transistor, and the at least two third pull-up transistor and third pull-down transistor are stacked and arranged on at least two layers.

In the first and second aspects of the semiconductor memory devices, the first to third pull-up transistors are PMOS transistors, and the first to third pull-down transistors are NMOS transistors. In the first and second aspects of the semiconductor memory devices, a transistor to be arranged on a first layer is a bulk transistor, and a transistor to be arranged on a second or more layer is a thin film transistor. In the first and second aspects of the semiconductor memory devices, some of the first to third pull-up transistors and some of the first to third pull-down transistors are arranged together on the first layer. Only the first to third pull-up transistors or only the first to third pull-down transistors are arranged on the second or more layer.

A third embodiment of a semiconductor memory device of the present invention includes a memory cell array including a plurality of memory cells which are accessed in response to a plurality of word line selecting signals and a plurality of column selecting signals; a row decoder for decoding a row address to generate the plurality of word line selecting signals; and a column decoder for decoding a column address to generate the plurality of column selecting signals, wherein the row (column) decoder includes a plurality of inverters, each of the plurality of inverters includes at least one pull-up transistor and pull-down transistor, the pull-up and pull-down transistors are stacked and arranged on at least two layers.

The column (row) decoder includes a plurality of inverters, each of the plurality of inverters includes at least one pull-up transistor and pull-down transistor, and the pull-up and pull-down transistors are stacked and arranged on at least two layers.

The plurality of memory cells include a plurality of NMOS transistors, and the plurality of NMOS transistors are stacked and arranged on the at least two layers. The pull-up transistor is a PMOS transistor, and the pull-down transistor is an NMOS transistor. A transistor to be arranged on a first layer is a bulk transistor, and a transistor to be arranged on a second or more layer is a thin film transistor. Some of the pull-up transistors and some of the pull-down transistors are arranged together on the first layer. Only the pull-up transistors or only the pull-down transistors are arranged on the second or more layer.

A fourth embodiment of a semiconductor memory device of the present invention includes a memory cell array including a plurality of memory cells which are accessed in response to a plurality of word line selecting signals and a plurality of column selecting signals; a row decoder for decoding a row address to generate the plurality of word line selecting signals; and a column decoder for decoding a column address to generate the plurality of column selecting signals, wherein the row (column) decoder includes a plurality of inverters and a plurality of NAND gates, each of the plurality of inverters includes at least one first pull-up transistor and first pull-down transistor, each of the plurality of NAND gates includes at least two second pull-up transistors and second pull-down transistors, and the first and second pull-up transistors and the first and second pull-down transistors are stacked and arranged on at least two layers.

The column (row) decoder includes a plurality of inverters and a plurality of NAND gates, each of the plurality of inverters includes at least one first pull-up transistor and first pull-down transistor, each of the plurality of NAND gates includes at least two second pull-up transistors and second pull-down transistors, the first and second pull-up transistors and the first and second pull-down transistors are stacked and arranged on at least two layers.

The plurality of memory cells include a plurality of NMOS transistors, and the plurality of NMOS transistors are stacked and arranged on the at least two layers. The first and second pull-up transistors are PMOS transistors, and the first and second pull-down transistors are NMOS transistors. A transistor to be arranged on a first layer is a bulk transistor, and a transistor to be arranged on a second or more layer is a thin film transistor. Some of the first and second pull-up transistors and some of the first and second pull-down transistors are arranged together on the first layer. Only the first and second pull-up transistors or only the first and second pull-down transistors are arranged on the second or more layer.

A fifth embodiment of a semiconductor memory device of the present invention includes a memory cell array including a plurality of memory cells which are accessed in response to a plurality of word line selecting signals and a plurality of column selecting signals; and a peripheral circuit including a row decoder for decoding a row address to generate the plurality of word line selecting signals, a column decoder for decoding a column address to generate the plurality of column selecting signals, and a controller for controlling input/output of data to/from the memory cell array, wherein the peripheral circuit includes a plurality of inverters, a plurality of NAND gates, and a plurality of NOR gates, each of the plurality of inverters includes at least one first pull-up transistor and first pull-down transistor, each of the plurality of NAND gates includes at least two second pull-up transistors and second pull-down transistors, each of the plurality of NOR gates includes at least three third pull-up transistors and third pull-down transistors, and the first to third pull-up transistors and the first to third pull-down transistors are stacked and arranged on at least two layers.

The plurality of memory cells include a plurality of NMOS transistors, and the plurality of NMOS transistors are stacked and arranged on the at least two layers. The first to third pull-up transistors are PMOS transistors, and the first to third pull-down transistors are NMOS transistors. A transistor to be arranged on a first layer is a bulk transistor, and a transistor to be arranged on a second or more layer is a thin film transistor. Some of the first to third pull-up transistors and some of the first to third pull-down transistors are arranged together on the first layer. Only the first to third pull-up transistors or only the first to third pull-down transistors are arranged on the second or more layer.

A sixth embodiment of a semiconductor device includes a semiconductor substrate having a cell region and a peripheral circuit region; bulk transistors arranged on the semiconductor substrate of the cell region; an interlayer insulator pattern arranged in the cell region to cover the bulk transistors; thin film transistors arranged on the interlayer insulator pattern; a peripheral body pattern arranged to contact the semiconductor substrate of the peripheral circuit region; and peripheral transistors arranged in the peripheral body pattern, the peripheral transistors arranged to be located on the substantially same imaginary horizontal line as the thin film transistors of the cell region. The peripheral body pattern is a single crystal semiconductor structure. The thin film transistors are single crystal thin film transistors. The bulk transistors and the thin film transistors are cell transistors of an SRAM memory cell.

The bulk transistors include first and second bulk transistors, the thin film transistors include first and second thin film transistors, and the first and second thin film transistors are arranged to respectively overlap the first and second bulk transistors. The semiconductor device further includes first and second lower thin film transistors respectively arranged between the first and second bulk transistors and the first and second thin film transistors, wherein the first and second lower thin film transistors are arranged to respectively overlap the first and second bulk transistors.

The semiconductor device further includes a first node plug for electrically connecting a first ion-doped region of the first bulk transistor, a first ion-doped region of the first lower thin film transistor, and a first ion-doped region of the first upper thin film transistor through the interlayer insulator; and a second node plug for electrically connecting a first ion-doped region of the second bulk transistor, a first ion-doped region of the second lower thin film transistor, and a first ion-doped region of the second upper thin film transistor through the interlayer insulator. The first and second bulk transistors are first and second n-channel driving transistors, respectively, and the first ion-doped regions of the first and second bulk transistors are drain regions. A gate electrode of the first driving transistor is electrically connected to the second node plug, and a gate of the second driving transistor is electrically connected to the first node plug.

The first and second lower thin film transistors are respectively first and second p-channel load transistors, the first and second thin film transistors are first and second n-channel transmission transistors, the first ion-doped regions of the first and second lower thin film transistors are drain regions, and the first ion-doped regions of the first and second thin film transistors are source regions. Gate electrodes of the first and second load transistors are arranged to overlap gate electrodes of the first and second driving transistors, the gate electrode of the first load transistor is electrically connected to the second node plug, and the gate electrode of the second load transistor is electrically connected to the first node plug. Gate electrodes of the first and second thin film transistors are electrically connected to each other to form a word line. At least the peripheral transistor includes a metal silicide layer arranged on a surface of a peripheral gate electrode. At least the peripheral transistor includes a metal silicide layer arranged on surfaces of peripheral source and drain regions.

A first aspect of an arrangement method of a semiconductor memory device according to the present invention includes stacking and arranging two transmission transistors, two first pull-up transistors, two first pull-down transistors which constitute each of a plurality of memory cells of a memory cell array on at least two layers; and stacking and arranging at least one second pull-up transistors and second pull-down transistors which constitute each of a plurality of inverters of a peripheral circuit and at least two third pull-up transistors and third pull-down transistors which constitute each of a plurality of NAND gates on the least two layers.

The first to third pull-up transistors are PMOS transistors, and the first to third pull-down transistors are NMOS transistors. A transistor to be arranged on a first layer is a bulk transistor, and a transistor to be arranged on a second or more layer is a thin film transistor.

A transistor to be arranged on the first layer among the at least two layers of the peripheral circuit is one which is possible to be arranged together with some of the second and third pull-up transistors and the second and third pull-down transistors regardless of a type of a transistor to be arranged on the first layer of the memory cell array. Only the second and third pull-up transistors or only the second and third pull-won transistors which have the same type as transistors which are respectively arranged on a second or more layer of the at least two layers of the peripheral circuit are arranged.

A second aspect of an arrangement method of a semiconductor memory device according to the present invention includes stacking and arranging two transmission transistors, two first pull-up transistors, two first pull-down transistors which constitute each of a plurality of memory cells of a memory cell array on at least two layers; and stacking and arranging at least one second pull-up transistors and second pull-down transistors which constitute each of a plurality of inverters of a peripheral circuit, at least two third pull-up transistors and third pull-down transistors which constitute each of a plurality of NAND gates, and at least two fourth pull-up transistors and fourth pull-down transistors which constitute each of a plurality of NOR gates on the least two layers.

The first to fourth pull-up transistors are PMOS transistors, and the first to third pull-down transistors are NMOS transistors. A transistor to be arranged on a first layer is a bulk transistor, and a transistor to be arranged on a second or more layer is a thin film transistor.

A transistor to be arranged on the first layer among the at least two layers of the peripheral circuit is one which is possible to be arranged together with some of the second to fourth pull-up transistors and the second to fourth pull-down transistors regardless of a type of a transistor to be arranged on the first layer of the memory cell array. Only the second to fourth pull-up transistors or only the second to fourth pull-won transistors which have the same type as transistors which are respectively arranged on a second or more layer of the at least two layers of the peripheral circuit are arranged.

A first aspect of a method of manufacturing a semiconductor device includes preparing a semiconductor substrate having a cell region and a peripheral circuit region; forming a bulk transistor on the semiconductor substrate of the cell region; forming an interlayer insulator pattern which exposes the semiconductor substrate of the peripheral circuit region on the semiconductor substrate having the bulk transistor; forming a cell body pattern and a peripheral body pattern on the interlayer insulator pattern and the exposed portion of the semiconductor substrate, wherein the peripheral body pattern contacts the exposed portion of the semiconductor substrate; and forming a cell thin film transistor and a peripheral transistor in the cell body pattern and the peripheral body pattern, respectively.

The step of forming the cell body pattern and the peripheral body pattern includes forming a semiconductor layer on the semiconductor substrate having the interlayer insulator pattern; and planarizing the semiconductor layer to form a cell semiconductor layer and a peripheral semiconductor layer on the interlayer insulator pattern and the semiconductor substrate of the peripheral circuit region, wherein the peripheral semiconductor layer is thicker than the semiconductor layer. The semiconductor layer is formed of a non-single crystal semiconductor layer.

The method of the first aspect further includes crystallizing the semiconductor layer using a solid phase epitaxial layer which employs the semiconductor substrate as a seed layer before or after planarizing the semiconductor layer. The step of forming the interlayer insulator pattern includes forming an interlayer insulator on the semiconductor substrate having the bulk transistor; and patterning the interlayer insulator to form a contact hole which exposes the semiconductor substrate of the peripheral circuit region and a predetermined region of the semiconductor substrate of the cell region.

The step of forming the cell body pattern and the peripheral body pattern includes forming a single crystal semiconductor structure on the interlayer insulator pattern and the exposed portion of the semiconductor substrate of the peripheral circuit region; and planarizing the single crystal semiconductor structure.

The single crystal semiconductor structure is formed by using a selective epitaxial growth technique which employs the semiconductor substrate exposed by the contact hole and the exposed semiconductor substrate of the peripheral circuit region as a seed layer. The step of forming the cell thin film transistor and the peripheral transistor includes a cell gate electrode and a peripheral gate electrode which respectively cross the cell body pattern and the peripheral body pattern; ion-doping the cell body pattern and the peripheral body pattern using the gate electrodes as an ion-doping mask to form cell source and drain regions in the cell body pattern and peripheral source and drain regions in the peripheral body pattern. The method of the first aspect further includes forming selectively a metal silicide layer on surfaces of the peripheral gate electrode and/or the peripheral source and drain regions.

A second aspect of a method of manufacturing a semiconductor device includes preparing a semiconductor substrate having a cell region and a peripheral circuit region; forming a bulk transistor on the semiconductor substrate of the cell region; forming a first interlayer insulator pattern which exposes the semiconductor substrate of the peripheral circuit region on the semiconductor substrate having the bulk transistor, the first interlayer insulator pattern having a first contact hole which exposes a predetermined region of an ion-doped region of the bulk transistor; forming a cell lower body pattern for covering the first contact hole on the first interlayer insulator pattern; forming a cell lower thin film transistor in the cell lower body pattern; forming a second interlayer insulator pattern for covering the cell lower thin film transistor on the first interlayer insulator pattern, the second interlayer insulator pattern having a second contact hole which exposes a predetermined region of an ion-doped region of the cell lower thin film transistor; forming a cell upper body pattern for covering the second contact hole on the second interlayer insulator pattern and a peripheral body pattern in the peripheral circuit region; and forming a cell upper thin film transistor in the cell upper body pattern and a peripheral transistor in the peripheral body pattern.

The method of the second aspect further includes forming the cell lower body pattern and a peripheral body pattern for covering the semiconductor substrate of the peripheral circuit region. The step of forming the cell lower body pattern and the peripheral lower body pattern includes forming a first single crystal semiconductor structure which fills the first contact hole and covers the first interlayer insulator pattern and the semiconductor substrate of the peripheral circuit region; and planarizing the first single crystal semiconductor structure.

The step of forming the cell upper body pattern and the peripheral body pattern includes forming a second single crystal semiconductor structure which fills the second contact hole and covers the second interlayer insulator pattern and the semiconductor substrate of the peripheral circuit region; planarizing the second single crystal semiconductor structure; and patterning the second single crystal semiconductor structure to form a cell upper body pattern in the cell region and a peripheral upper body pattern in the peripheral circuit region, thereby forming a peripheral body pattern having the peripheral lower body pattern and the peripheral upper body pattern. The single crystal semiconductor structures are formed by using an epitaxial technique.

The step of forming the cell lower body pattern includes forming a first single crystal semiconductor structure which fills the first contact hole and covers the first interlayer insulator pattern and the semiconductor substrate of the peripheral circuit region; and patterning the first single crystal semiconductor structure to expose the semiconductor substrate of the peripheral circuit region.

The step of forming the cell upper body pattern and the peripheral body pattern includes forming a second single crystal semiconductor structure which fills the second contact hole and covers the second interlayer insulator pattern and the semiconductor substrate of the peripheral circuit region, the second single crystal semiconductor structure having a plane upper surface; and patterning the second single crystal semiconductor structure to form the cell upper body pattern in the cell region and the peripheral body pattern in the peripheral circuit region. The single crystal semiconductor structures are formed by using an epitaxial technique.

The bulk transistor is an n-channel driving transistor, the cell lower thin film transistor is a p-channel load transistor, and the cell upper thin film transistor is an n-channel transmission transistor. The step of forming the cell upper thin film transistor and the peripheral transistor includes forming a cell upper gate electrode and a peripheral gate electrode which respectively cross the cell upper body pattern and the peripheral body pattern; and ion-doping the cell upper body pattern and the peripheral body pattern using the gate electrode as an ion doping mask to form cell source and drain regions in the cell upper body pattern and peripheral source and drain regions in the peripheral body pattern. The method of the second aspect further includes forming selectively a metal silicide layer on surfaces of the peripheral gate electrode and/or the peripheral source and drain regions.

BRIEF DESCRIPTION OF THE DRAWINGS

FIGS. 21A and 21B are views illustrating stacking structure of the memory cell array and the peripheral circuit according to a first embodiment of the present invention;

FIGS. 22A and 22B are views illustrating stacking structure of the memory cell array and the peripheral circuit according to a second embodiment of the present invention;

FIGS. 23A and 23B are views illustrating stacking structure of the memory cell array and the peripheral circuit according to a third embodiment of the present invention;

FIGS. 26A and 26B to FIGS. 34A and 34B are cross-sectional views illustrating a method for manufacturing the memory cell and the inverter.

DETAILED DESCRIPTION OF EMBODIMENTS OF THE INVENTION

Figure 1:
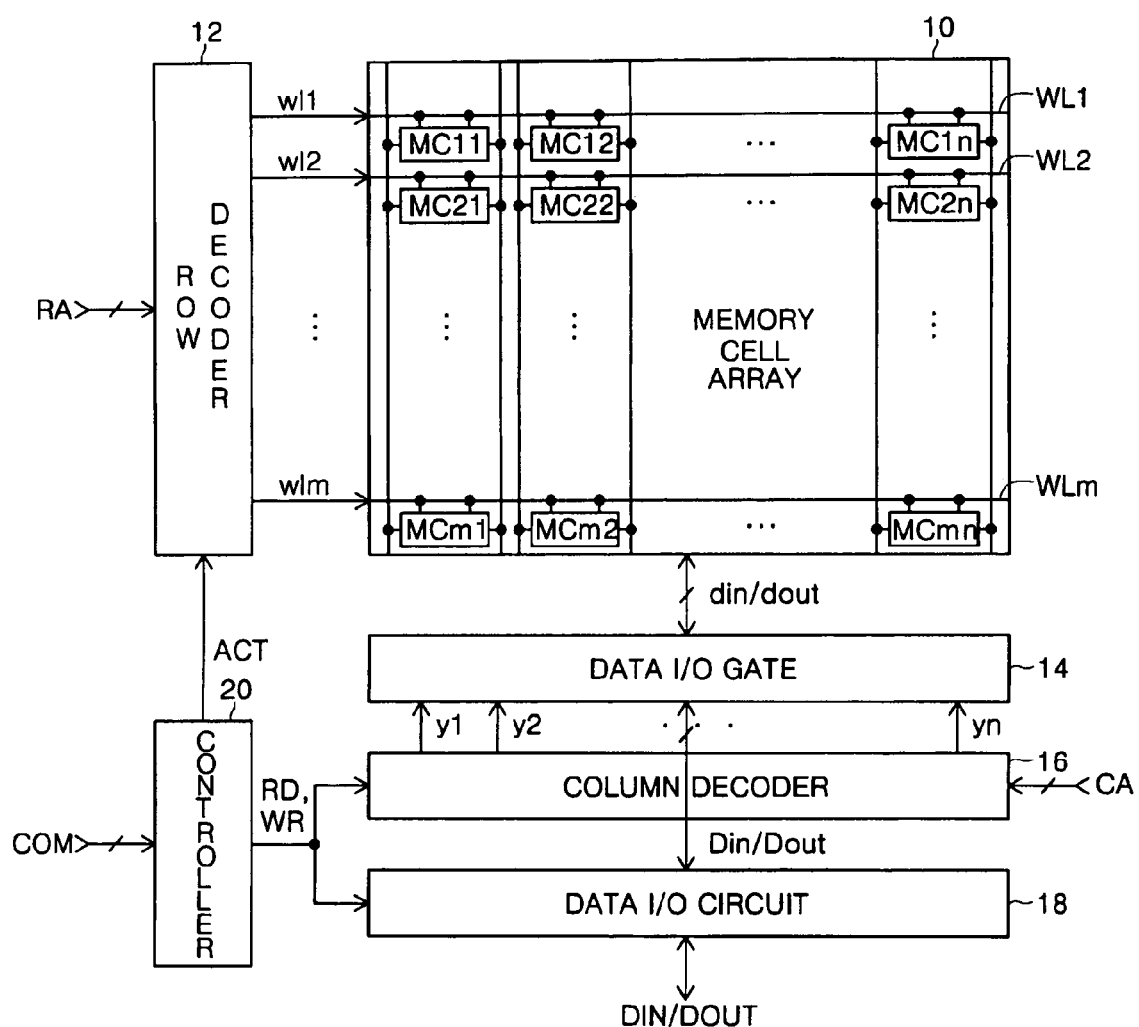
FIG. 1 is a block diagram illustrating a typical semiconductor memory device.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a block diagram illustrating a typical semiconductor memory device. The semiconductor memory device of FIG. 1 includes a memory cell array 10, a row decoder 12, a data I/O gate 14, a column decoder 16, a data I/O circuit 18, and a controller 20. In FIG. 1, wl1 to wlm denote word line selecting signals, y1 to yn denote column selecting signals, WL1 to WLm denote word lines, and BL1,BL1B to BLn,BLnB denote bit line pairs. Functions of components of the semiconductor memory device of FIG. 1 will be described below.

The memory cell array 10 includes a plurality of static memory cells MC11 to MCmn respectively connected between each of the word lines WL1 to WLm and each of the bit line pairs BL1,BL1B to BLn,BLnB, receives data din and writes it onto a selected memory cell during write operations, and reads data stored in a selected memory cell and outputs the data dout during read operations. The row decoder 12 decodes a row address RA to generate the word line selecting signals wl1 to wlm in response to an active command ACT. The data I/O gate 14 transmits data Din as data din during the write operations and transmits data dout as data Dout during the read operations, in response to the column selecting signals y1 to yn. The column decoder 16 decodes a column address CA to generate the column selecting signals y1 to yn, in response to read and write commands RD, WR. The data I/O circuit 18 receives data DIN and outputs data Din in response to the write command WR, and receives data Dout and outputs data DOUT in response to the read command RD. The controller 20 receives a command COM to generate the active command ACT, the read command RD, and the write command WR.

Figure 2:
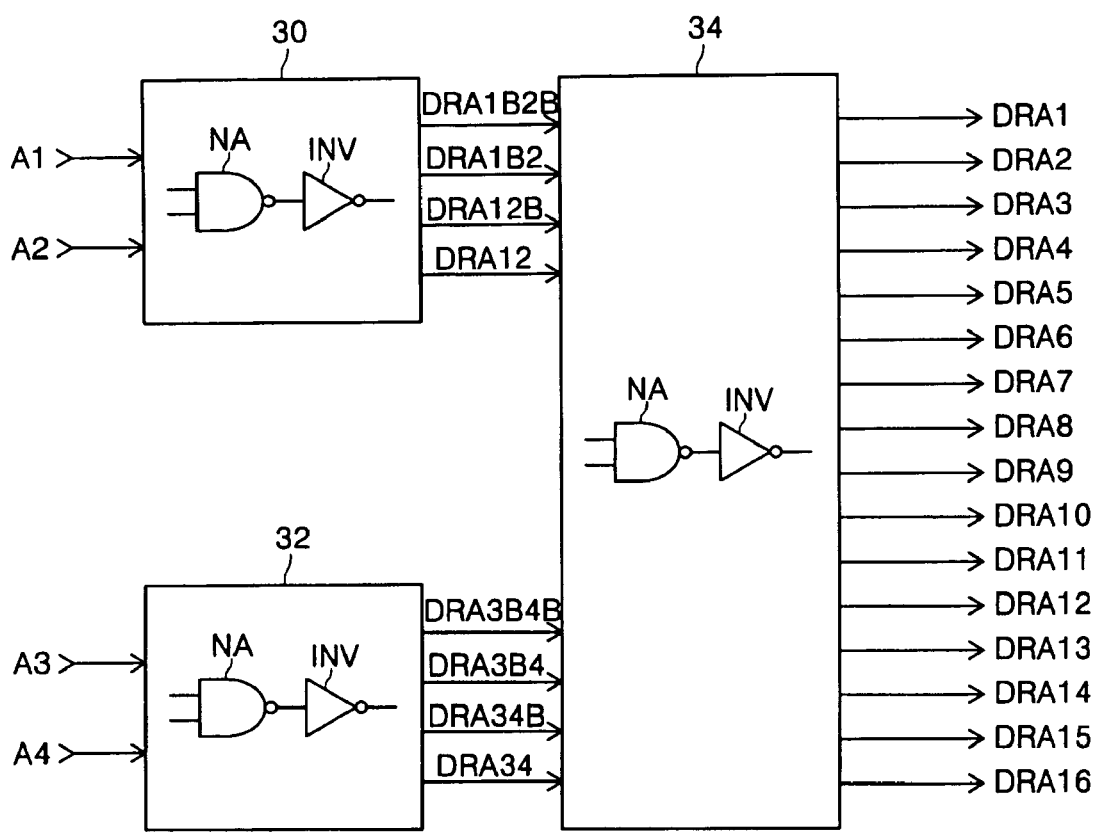
FIG. 2 is a block diagram illustrating a row decoder or a column decoder of the semiconductor memory device of FIG. 1.

FIG. 2 is a block diagram illustrating the row decoder or the column decoder of the semiconductor memory device of FIG. 1. The decoder of FIG. 2 includes two pre-decoders 30 and 32 and a main decoder 34. The two pre-decoders 30 and 32 and the main decoder 34 include a two-input NAND gate NA and an inverter INV, respectively. The decoder of FIG. 2 is configured to receive 4-bit address A1 to A4 to generate 16 decoding signals DRA1 to DRA16. Functions of components of the decoder of FIG. 2 will be explained below.

Each of the pre-decoders 30 and 32 decodes two 2-bit addresses A1,A2 and A3,A4 to output pre-decoded signals DRA1B2B to DRA12 and DRA3B4B to DRA34. The main decoder 34 decodes the pre-decoded signals DRA1B2B to DRA12 and DRA3B4B to DRA34 to generate decoding signals DRA1 to DRA16. The static memory cell of the memory cell array of the semiconductor memory device includes six (6) transistors, and the column or row decoder includes logic gates such as an inverter and a NAND gate. The inverter includes two transistors, and the NAND gate includes at least 4 transistors. The column or row decoder of FIG. 2 includes the two-input NAND gate and thus is comprised of four transistors, but in case where the decoder of FIG. 2 includes a 3- or 4-input NAND gate, it is comprised of 6 or 8 transistors. The data I/O circuit 18 and the controller 20 further includes a NOR gate in addition to the inverter and the NAND gate.

Figure 3A:
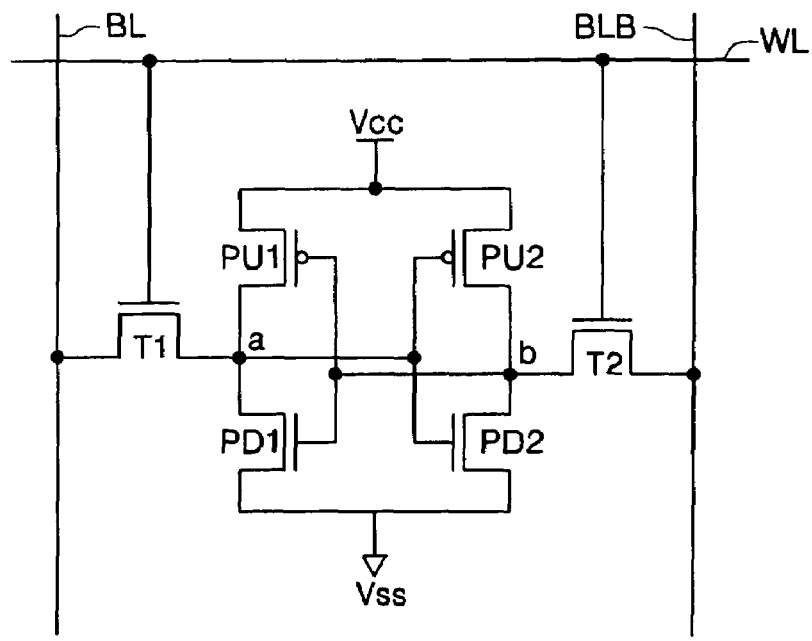
FIGS. 3A to 3D are circuit diagrams illustrating a static memory cell of a memory cell array, and an inverter, a NAND gate, and a NOR gate which constitute a peripheral circuit in the conventional semiconductor memory device.
Figure 3B:
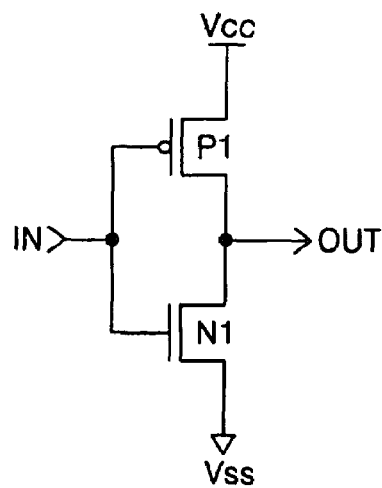
Figure 3C:
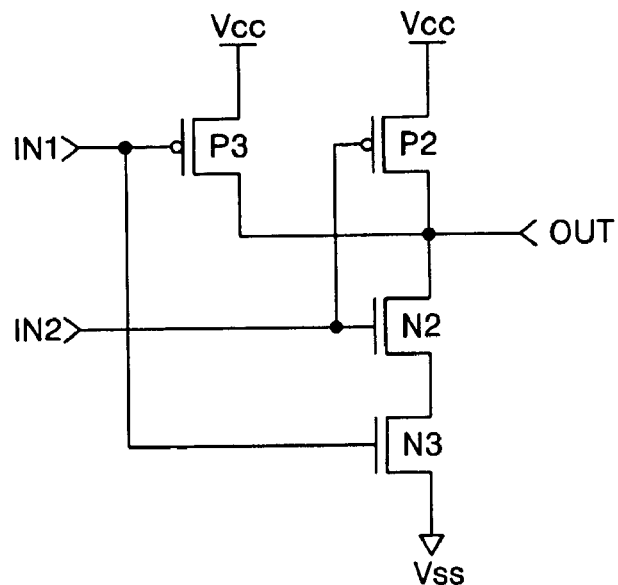
Figure 3D:
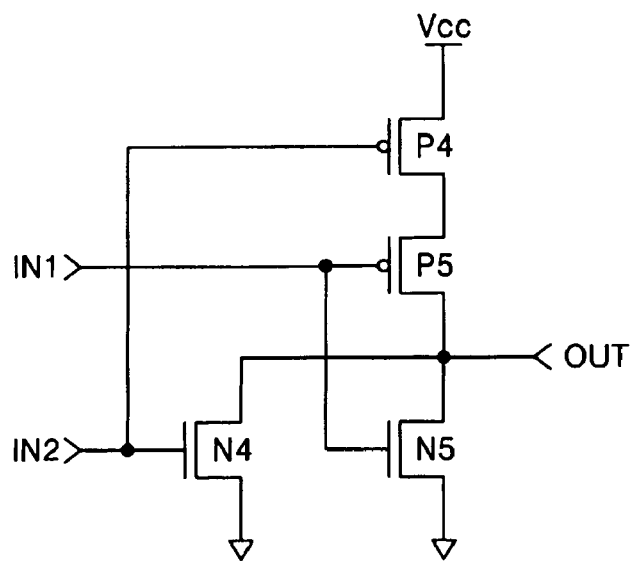

FIG. 3A is a circuit diagram illustrating the static memory cell of the memory cell array of FIG. 1. FIGS. 3B to 3D are circuit diagrams respectively illustrating an inverter, a NAND gate, and a NOR gate which constitute the peripheral circuit. As shown in FIG. 3A, the static memory cell includes PMOS transistors PU1 and PU2 and NMOS transistors PD1, PD2, T1, and T2. The PMOS transistors PU1 and PU2 are pull-up transistors, and the NMOS transistors are pull-down transistors, and the NMOS transistors T1 and T2 are transmission transistors. Operation of the static memory cell of FIG. 3A will be described below.

If the word line WL is selected so that the NMOS transistors T1 and T2 are turned on, data is transmitted between the bit line BL and the storage node a, and data is transmitted between an inverted bit line BLB and a storage node b. If data of the storage node b has a high level, the NMOS transistor PD1 makes the storage node a have a low level, and if data of the storage node b has a low level, the PMOS transistor PU1 makes the storage node a have a high level. Likewise, if data of the storage node a has a high level, the NMOS transistor PD2 makes the storage node b have a low level, and if data of the storage node a has a low level, the PMOS transistor PU2 makes the storage node b have a high level. That is, the two PMOS transistors PU1 and PU2 and the two NMOS transistors PD1 and PD2 serve as a latch and latches data of the storage nodes a and b.

As shown in FIG. 3B, the inverter includes a PMOS transistor P1 and an NMOS transistor N1. In FIG. 3B, the PMOS transistor P1 is a pull-up transistor, and the NMOS transistor N1 is a pull-down transistor. Operation of the inverter of FIG. 3B is as follows. If an input signal IN having a high level is inputted, the NMOS transistor N1 is turned on to make an output signal OUT have a low level, i.e., a ground voltage Vss level. On the other hand, if an input signal IN having a low level is inputted, the PMOS transistor P1 is turned on to make the output signal OUT have a high level, i.e., a power voltage Vcc level. That is, the inverter of FIG. 3B is comprised of one pull-up transistor and one pull-down transistor and inverts an input signal IN to generate the output signal OUT.

As shown in FIG. 3C, the NAND gate includes PMOS transistors P2 and P3 and NMOS transistors N2 and N3. In FIG. 3C, the PMOS transistors P2 and P3 are pull-up transistors, and the NMOS transistors N2 and N3 are pull-down transistors. Operation of the NAND gate of FIG. 3C is as follows. If at least one of input signals IN1 and IN2 having a low level is applied, the PMOS transistor P2 and/or the PMOS transistor P3 are/is turned on to make an output signal OUT have a high level, i.e., a power voltage Vcc level. On the other hand, if the input signals IN1 and IN2 having a high level are applied, the NMOS transistors N2 and N3 are turned on to make the output signal OUT have a low level.

As shown in FIG. 3D, the NOR gate includes PMOS transistors P4 and P5 and NMOS transistors N4 and N5. In FIG. 3D, the PMOS transistors P3 and P4 are pull-up transistors, and the NMOS transistors are pull-down transistors. Operation of the NOR gate of FIG. 3D is as follows. If at least one of input signals IN1 and IN2 having a high level is applied, the NMOS transistor N4 and/or the NMOS transistor N5 are/or turned on to make an output signal OUT have a low level, i.e., a ground voltage Vss level. On the other hand, if input signals IN1 and IN2 having a low level are applied, the PMOS transistors P4 and P5 are turned on to make the output signal OUT have a high level.

Figure 4A:
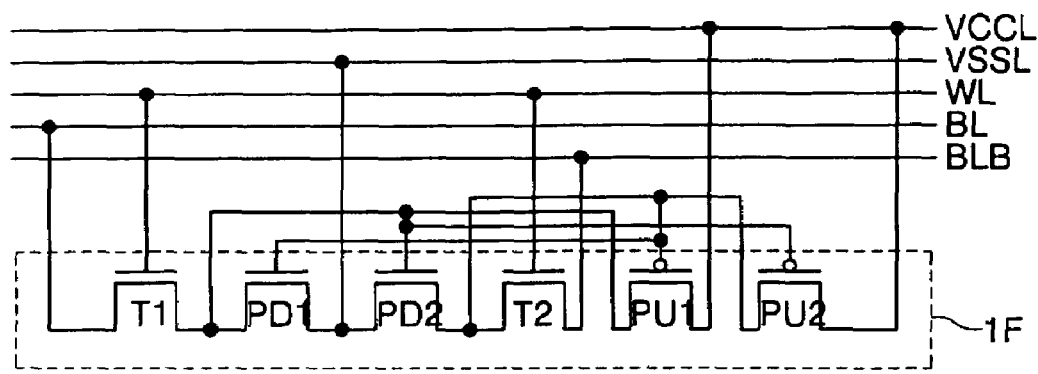
FIGS. 4A-4D illustrate an arrangement of transistors which constitute the static memory cell and transistors which constitute the inverter, the NAND gate and the NOR gate in the conventional semiconductor memory device.

FIG. 4A is a view illustrating arrangement of the transistors which constitute the static memory cell of FIG. 3A, and FIGS. 4B to 4D are views respectively illustrating arrangement of the transistors which constitute the inverter, the NAND gate and the NOR gate shown in FIGS. 3B to 3D. In FIGS. 4A to 4D, it appears that a bit line pair BL and BLB, a word line WL, a power voltage line VCCL, and a ground voltage line VSSL are arranged on difference layers, but they are not always arranged on difference layers.

As shown in FIG. 4A, the transistors PD1, PD2, PU1, PU2, T1, and T2 of FIG. 3A are arranged on the same layer 1F. A source of the NMOS transistor T1 is connected to a drain of the NMOS transistor PD1, a source of the NMOS transistor PD1 is connected to a source of the NMOS transistor PD2, and a drain of the NMOS transistor PD2 is connected to a source of the NMOS transistor T2. A drain of the NMOS transistor T1 is connected to a bit line BL, a drain of the NMOS transistor T2 is connected to an inverted bit line BLB, gates of the NMOS transistors T1 and T2 are connected to the word line, and sources of the NMOS transistors PD1 and PD2 are connected to the ground voltage line VSSL. A drain of the PMOS transistor PU1 is connected to a source of the NMOS transistor PD1, a source of the PMOS transistor PU1 is connected to the power voltage line VCCL, and a gate of the PMOS transistor PU1 is connected to a gate of the NMOS transistor PD1 and a drain of the NMOS transistor PD2. A drain of the PMOS transistor PU2 is connected to a drain of the NMOS transistor PD2, a source of the PMOS transistor PU2 is connected to the power voltage line VCCL, and a gate of the PMOS transistor PU2 is connected to a gate of the NMOS transistor PD2.

Figure 4B:
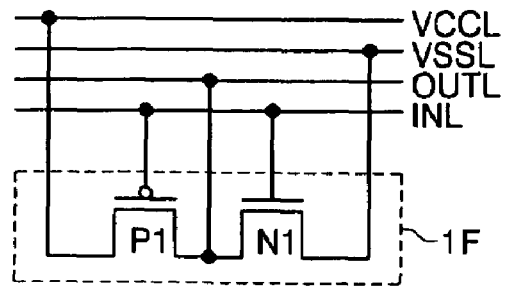

As shown in FIG. 4B, the transistors P1 and N1 of FIG. 3B are arranged on the same floor 1F. The PMOS transistor P1 has a source connected to the power voltage line VCCL, a drain connected to an output signal line OUTL, and a gate connected to an input signal line INL. The NMOS transistor N1 has a source connected to the ground voltage line VSSL, a drain connected to the output signal line OUTL, and a gate connected to the input signal line INL.

Figure 4C:
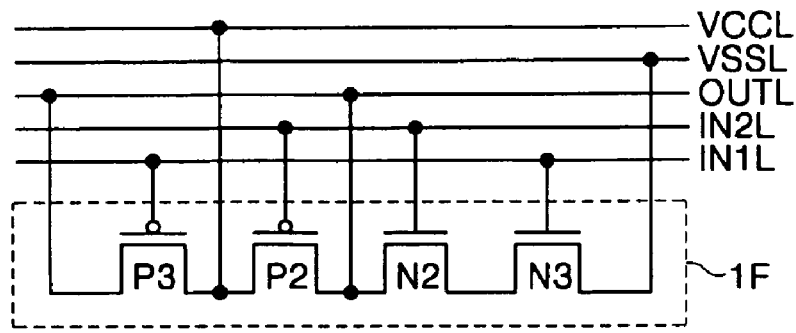

As shown in FIG. 4C, the transistors P2, P3, N2 and N3 of FIG. 3C are arranged on the same layer 1F. A source of the PMOS transistor P3 is connected to a source of the PMOS transistor P2, and a drain of the PMOS transistor P3 is connected to the output signal line OUTL. Gates of the PMOS transistor P3 and the NMOS transistor N3 are connected to an input signal line IN1L, gates of the PMOS transistor P2 and the NMOS transistor N2 are connected to an input signal line IN2L, drains of the PMOS transistor P2 and the NMOS transistor N2 are connected, sources of the NMOS transistors N2 and N3 are connected, and a drain of the NMOS transistor N3 is connected to the ground voltage line VSSL.

Figure 4D:
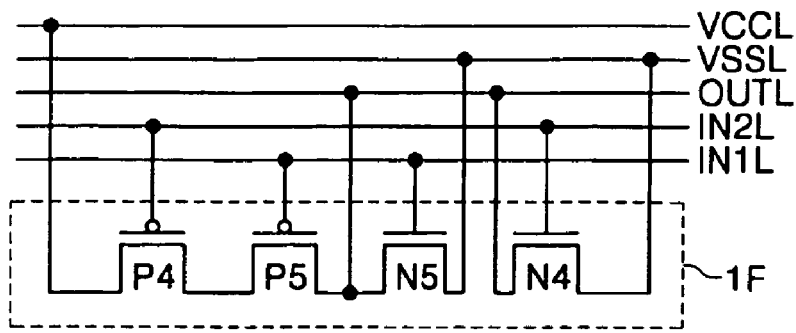

As shown in FIG. 4D, the transistors P4, P5, N4, and N5 of FIG. 3D are arranged on the same layer 1F. A drain of the PMOS transistor P4 is connected to a source of the PMOS transistor P5, a drain of the PMOS transistor P5 is connected to a drain of the NMOS transistor N5, a source and a gate of the PMOS transistor P4 are respectively connected to the power voltage line VCCL and the input signal line IN2L, a gate of the PMOS transistor P5 is connected to the input signal line IN1L, drains of the PMOS transistor P5 and the NMOS transistor N5 are connected to the output signal line OUTL, and a drain, a gate and a source of the NMOS transistor N4 are respectively connected to the output signal line OUTL, the input signal line IN2L and the ground voltage line VSSL.

As shown in FIGS. 4A to 4D, all of the transistors which constitute the memory cell and the peripheral circuit of the conventional semiconductor memory device are arranged on the same layer 1F, and thus in case where capacitor of the memory cell is increased, layout area size is also increased.

In order to reduce the layout area size of the memory cell of the semiconductor memory device, a method of arranging transistors, which constitute the memory cell on two or three layers has been introduced. FIGS. 5A to 5D are views respectively illustrating different arrangements of the transistors of the static memory cell and the transistors which constitute the inverter, the NAND gate and the NOR gate of the peripheral circuit in the conventional semiconductor memory device, where the transistors which constitute the memory cell are arranged on two layers.

Figure 5A:
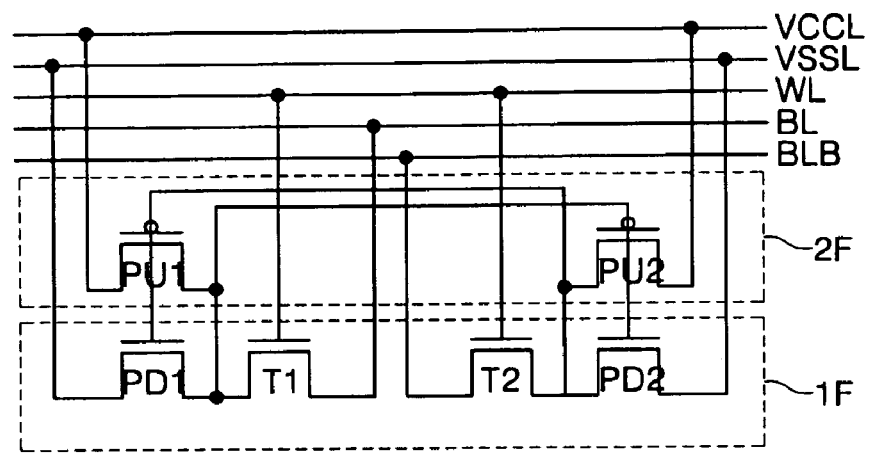
FIGS. 5A to 5D are views respectively illustrating different arrangement of transistors of the static memory cell and transistors which constitute the inverter, the NAND gate and the NOR gate of the peripheral circuit in the conventional semiconductor memory device.
Figure 5B:
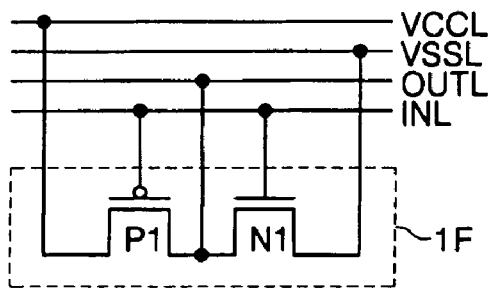
Figure 5C:
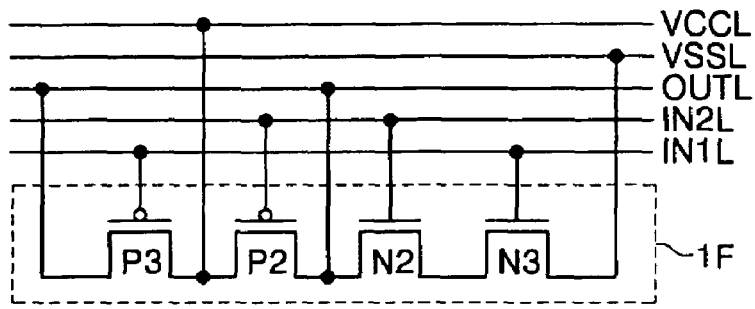
Figure 5D:
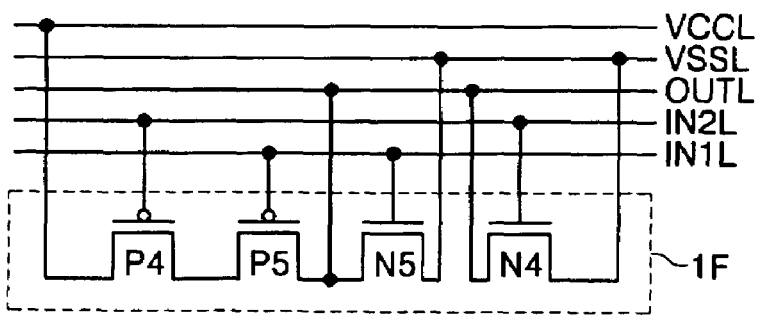

As shown in FIG. 5A, the NMOS transistors PD1, PD2, T1, and T2 are arranged on a first layer 1F, and the PMOS transistors PU1 and PU2 are arranged on a second layer 2F. Connections between the transistors PD1, PD2, PU1, PU2, T1, and T2 are identical to those of FIG. 4A. Like arrangement of FIGS. 4B to 4D, the transistors P1 to P5 and N1 to N5 of FIGS. 5B to 5D which constitute the inverter, the NAND gate and the NOR gate are arranged on the first layer 1F. Therefore, as shown in FIG. 5A, if the transistors which constitute the memory cell are arranged on the two layers and the transistors which constitute the peripheral circuit are on one layer, the layout area size of the memory cell array is reduced, but the layout area size of the peripheral circuit is not reduced.

FIGS. 6A to 6D are views respectively illustrating another different arrangement of the transistors of the static memory cell and the transistors which constitute the inverter, the NAND gate and the NOR gate of the peripheral circuit in the conventional semiconductor memory device, where the transistors which constitute the memory cell are arranged on three layers.

Figure 6A:
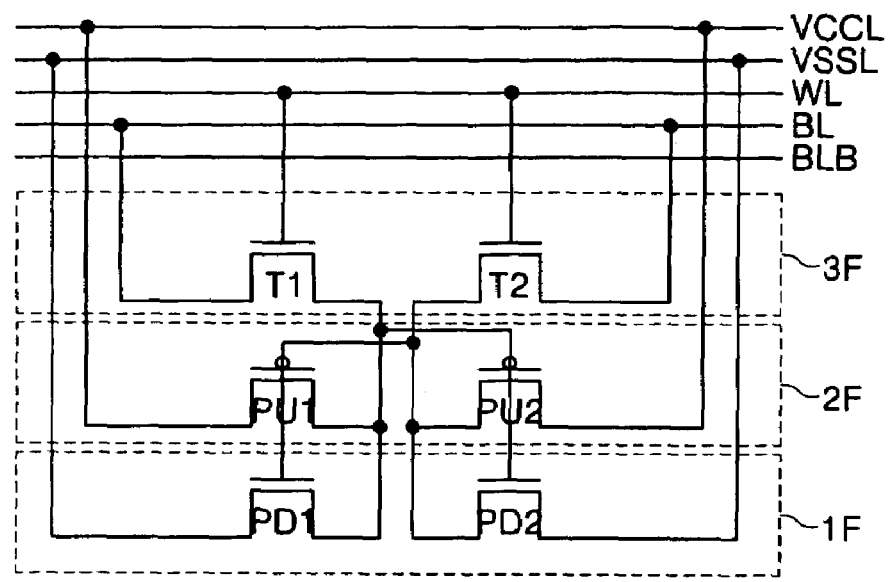
FIGS. 6A to 6D are views respectively illustrating another different arrangement of transistors of the static memory cell and transistors which constitute the inverter, the NAND gate and the NOR gate of the peripheral circuit in the conventional semiconductor memory device.

As shown in FIG. 6A, the NMOS transistors PD1 and PD2 are arranged on a first layer 1F, the PMOS transistors PU1 and PU2 are arranged on a second layer 2F, and the access transistors T1 and T2 are arranged on a third layer 3F. Connections between the transistors PD1, PD2, PU1, PU2, T1, and T2 are identical to those of FIG. 4A.

Figure 6B:
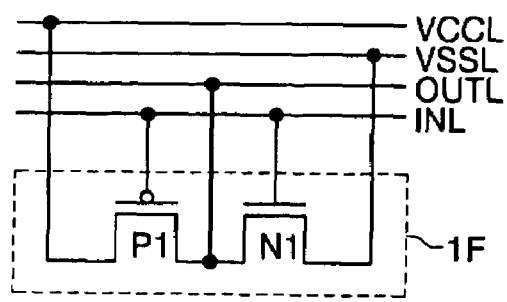
Figure 6C:
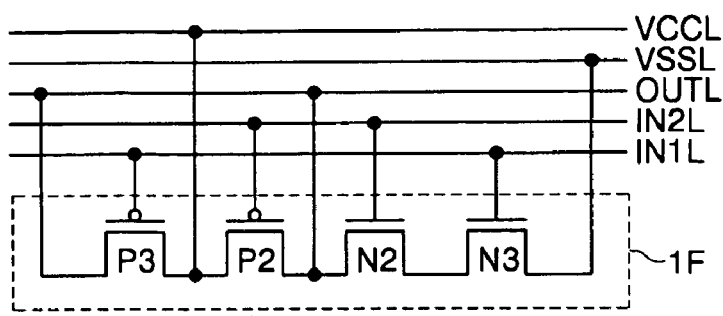
Figure 6D:
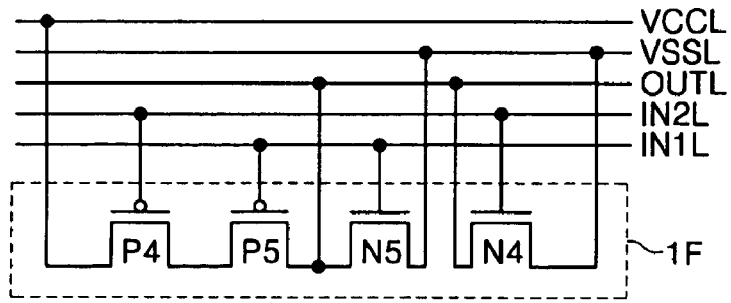

Like the arrangement of FIGS. 4B to 4D, the transistors P1 to P5 and N1 to N5 of FIGS. 6B to 6D which constitute the inverter, the NAND gate and the NOR gate are arranged on the first layer 1F. Therefore, as shown in FIG. 6A, if the transistors which constitute the memory cell are arranged on the three layers and the transistors which constitute the peripheral circuit are on one layer, the layout area size of the memory cell array is reduced, but the layout area size of the peripheral circuit is not reduced. In the conventional arrangement of the semiconductor memory device, the layout area size of the memory cell array is reduced by arranging the transistors, which constitute the static memory cell on two or three layers, but since the transistors, which constitute the peripheral circuit, are arranged on one layer, the layout area size of the peripheral circuit is not reduced.

FIGS. 7A to 7D are views respectively illustrating arrangement of transistors of a static memory cell and transistors which constitute an inverter, a NAND gate and a NOR gate of a peripheral circuit of a semiconductor memory device according to a first embodiment of the present invention. In particular, FIGS. 7A to 7D show arrangement of transistors which constitute the peripheral circuit in case where transistors which constitute the memory cell are arranged on two layers.

Figure 7A:
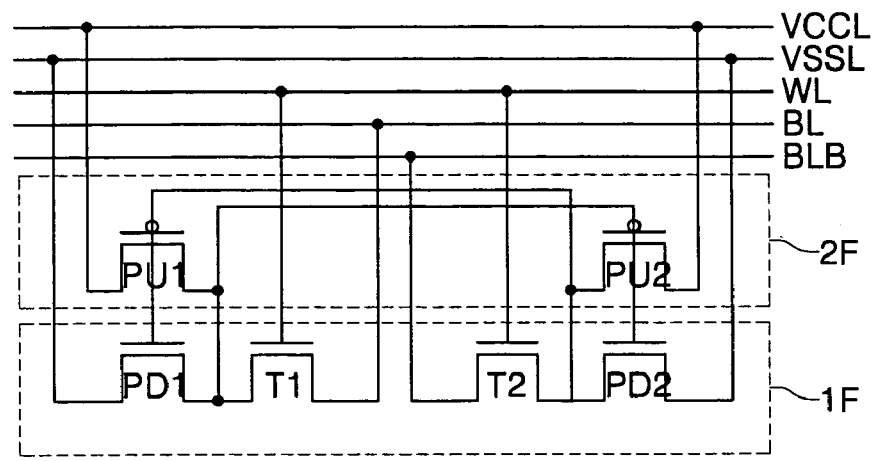
FIGS. 7A to 7D are views respectively illustrating arrangement of transistors of a static memory cell and transistors which constitute an inverter, a NAND gate and a NOR gate of a peripheral circuit of a semiconductor memory device according to a first embodiment of the present invention.
Figure 7B:
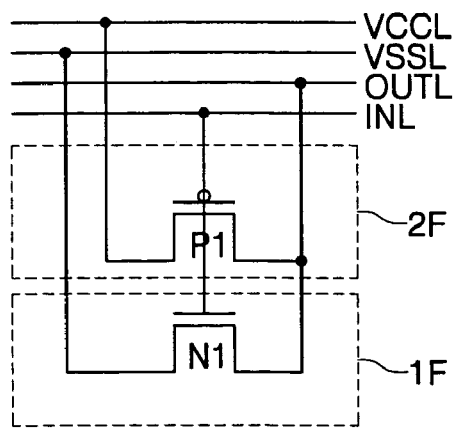
Figure 7C:
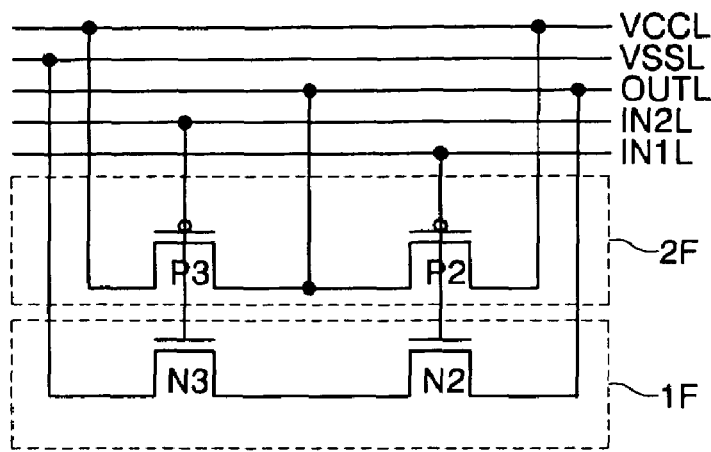
Figure 7D:
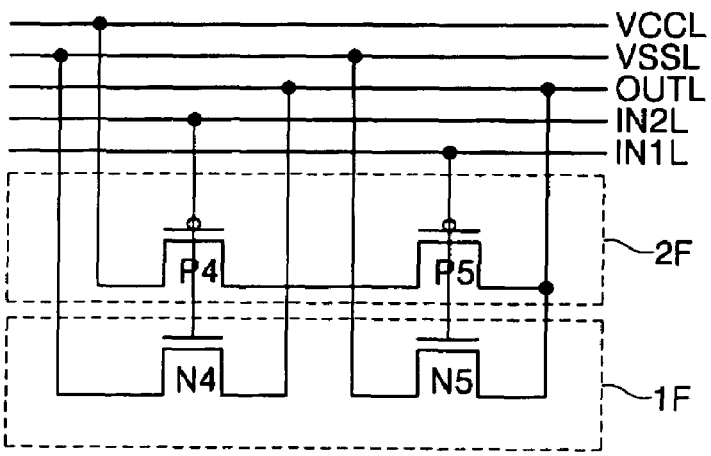

Like arrangement of FIG. 5A, transistors PD1, PD2, PU1, PU2, T1, and T2 of FIG. 7A that constitute the static memory cell are arranged on two layers. As shown in FIG. 7B, an NMOS transistors N1 is arranged on the first layer 1F, and a PMOS transistor P1 is arranged on the second layer 2F. Connection between the transistors N1 and P1, which constitute the inverter, are identical to those of FIG. 4B. As shown in FIG. 7C, NMOS transistors N2 and N3 are arranged on the first layer 1F, and PMOS transistors P2 and P3 are arranged on the second layer 2F. Connections between the transistors N2, N3, P2, and P3, which constitute the NAND gate, are identical to those of FIG. 4C. As shown in FIG. 7D, NMOS transistors N4 and N4 are arranged on the first layer 1F, and PMOS transistors P4 and P5 are arranged on the second layer 2F. Connections between the transistors N4, N5, P4, and P5 which constitute the NOR gate are identical to those of FIG. 4D. As shown in FIGS. 7A to 7D, the semiconductor memory device of the present invention can reduce the layout area size by arranging the transistors which constitute the memory cell on two layers and arranging the transistors which constitute the peripheral circuit on two layers. The transistors of FIGS. 7B to 7D may be arranged on different layers from those shown in FIGS. 7A to 7D. For example, the transistors do not need to be always arranged on the first and second layers and may be arranged on the first and third layers or the second and third layers.

However, the PMOS transistor and the NMOS transistor may be arranged on the first layer, but it is preferred to arrange the same type transistor on the second layer 2F as the transistor arranged on the second layer of the memory cell for the convenience of manufacturing process. For example, it is preferable to arrange the NMOS transistor which is to be arranged on the second layer 2F of the peripheral circuit if the transistors to be arranged on the second layer 2F of the memory cell are NMOS transistors, and it is preferable to arrange the PMOS transistor which is to be arranged on the second layer 2F of the peripheral circuit if the transistors to be arranged on the second layer 2F of the memory cell are PMOS transistors.

Figure 8A:
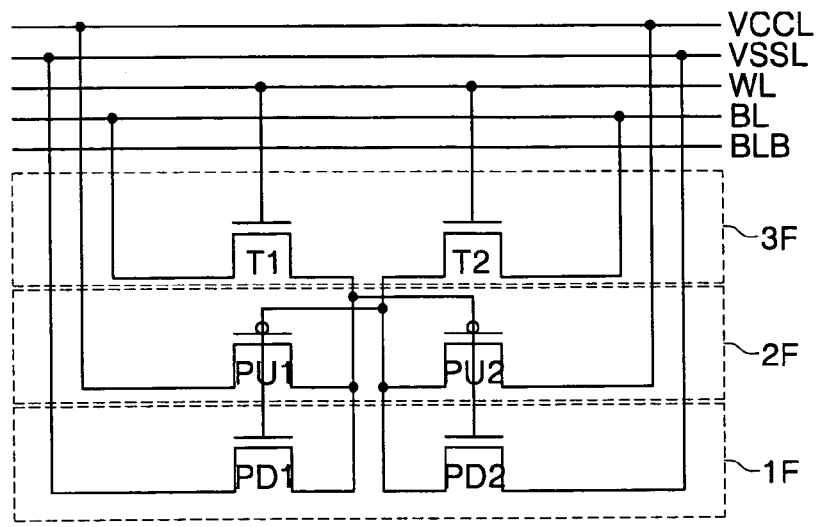
FIGS. 8A to 8D are views respectively illustrating arrangement of transistors of a static memory cell and transistors which constitute an inverter, a NAND gate and a NOR gate of a peripheral circuit of a semiconductor memory device according to a second embodiment of the present invention.
Figure 8B:
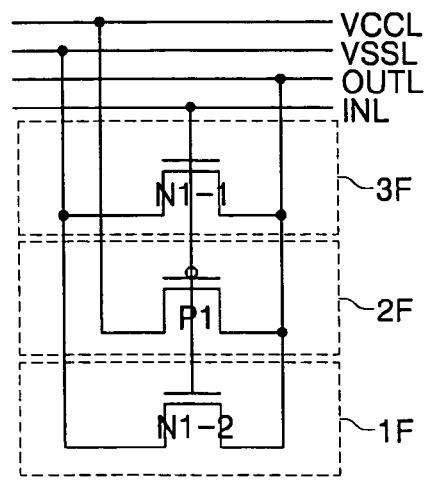

FIGS. 8A to 8D are views respectively illustrating arrangement of transistors of a static memory cell and transistors which constitute an inverter, a NAND gate and a NOR gate of a peripheral circuit of a semiconductor memory device according to a second embodiment of the present invention. In particular, FIGS. 8A to 8D show arrangement of transistors which constitute the peripheral circuit in case where transistors which constitute the memory cell are arranged on three layers. Like arrangement of FIG. 6A, the transistors of FIG. 8A, which constitute the static memory cell, are arranged such that the pull-down transistors PD1 and PD2 are arranged on the first layer 1F, the pull-up transistors PU1 and PU2 are arranged on the second layer 2F, and the transmission transistors T1 and T2 are arranged on the third layer. As shown in FIG. 8B, NMOS transistors N1-1 and N1-2, which have ½ channel width of channel width of the NMOS transistor N1 of FIG. 3B are arranged. The NMOS transistor N1-2 is arranged on the first layer 1F, the PMOS transistor P1 is arranged on the second layer 2F, and the NMOS transistor N1-1 is arranged on the third layer 3F. Gates, drains and sources of the NMOS transistors N1-1 and N1-2 are commonly connected, and connections between the NMOS transistors N1-1 and N1-2 and the PMOS transistor P1 are identical to those of FIG. 4B.

Figure 8C:
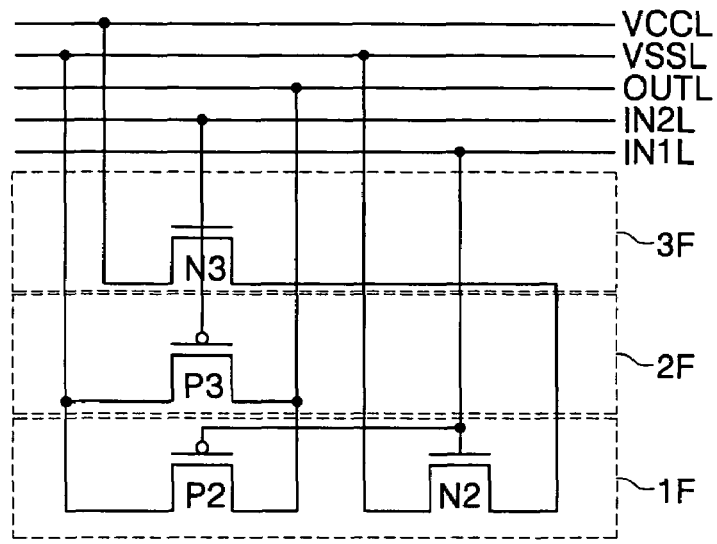

As shown in FIG. 8C, a PMOS transistor P2 and an NMOS transistor N2 are arranged on the first layer 1F, the PMOS transistor P3 is arranged on the second layer 2F, and an NMOS transistor N3 is arranged on the third layer 3F. Connections between the PMOS transistors P2 and P3 and the NMOS transistors N2 and N3 are identical to those of FIG. 4C.

Figure 8D:
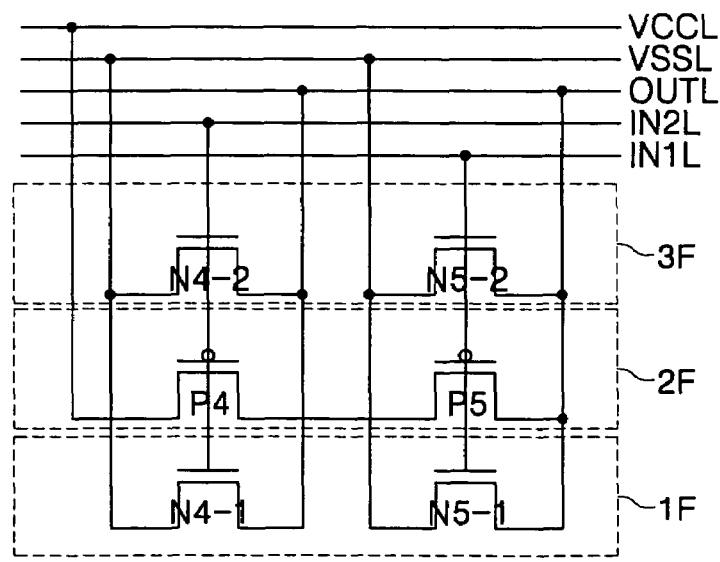

As shown in FIG. 8D, NMOS transistors N4-1 and N4-2 which have ½ channel width of channel width of the NMOS transistor N4 and NMOS transistors N5-1 and N5-2 which have ½ channel width of channel width of the NMOS transistor N5 are arranged. The NMOS transistors N4-1 and N5-1 are arranged on the first layer 1F, PMOS transistors P4 and P5 are arranged on the second layer 2F, and the NMOS transistors N5-1 and N5-2 are arranged on the third layer 3F. Gates, sources and drains of the NMOS transistors N4-1 and N4-2 are commonly connected, and Gates, sources and drains of the NMOS transistors N5-1 and N5-2 are commonly connected. Connections between the PMOS transistors P4 and P5 and the NMOS transistors N4 and N5 are identical to those of FIG. 4D.

As shown in FIGS. 8A and 8D, the semiconductor memory device of the present invention can reduce the layout area size by arranging the transistors which constitute the memory cell on three layers and arranging the transistors which constitute the peripheral circuit on three layers.

FIGS. 9A to 9D are views respectively illustrating the arrangement of transistors of a static memory cell and transistors which constitute an inverter, a NAND gate and a NOR gate of a peripheral circuit of a semiconductor memory device according to a third embodiment of the present invention. In particular, FIGS. 9A to 9D show arrangement of transistors which constitute the peripheral circuit in case where transistors which constitute the memory cell are arranged on three layers. Like the arrangement of FIG. 8A, the transistors of FIG. 9A, which constitute the static memory cell, are arranged on three layers.

Figure 9A:
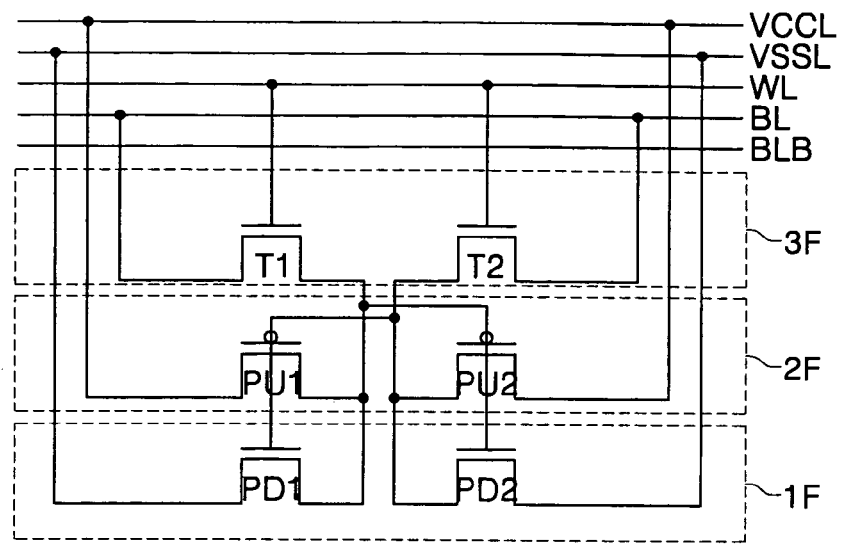
FIGS. 9A to 9D are views respectively illustrating arrangement of transistors of a static memory cell and transistors which constitute an inverter, a NAND gate and a NOR gate of a peripheral circuit of a semiconductor memory device according to a third embodiment of the present invention.
Figure 9B:
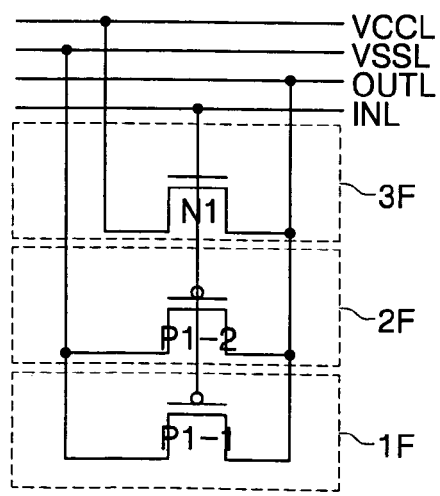

As shown in FIG. 9B, PMOS transistors P1-1 and P1-2 which have ½ channel width of channel width of the PMOS transistor P1 which constitutes the inverter are arranged. The PMOS transistor P1-1 is arranged on the first layer 1F, the PMOS transistor P1-2 is arranged on the second layer 2F, and the NMOS transistor N1 is arranged on the third layer 3F. Gates, drains and sources of the PMOS transistors P1-1 and P1-2 are commonly connected, and connections between the PMOS transistors P1-1 and P1-2 and the NMOS transistor N1 are identical to those of FIG. 4B.

Figure 9C:
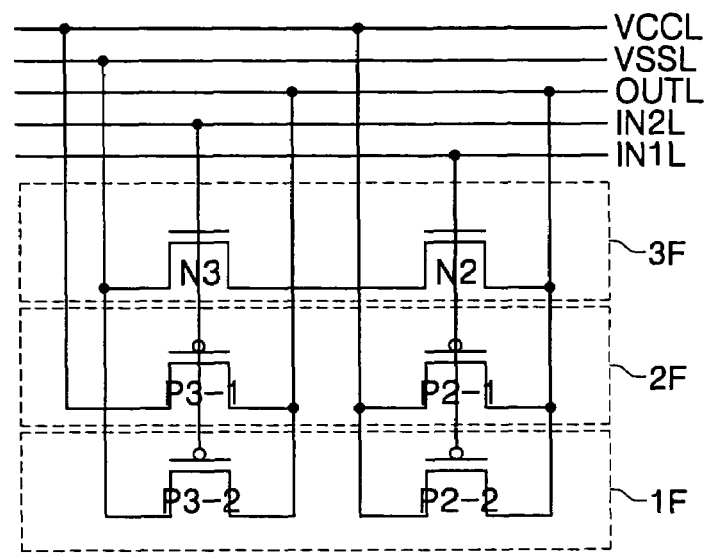

As shown in FIG. 9C, the PMOS transistors P2-1 and P2-2 and the PMOS transistors P3-1 and P3-2 which respectively have ½ channel width of respective channel width of the PMOS transistors P2 and P3 which constitute the NAND gate are arranged. The PMOS transistors P2-2 and P3-2 are arranged on the first layer 1F, the PMOS transistors P2-1 and P3-1 are arranged on the second layer 2F, and the NMOS transistors N2 and N3 are arranged on the third layer 3F. Gates, drains and sources of the PMOS transistors P2-1 and P2-2 are commonly connected, and gates, drains and sources of the PMOS transistors P3-1 and P3-2 are commonly connected, and connections between the PMOS transistors P2-1, P2-2, P3-1, and P3-2 and the NMOS transistors N2 and N3 are identical to those of FIG. 4C.

Figure 9D:
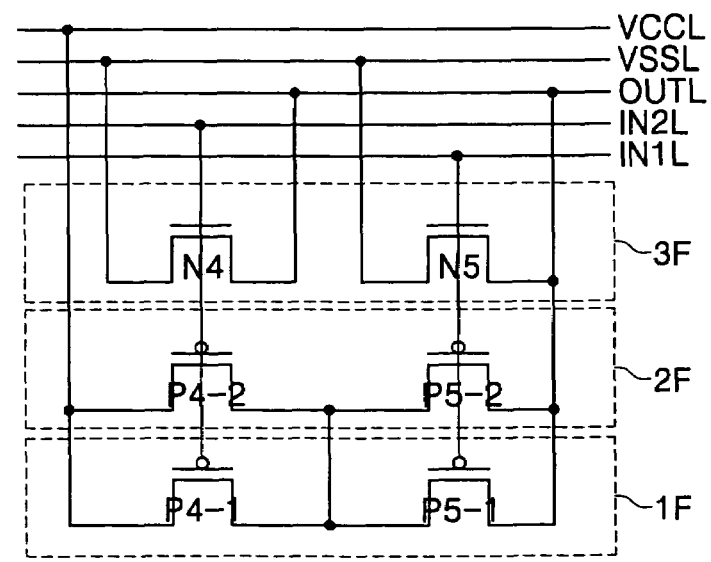

As shown in FIG. 9D, the PMOS transistors P4-1 and P4-2 and the PMOS transistors P5-1 and P5-2 which respectively have ½ channel width of respective channel width of the PMOS transistor P4 and P5 which constitute the NOR gate are arranged. The PMOS transistors P4-1 and P5-1 are arranged on the first layer 1F, the PMOS transistors P4-2 and P5-2 are arranged on the second layer 2F, and the NMOS transistors N4 and N5 are arranged on the third layer 3F. Gates, drains and sources of the PMOS transistors P4-1 and P4-2 are commonly connected, and gates, drains and sources of the PMOS transistors P5-1 and P5-2 are commonly connected, and connections between the PMOS transistors P4-1, P4-2, P5-1, and P5-2 and the NMOS transistors N4 and N5 are identical to those of FIG. 4D.

The PMOS transistor and the NMOS transistor may be arranged on the first layer, but it is preferred to arrange the same type transistor on the second layer 2F as the transistor arranged on the second layer of the memory cell for the convenience of manufacturing process. For example, it is preferable to arrange the PMOS transistor which is to be arranged on the second layer 2F of the peripheral circuit if the transistors to be arranged on the second layer 2F of the memory cell are PMOS transistors, and it is preferable to arrange the NMOS transistor which is to be arranged on the third layer 3F of the peripheral circuit if the transistors to be arranged on the third layer 3F of the memory cell are NMOS transistors.

Arrangement and structure of the inverter, the NAND gate, and the NOR gate which constitute the static memory cell and the peripheral circuit according to an embodiment of the present invention will be explained below.

Figure 18:
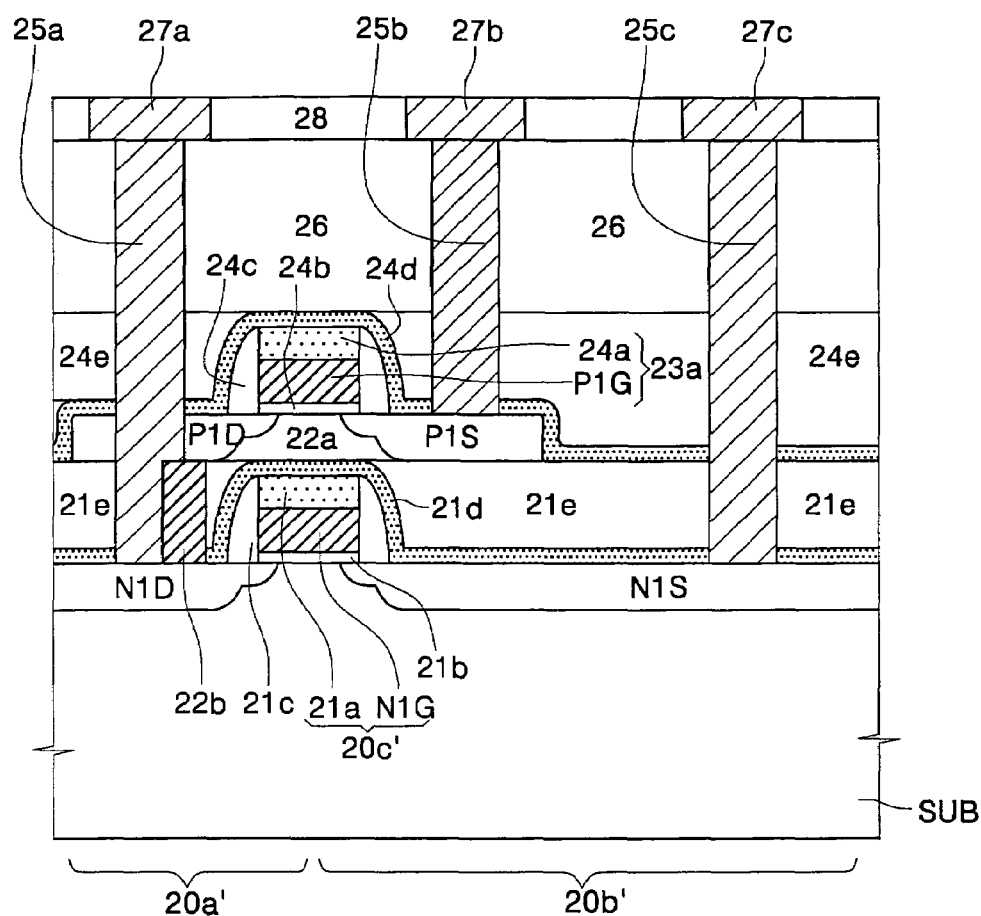
FIGS. 18 to 20 are cross-sectional views taken along line X-X' of FIGS. 10B to 16B, FIGS. 10C to 16C, and FIGS. 10D to 16D, illustrating the structure of the memory cell according to the embodiment of the present invention.
Figure 19:
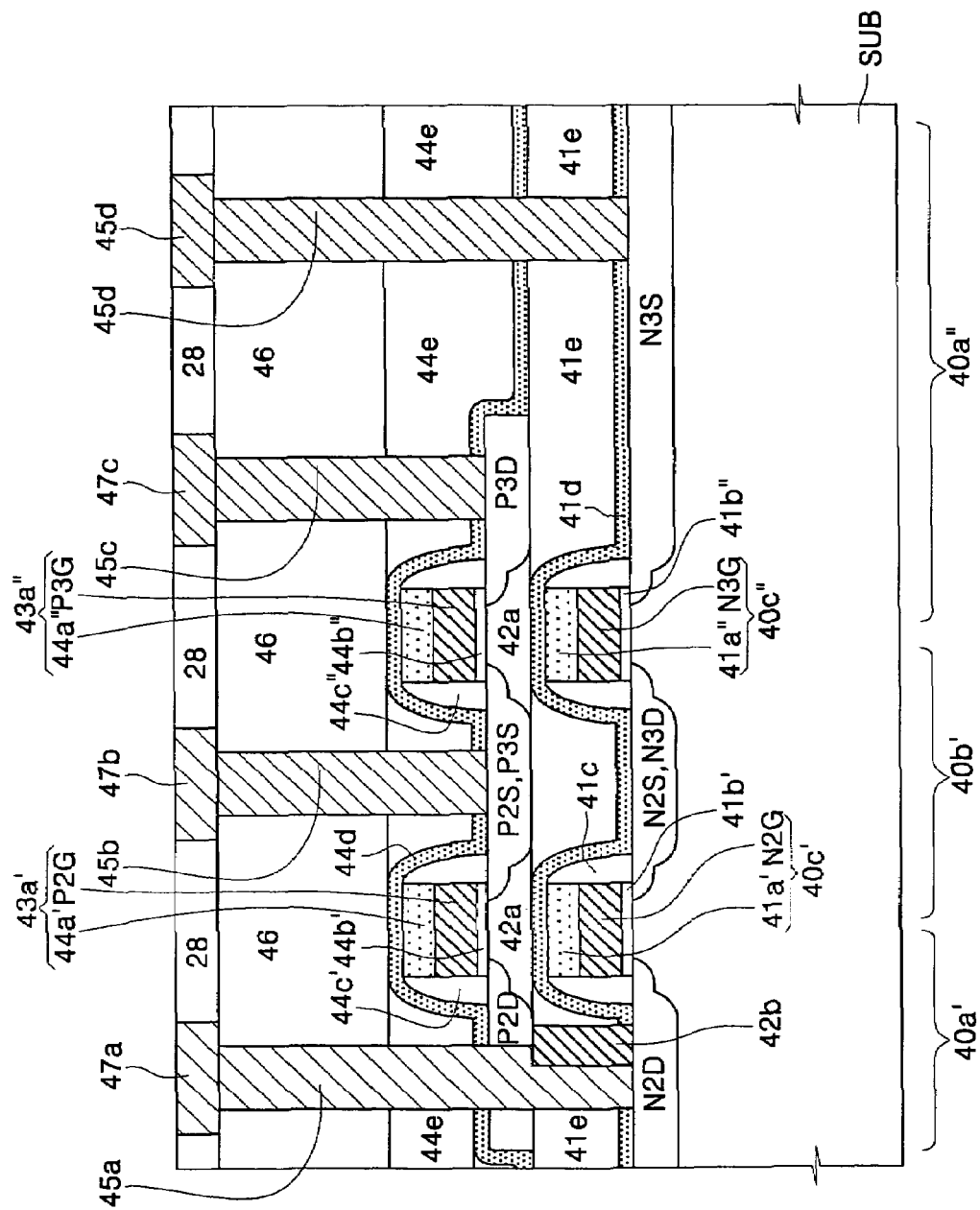
Figure 20:
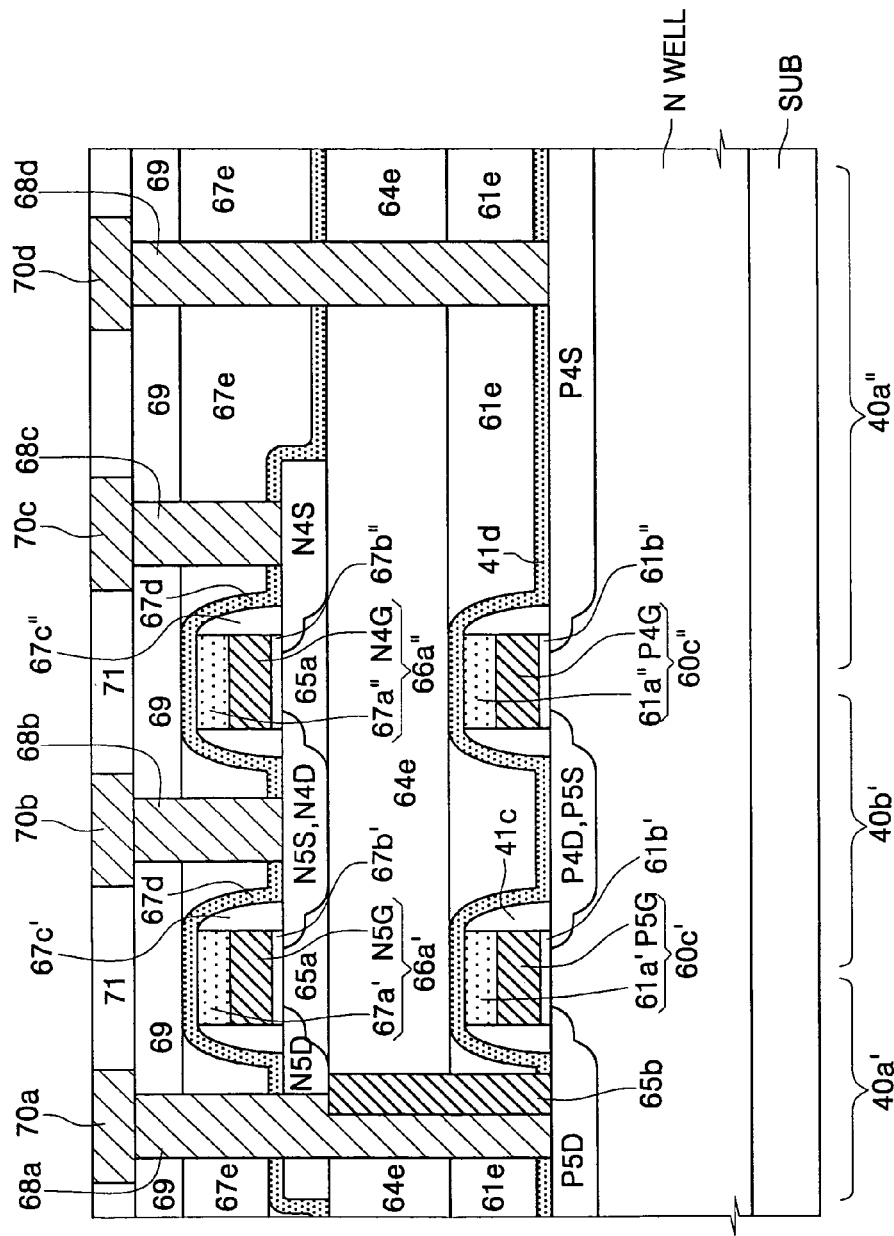

FIGS. 10A to 16D are plan views illustrating respective arrangement of the memory cell, the inverter, the NAND gate, and the NOR gate according to an embodiment of the present invention. FIGS. 17A and 17B are cross-sectional views respectively taken along line □-□' and □-□' of FIG. 16A, illustrating structure of the memory cell according to the embodiment of the present invention. FIGS. 18 to 20 are cross-sectional views taken along line □-□' of FIGS. 10B to 16B, FIGS. 10C to 16C, and FIGS. 10D to 16D, illustrating the structure of the memory cell according to the embodiment of the present invention.

Figure 10A:
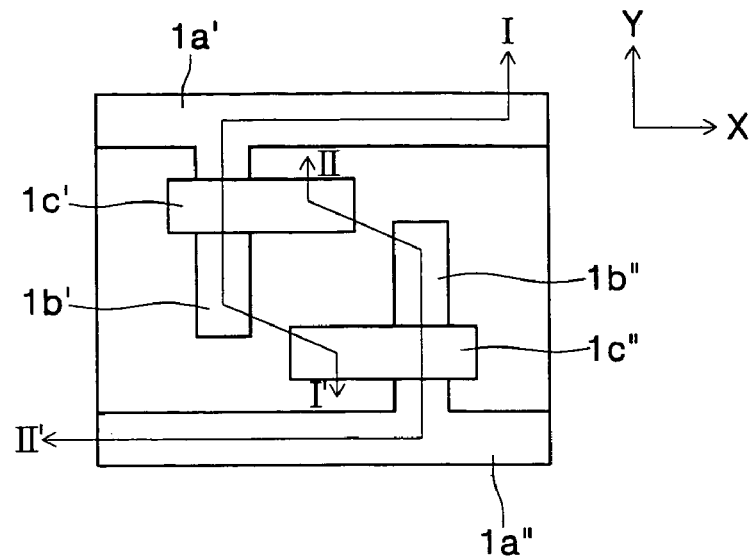
FIGS. 10A to 16D are plane views illustrating respective arrangement of the memory cell, the inverter, the NAND gate, and the NOR gate according to an embodiment of the present invention.

Referring to FIGS. 10A, 17A and 17B, a first active area 1$b$' and a second active area 1$a$' are arranged on a semiconductor substrate SUB in a parallel direction to a y axis opposing to each other, and one end of the second active area 1$a$' extends to be parallel to an x axis. A third active area 1$b$'' and a fourth active area 1$a$'' are arranged on a semiconductor substrate SUB in a parallel direction to a y axis opposing to each other, and one end of the fourth active area 1$a$'' extends to be parallel to an x axis. A gate pattern 1$c$' is arranged in the x axis direction to cross over the first and second active areas 1$b$' and 1$a$' which are arranged to be parallel to the y axis, and a gate pattern 1$c$'' is arranged in the x axis direction to cross over the third and fourth active areas 1$b$'' and 1$a$'' which are arranged to be parallel to the y axis. A drain region PD1D is provided on a surface of the first active area 1$b$' which is located at one side of the gate pattern 1$c$', and a source region PD1S is provided on a surface of the second active area 1$a$' which is located on the other side of the gate pattern 1$c$'. Likewise, a drain region PD2D is provided on a surface of the third active area 1$b$'' which is located at one side of the gate pattern 1$c$'', and a source region PD2S is provided on a surface of the fourth active area 1$a$'' which is located on the other side of the gate pattern 1$c$''. The gate patterns 1$c$' and 1$c$'' may include a gate electrode PD1G of the NMOS transistor PD1 and a capping insulating layer 2$a$' which are stacked in order and a gate electrode PD2G of the NMOS transistor PD2 and a capping insulating layer 2$a$'' which are stacked in order, respectively, and gate insulating layers 2$b$' and 2$b$'' are respectively interposed between the respective gate patterns 1$c$' and 1$c$'' and the semiconductor substrate SUB. A spacer 2$c$ may be arranged on side walls of the gate patterns 1$c$' and 1$c$'', and an interlayer insulator 2$e$ is arranged over the whole surface of the semiconductor substrate SUB having the NMOS transistors PD1 and PD2. An etching stopper layer 2$d$ may be additionally interposed between the interlayer insulator 2$e$ and the semiconductor substrate SUB having the NMOS transistors PD1 and PD2. Accordingly, the NMOS transistors PD1 and PD2, which are bulk-transistors, are formed on the semiconductor substrate SUB.

Figure 10B:
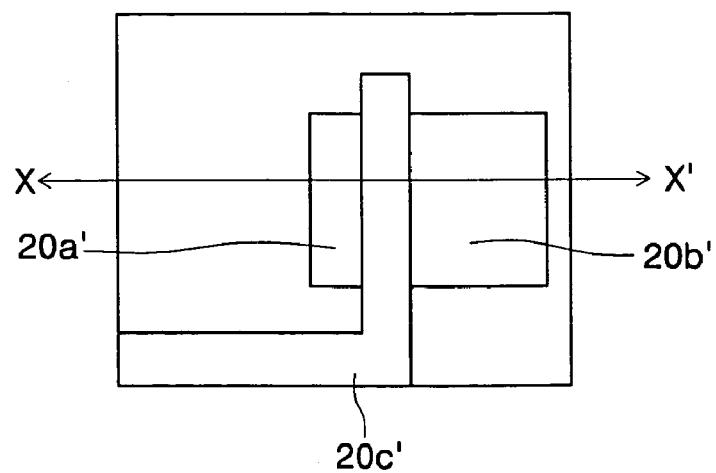

Referring to FIGS. 10B and 18, first and second active areas 20$a$' and 20$b$' are arranged on a semiconductor substrate SUB opposing to each other, and a gate pattern 20$c$' is arranged in the y axis direction to cross over the first and second active areas 20$a$' and 20$b$', and one end of the gate pattern 20$c$' extends in a direction of the x axis where the first active area 20$a$' is located. A drain region N1D of the NMOS transistor N1 is provided on a surface of the first active area 20$a$', and a source region N1S of the NMOS transistor N1 is provided on a surface of the second active area 20$b$'. The gate pattern 20$c$' of the NMOS transistor N1 may include a gate electrode N1G of the NMOS transistor N1 and a capping insulating layer 21$a$ which are stacked in order, and a gate insulating layer 21$b$ is interposed between the gate pattern 20$c$' and the semiconductor substrate SUB. A spacer 21$c$ may be arranged on side walls of the gate pattern 20$c$', and an interlayer insulator 21$e$ is arranged over the whole surface of the semiconductor substrate SUB having the NMOS transistor N1. An etching stopper layer 21$d$ may be additionally interposed between the interlayer insulator 21$e$ and the semiconductor substrate SUB having the NMOS transistor N1. Accordingly, the NMOS transistor N1 which is a bulk-transistor which constitutes the inverter is formed on the semiconductor substrate SUB.

Figure 10C:
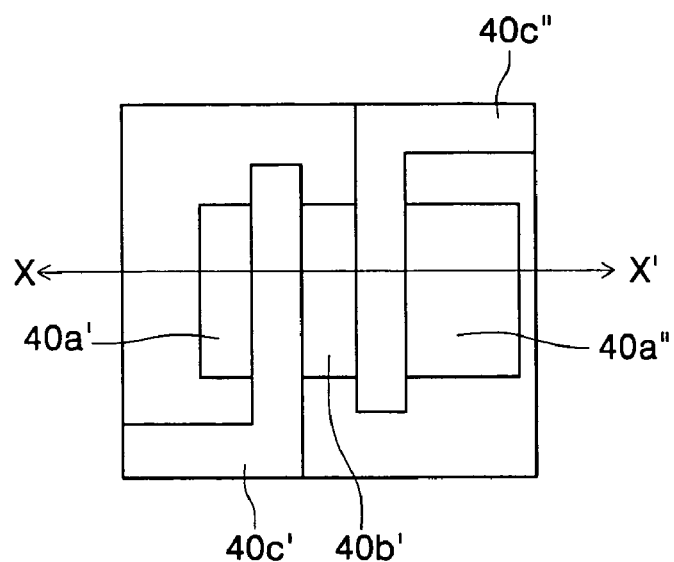

Referring to FIGS. 10C and 19, first to third active areas 40$a$', 40$b$' and 40$a$'' are arranged on a semiconductor substrate SUB. A gate pattern 40$c$' is arranged in the y axis direction above the first and second active areas 40$a$' and 40$b$', and one end of the gate pattern 40$c$' is arranged in a direction of the x axis where the firs active area 40$a$' is located. A gate pattern 40$c$'' is arranged in the y axis direction above the second and third active areas 40$b$' and 40$a$'', and one end of the gate pattern 40$c$'' is arranged in a direction of the x axis where the third active area 40$a$'' is located. One end of the gate pattern 40$c$' and one end of the gate pattern 40$c$'' are arranged to face each other in diagonal line direction. The gate pattern 40$c$' of the NMOS transistor N2 may includes a gate electrode N2G of the NMOS transistor N2 and a capping insulating layer 41$a$', and a gate insulating layer 41$b$' is interposed between the gate pattern 40$c$' and the semiconductor substrate SUB. A drain region N2D of the NMOS transistor N2 is provided on a surface of the first active area 40$a$' of the semiconductor substrate SUB, and a source region N2S of the NMOS transistor N2 and a drain region N3D of the NMOS transistor N3 are provided on a surface of the second active area 40$b$'. A spacer 41$c$ may be arranged on side walls of the gate pattern 40$c$', and an interlayer insulator 41$e$ is arranged over the whole surface of the semiconductor substrate SUB having the NMOS transistor N2. An etching stopper layer 41$d$ may be additionally interposed between the interlayer insulator 41$e$ and the semiconductor substrate SUB having the NMOS transistor N2. Likewise, the gate pattern 40$c$'' of the NMOS transistor N3 is provided in the same form as the gate pattern 40$c$' of the NMOS transistor N2. Accordingly, the NMOS transistors N2 and N3 which are bulk-transistors, which constitute the NAND gate, is formed on the semiconductor substrate SUB.

Figure 10D:
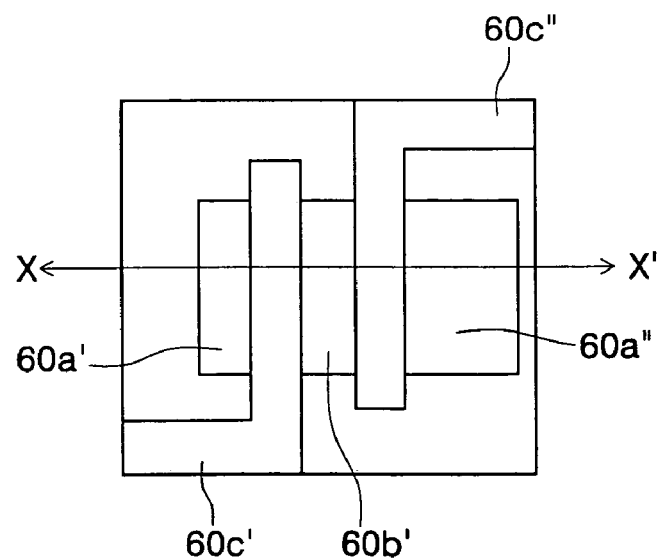

Referring to FIGS. 10D and 20, an N well N WELL is formed on a semiconductor substrate SUB, and first to third active areas 60$a$', 60$b$' and 60$a$'' are provided in the N well N WELL. Gate patterns 60$c$' and 60$c$'' are provided in the same form as those of FIG. 10C. As shown in FIG. 20, the PMOS transistors P4 and P5, which are bulk-transistors, are formed on the semiconductor substrate SUB. The PMOS transistors P4 and P5 have the same form as the NMOS transistors N2 and N3 of FIG. 19.

Figure 11A:
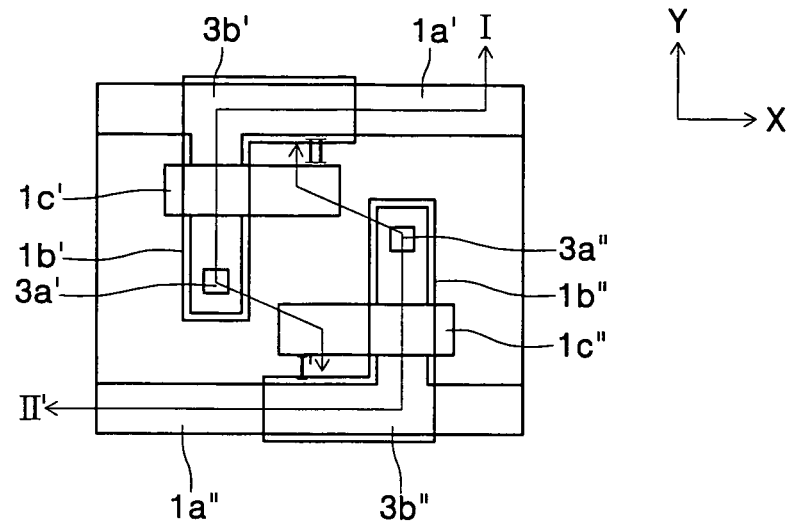

Referring to FIGS. 11A, 17A and 17B, the drain region PD1D of the NMOS transistor PD1 is electrically connected to a lower node semiconductor plug 3$a$' which penetrates the interlayer insulator 2e and the etching stopper layer 2d, and the drain region PD2D of the NMOS transistor PD2 is electrically connected to a lower node semiconductor plug 3a'' which penetrates the interlayer insulator 2e and the etching stopper layer 2d. Lower body patterns 3b' and 3b'' are arranged on the interlayer insulator 2e to respectively cover the lower node semiconductor plugs 3a' and 3a''.

Figure 11B:
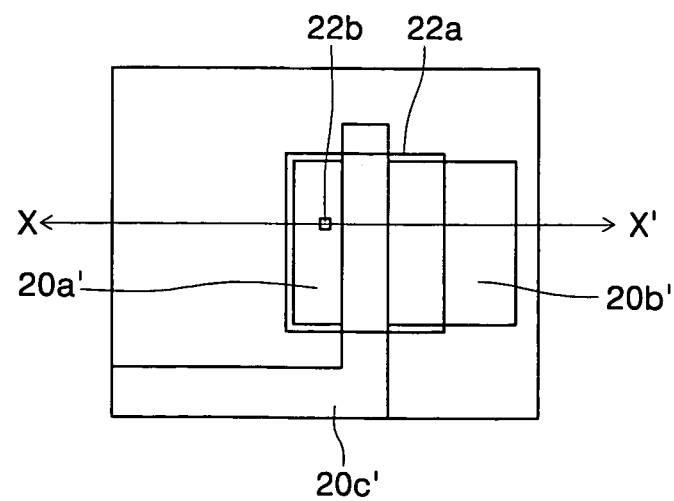

Referring to FIGS. 11B and 18, the drain region N1D of the NMOS transistor N1 is electrically connected to a node semiconductor plug 22b, which penetrates the interlayer insulator 21e and the etching stopper layer 21d, and a lower body pattern 22a is arranged on the interlayer insulator 21e to cover the node semiconductor plug 22b.

Figure 11C:
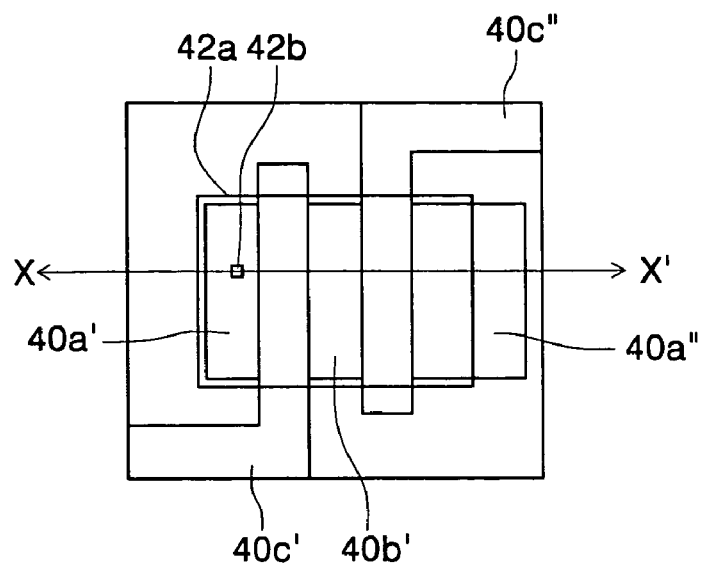

Referring to FIGS. 11C and 19, the drain region N2D of the NMOS transistor N2 is electrically connected to a node semiconductor plug 42b, which penetrates the interlayer insulator 41e and the etching stopper layer 41d, and a lower body pattern 42a is arranged on the interlayer insulator 41e to cover the node semiconductor plug 42b.

Figure 11D:
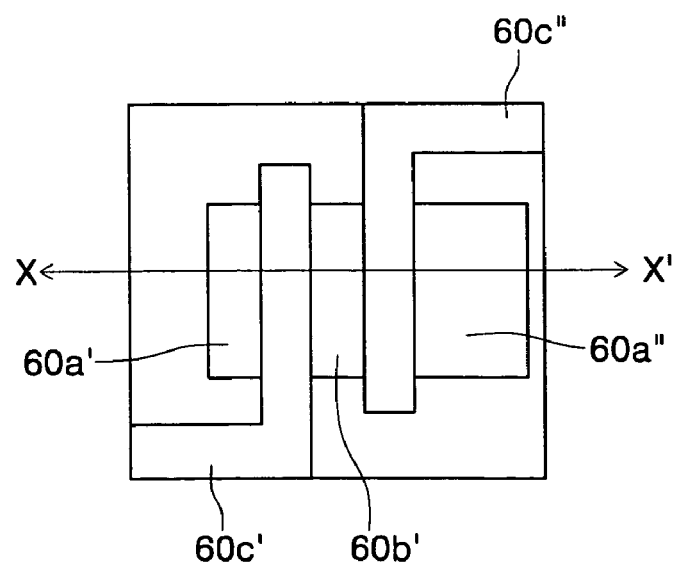

In case where the memory cell, the inverter, the NAND gate are arranged as shown in FIGS. 11A and 11C, the NOR gate of FIG. 11D has the same arrangement as that of FIG. 10D.

Figure 12A:
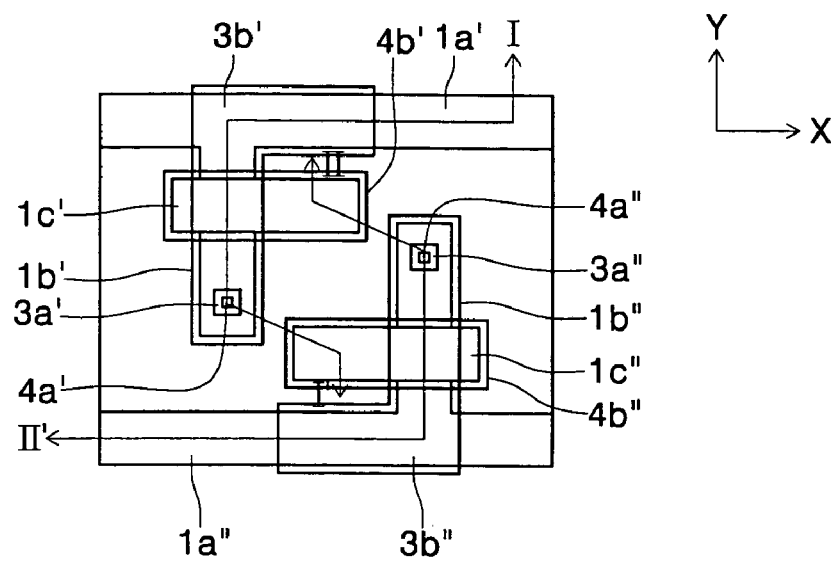

Referring to FIGS. 12A, 17A and 17B, a gate pattern 4b' of the PMOS transistor PU1 is arranged to cross over the lower body pattern 3b', and a gate pattern 4b'' of the PMOS transistor PU2 is arranged to cross over the lower body pattern 3b''. An upper node semiconductor plug 4a' is arranged above the lower body pattern 3b' at a location where the lower node semiconductor plug 3a' is arranged, and an upper node semiconductor plug 4a'' is arranged above the lower body pattern 3b'' at a location where the lower node semiconductor plug 3a'' is arranged. Gate electrodes PU1G and PU2G of the PMOS transistors PU1 and PU2 are respectively arranged above the lower body patterns 3b' and 3b''. A source region PU1S and a drain region PU1D of the PMOS transistor PU1 are provided in the lower body pattern 3b', and a source region PU2S and a drain region PU2D of the PMOS transistor PU2 are provided in the lower body pattern 3b''. Accordingly, the PMOS transistors PU1 and PU2, which are thin film transistors, are stacked on the NMOS transistors PD1 and PD2.

Figure 12B:
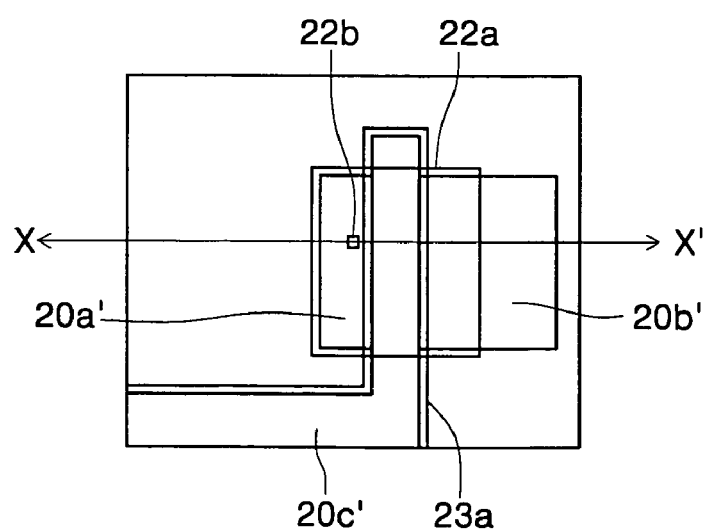

Referring to FIGS. 12B and 18, a gate pattern 23a is arranged above the lower body pattern 22a in the same form as the gate pattern 20c'. A gate electrode P1G of the PMOS transistor P1 is arranged above the lower body pattern 22a, and a drain region P1D and a source region P1S of the PMOS transistor P1 are provided in the lower body pattern 22a. A capping insulating layer 24a is arranged above the gate electrode P1G, and a gate insulating layer 24b is arranged below the gate electrode P1G. A spacer 24c may be arranged on side walls of the gate pattern 23a, and an interlayer insulator 24e is arranged over the whole surface of the lower body pattern 22a having the PMOS transistor P1. An etching stopper layer 24d may be additionally interposed between the interlayer insulator 24e and the lower body pattern 22a having the PMOS transistor P1. Accordingly, the PMOS transistor P1 is stacked above the NMOS transistor N1.

Figure 12C:
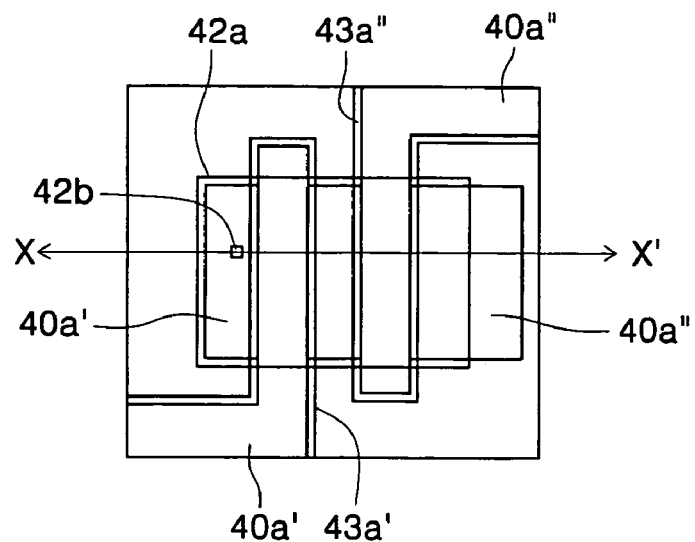

Referring to FIGS. 12C and 19, gate patterns 43a' and 43a'' are arranged above the lower body pattern 42a to overlap over the gate patterns 40c' and 40c''. Gate electrodes P2G and P3G are arranged of the PMOS transistors P2 and P3 above the lower body pattern 42a, and a drain region P2D of the PMOS transistor P2, a source region P2S of the PMOS transistor P2, a source region P3S of the PMOS transistor P3, and a drain region P3D of the PMOS transistor P3 are provided in the lower body pattern 42a. A capping insulating layer 44a' is arranged above the gate electrode P2G, and a gate insulating layer 44b' is arranged below the gate electrode P2G. Likewise, a capping insulating layer 44a'' is arranged above the gate electrode P3G, and a gate insulating layer 44b'' is arranged below the gate electrode P3G. Spacers 44c' and 44c'' are arranged on side walls of the gate patterns 43a' and 43a'', and an interlayer insulator 44e is arranged over the whole surface of the lower body pattern 42a having the PMOS transistors P2 and P3. An etching stopper layer 44d may be additionally interposed between the interlayer insulator 44e and the lower body pattern 42a having the PMOS transistors P2 and P3. Accordingly, the PMOS transistors P2 and P3 are stacked above the NMOS transistors N2 and N3, respectively.

Figure 12D:
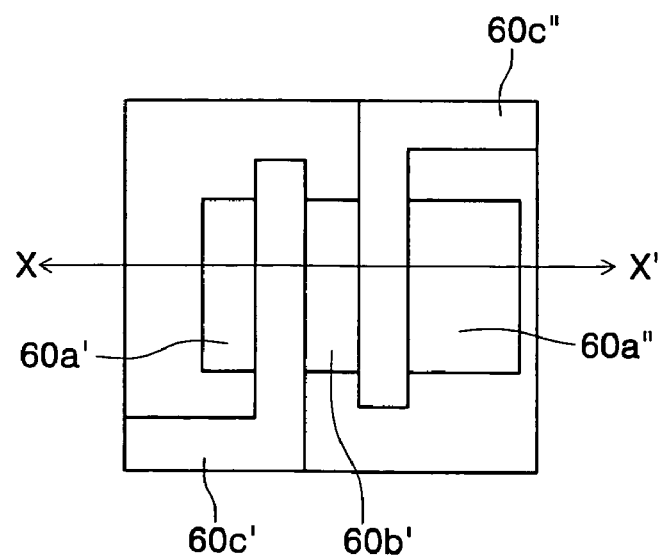

In case where the memory cell, the inverter, the NAND gate are arranged as shown in FIGS. 11A and 11C, the NOR gate of FIG. 12D has the same arrangement as that of FIG. 11D.

Figure 13A:
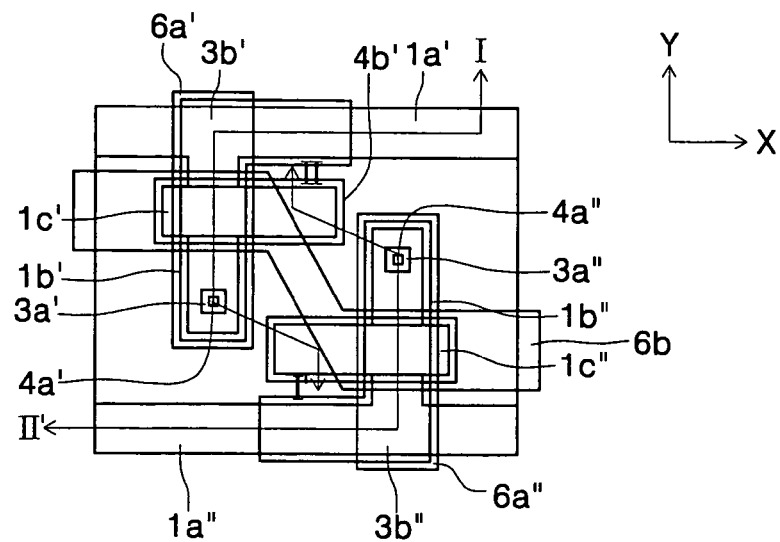

Referring to FIGS. 13A, 17A and 17B, upper body patterns 6a' and 6a'' are arranged on an interlayer insulator 5e. The upper body patterns 6a' and 6a'' are arranged to cover the upper node semiconductor plugs 4a' and 4a'', respectively and to overlap over the lower body patterns 3b' and 3b''. A word line pattern 6b is arranged to cross over the upper body patterns 6a' and 6a'' and to overlap the gate patterns 1c' and 1c''. Word lines T1G and T2G are arranged above the upper body patterns 6a' and 6a'', and a drain region T1D and a source region T1S of the transmission transistor T1 are arranged in the upper body pattern 6a', and a drain region T2D and a source region T2S of the transmission transistor T2 are arranged in the upper body pattern 6a''. A capping insulating layer 7a is arranged above the word lines T1G and T2G, and a gate insulating layer 7b is arranged below the word lines T1G and T2G, and a pacer 7c is arranged on a side wall of the word line pattern 6b. An interlayer insulator 7e is arranged over the whole surface of the upper body patterns 6a' and 6a'' having the transmission transistors T1 and T2. An etching stopper layer 7d may be additionally interposed between the interlayer insulator 7e and the upper body patterns 6a' and 6a'' having the transmission transistors T1 and T2. Accordingly, the transmission transistors T1 and T2 which are thin film transistors are stacked above the pull-up transistors PU1 and PU2, respectively.

Figure 13B:
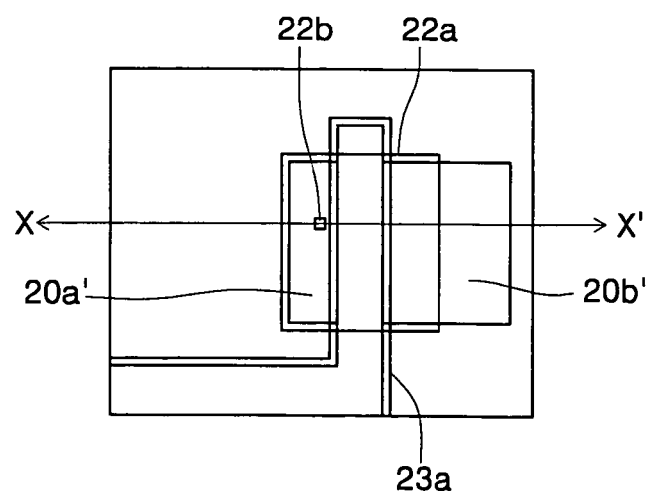
Figure 13C:
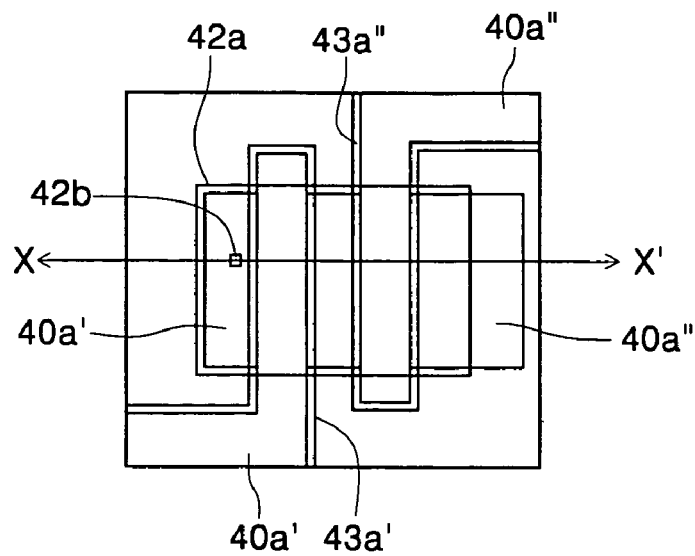

In case where the memory cell is arranged as shown in FIG. 13A, the inverter and the NAND gate of FIGS. 13B and 13C have the same arrangement as that of FIGS. 12B and 12C.

Figure 13D:
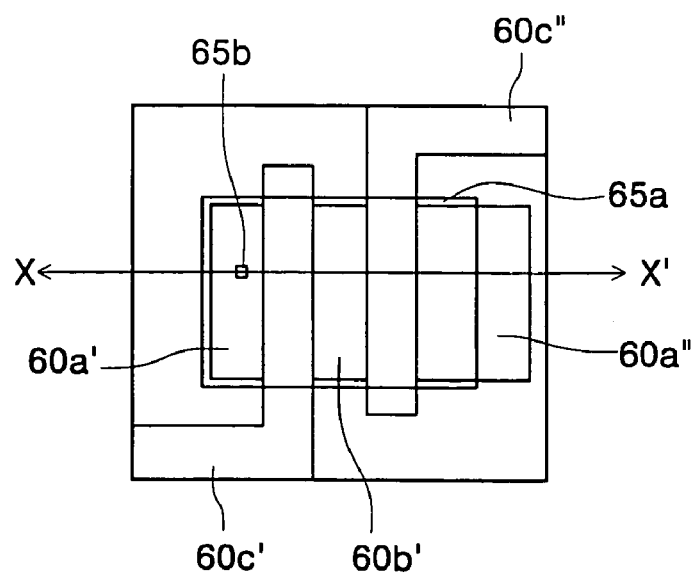

Referring to FIGS. 13D and 20, a drain region P5D of the PMOS transistor P5 is electrically connected to a node semiconductor plug 65b which penetrates interlayer insulators 64e and 61e and the etching stopper layer 41d, and an upper body pattern 65a is arranged to cover the interlayer insulator 64e and the node semiconductor plug 65b.

Figure 14A:
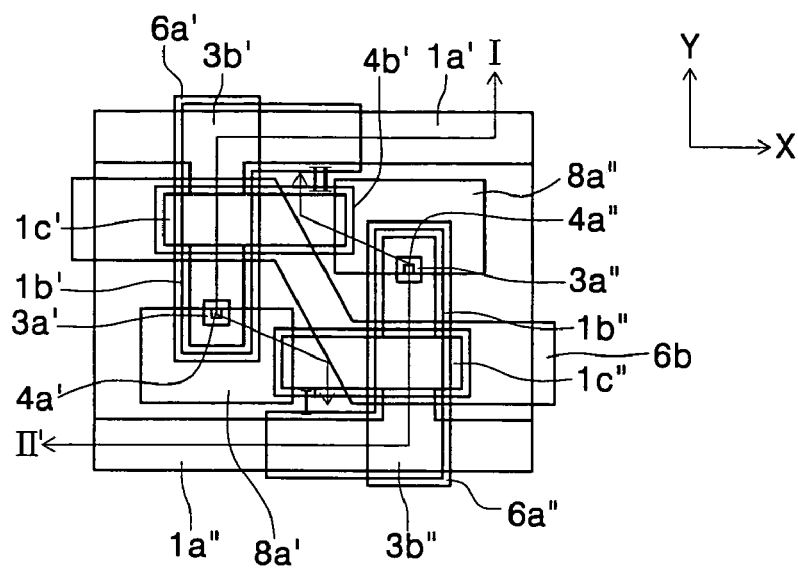

Referring to FIGS. 14A, 17A and 17B, the lower node semiconductor plug 3a', the upper node semiconductor plug 4a', the drain region PD1D of the pull-down transistor PD1, the drain region PU1D of the pull-up transistor PU1, the source region T1S of the transmission transistor T1, the gate electrode PD2G of the pull-down transistor PD2, and the gate electrode PU2G of the pull-up transistor PU2 are electrically connected through a node plug 8a'. The lower node semiconductor plug 3a'', the upper node semiconductor plug 4a'', the drain region PD2D of the pull-down transistor PD2, the drain region PU2D of the pull-up transistor PU2, the source region T2S of the transmission transistor T2, the gate electrode PD1G of the pull-down transistor PD1, and the gate electrode PU1G of the pull-up transistor PU1 are electrically connected through a node plug 8a".

Figure 14B:
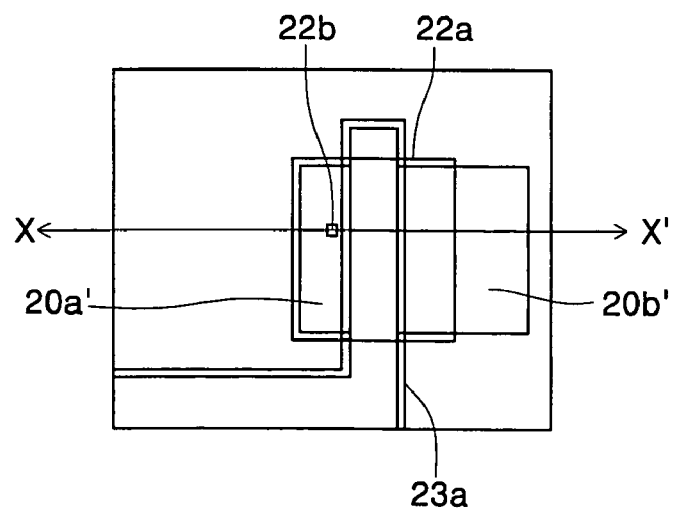
Figure 14C:
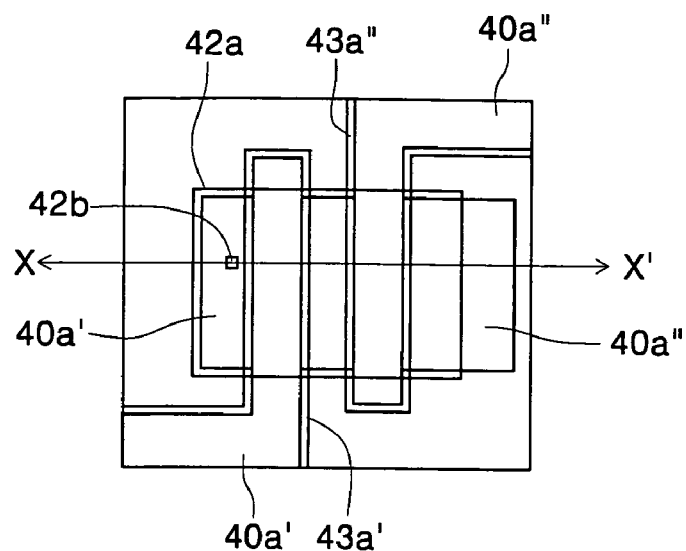

In case where the memory cell is arranged as shown in FIG. 14A, the inverter and the NAND gate of FIGS. 14B and 14C have the same arrangement as that of FIGS. 13B and 13C.

Figure 14D:
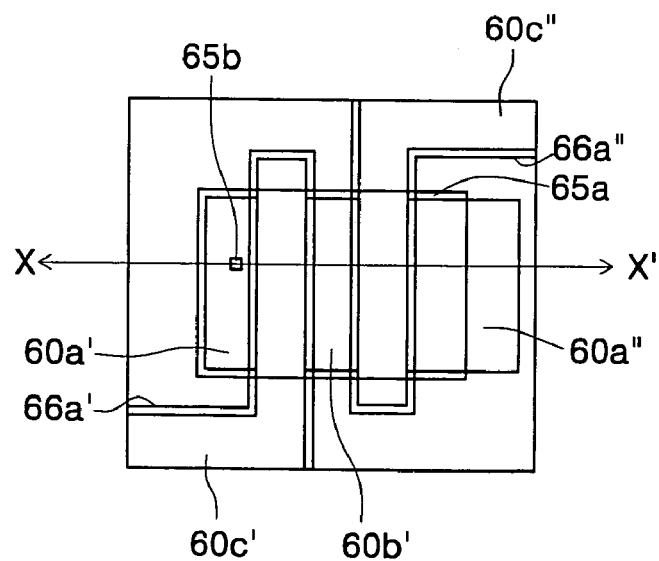

Referring to FIGS. 14D and 20, gate patterns 66a' and 66a" are arranged above the upper body pattern 65a to overlap over the gate patterns 60c' and 60c". As shown in FIG. 20, gate electrodes N4G and N5G of the NMOS transistors N4 and N5 are arranged above the upper body pattern 65a, and a drain region N5D of the NMOS transistor N5, source and drain regions N5S and N5D of the NMOS transistors N4 and N5, and a source region N4S of the NMOS transistor N4 are provided in the upper body pattern 65a. A capping insulating layer 67a' is arranged above the gate electrode N5G, and a gate insulating layer 67b' is arranged below the gate electrode N5G. Likewise, a capping insulating layer 67a" is arranged above the gate electrode N4G, and a gate insulating layer 67b" is arranged below the gate electrode N4G. Spacers 67c' and 67c" are arranged on side walls of the gate patterns 66a' and 66a", and an interlayer insulator 67e is arranged over the whole surface of the upper body pattern 65a having the NMOS transistors N4 and N5. An etching stopper layer 67d may be additionally interposed between the interlayer insulator 67e and the upper body pattern 65a having the NMOS transistors N4 and N5. Accordingly, the NMOS transistors N4 and N5 are stacked above the PMOS transistors P4 and P5, respectively.

Figure 15A:
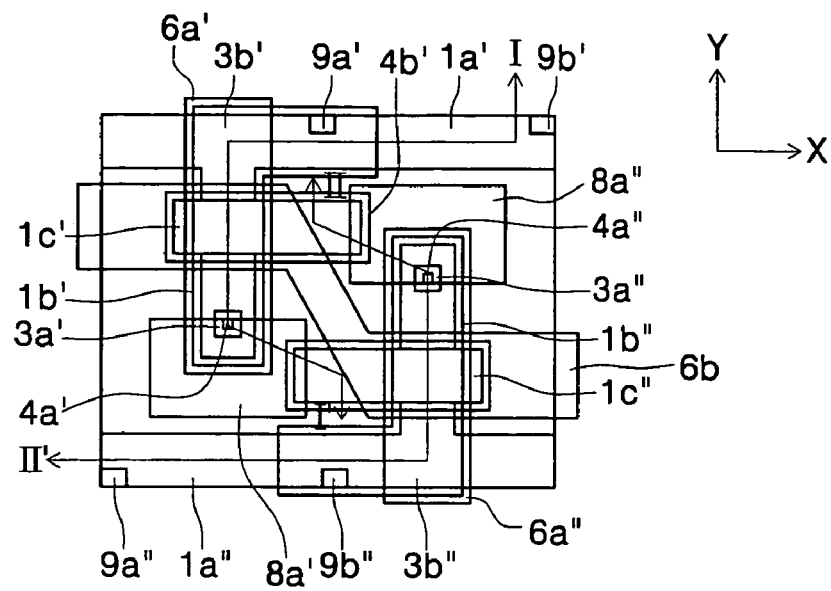

Referring to FIGS. 15A, 17A and 17B, an interlayer insulator 9c is stacked on node plugs 8a' and 8a" and the interlayer insulator 7e. The source region PU1S of the pull-up transistor PU1 is electrically connected to a power line contact plug 9a', and the source region PU2S of the pull-up transistor PU2 is electrically connected to a power line contact plug 9a". The source region PD1S of the pull-down transistor PD1 is electrically connected to a ground line contact plug 9b', and the source region PD2S of the pull-down transistor PD2 is electrically connected to a ground line contact plug 9b".

Figure 15B:
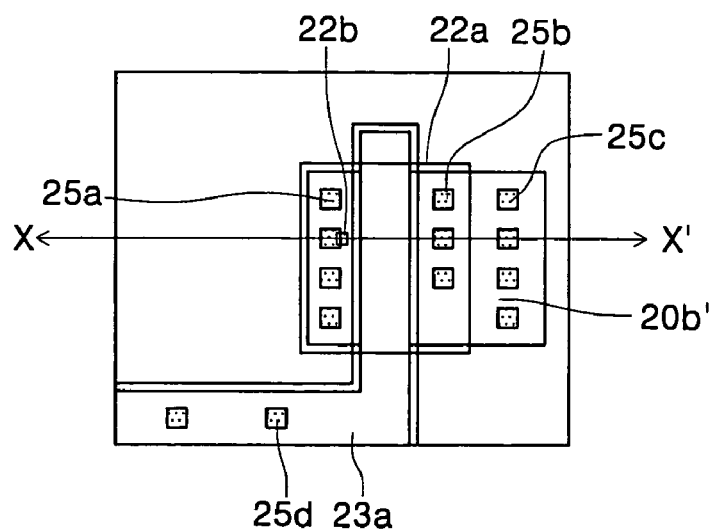

Referring to FIGS. 15B and 18, an interlayer insulator 26 is stacked on the interlayer insulator 24e. The node semiconductor plug 22b, the drain region N1D of the NMOS transistor N1, the drain region P1D of the PMOS transistor P1 are electrically connected to an output signal line contact plug 25a, the source region P1S of the PMOS transistor P1 is electrically connected to a power line contact plug 25b, and the source region N1S of the NMOS transistor N1 is electrically connected to a ground line contact plug 25c. Even though not shown, the gate electrodes P1G and N1G of the PMOS transistor P1 and the NMOS transistor N1 are electrically connected to an input signal line contact plug 25d.

Figure 15C:
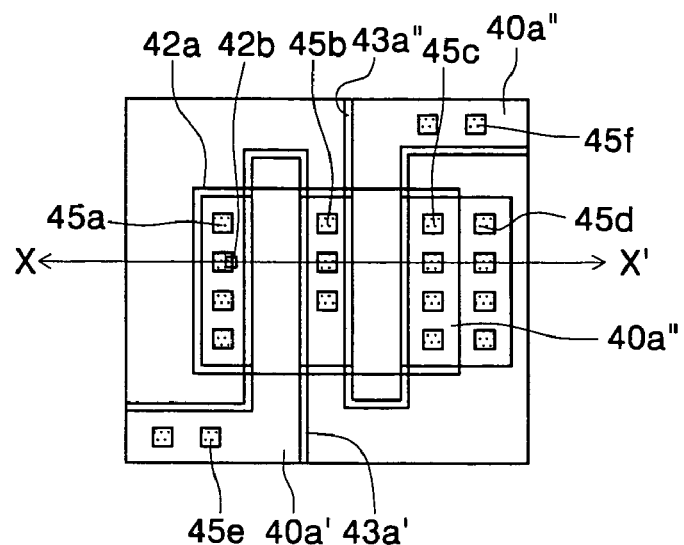

Referring to FIGS. 15C and 19, an interlayer insulator 46 is stacked on the interlayer insulator 44e. The node contact plug 42b, the drain region N2D of the NMOS transistor N2, the drain region P2D of the PMOS transistor P2 are electrically connected to an output signal line contact plug 45a, the source regions P2S and P3S of the PMOS transistors P2 and P3 are electrically connected to a power line contact plug 45b, the drain region P3D of the PMOS transistor P3 is electrically connected to an output signal line contact plug 45c, and the source region N3S of the NMOS transistor N3 is electrically connected to a ground line contact plug 45d. The gate electrodes P2G and N2G of the PMOS transistor P2 and the NMOS transistor N2 are electrically connected to a first input signal line contact plug 25e, and the gate electrodes P3G and N3G of the PMOS transistor P3 and the NMOS transistor N3 are electrically connected to a second input signal line contact plug 25f.

Figure 15D:
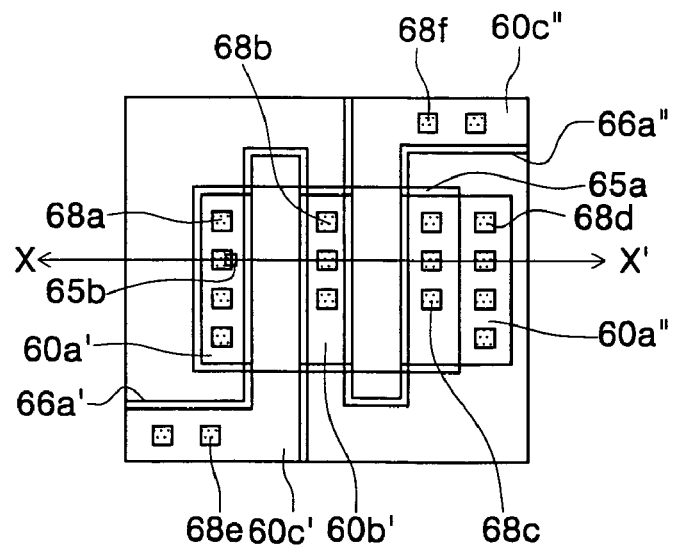

Referring to FIGS. 15D and 20, an interlayer insulator 69 is stacked on the interlayer insulator 67e. The node contact plug 65b, the drain region P5D of the PMOS transistor P5, the drain region N5D of the NMOS transistor N5 are electrically connected to an output signal line contact plug 68a, the source region N5S of the NMOS transistor N5 and the drain region N4D of the NMOS transistor N4 are electrically connected to a ground line contact plug 68b, the source region N4S of the NMOS transistor N4 is electrically connected to an output signal line contact plug 68c, and the source region P4S of the PMOS transistor P4 is electrically connected to a power line contact plug 68d. The gate electrodes P5G and N5G of the PMOS transistor P5 and the NMOS transistor N5 are electrically connected to a first input signal line contact plug 68c, and the gate electrodes P4G and N4G of the PMOS transistor P4 and the NMOS transistor N4 are electrically connected to a second input signal line contact plug 68d.

Figure 16A:
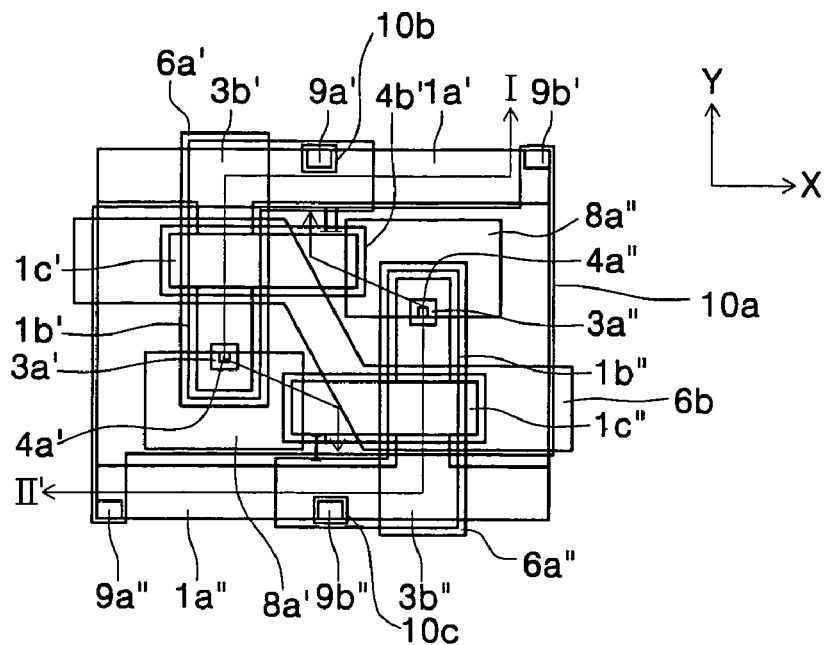
Figure 17A:
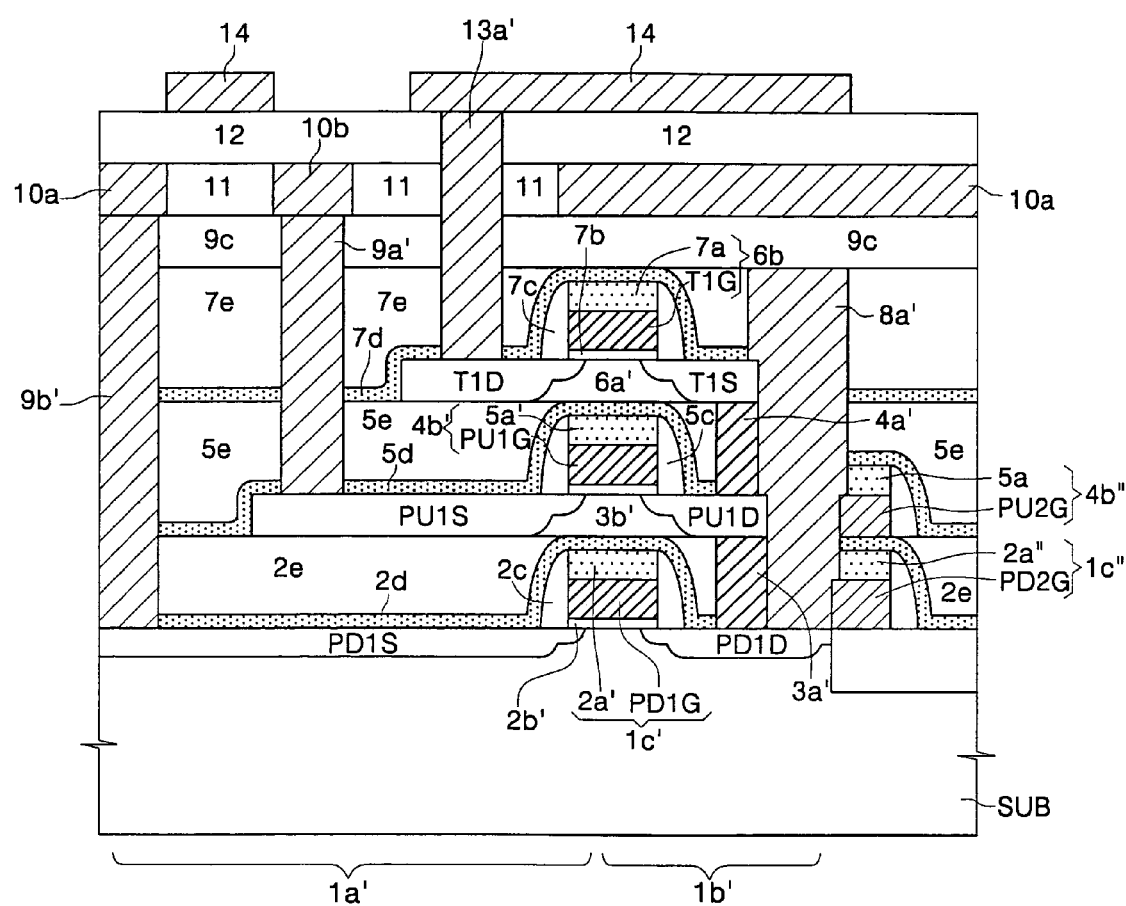
FIGS. 17A and 17B are cross-sectional views respectively taken along line I-I' and II-II' of FIG. 16A, illustrating structure of the memory cell according to the embodiment of the present invention.
Figure 17B:
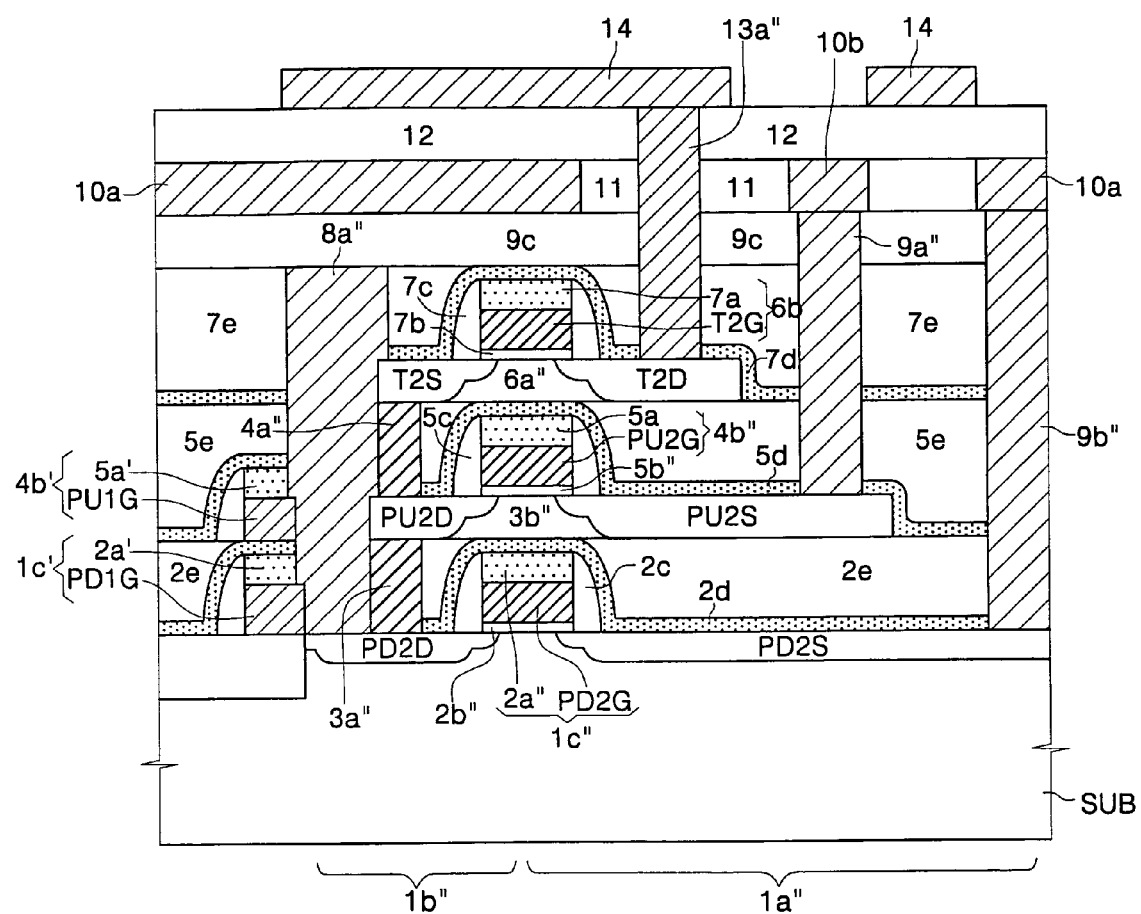

Referring to FIGS. 16A, 17A and 17B, an interlayer insulator 11 is arranged on the interlayer insulator 9c. The power line contact plug 9a' is covered with a power voltage line 10b, and the ground line contact plug 9b' is covered with a ground voltage line 10a. The power line contact plug 9a" is covered with a power voltage line 10b, and the ground line contact plug 9b" is covered with a ground voltage line 10a. An interlayer insulator 12 is arranged on the interlayer insulator 11, and the drain regions T1D and T2D of the transmission transistors T1 and T2 are electrically connected to bit line contact plugs 13a' and 13a", respectively. The bit line contact plugs 13a' and 13a" are covered with a bit line 14.

Figure 16B:
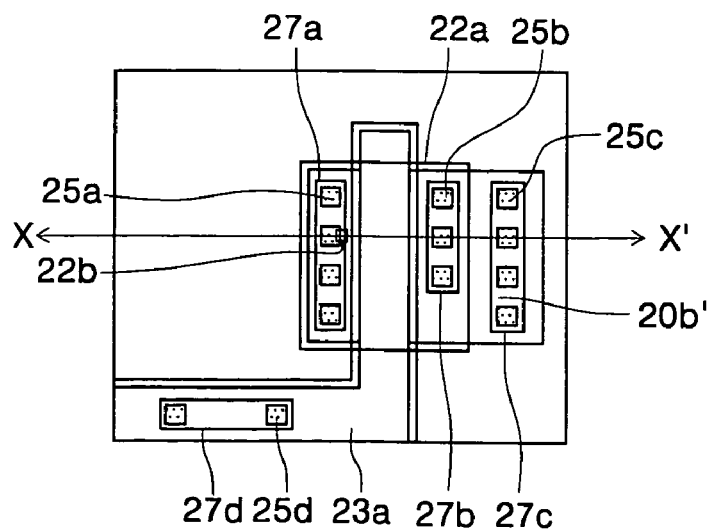

Referring to FIGS. 16B and 18, an interlayer insulator 28 is arranged on the interlayer insulator 26, the output signal line contact plug 25a is covered with an output signal line 27a, the ground line contact plug 25b is covered with a ground voltage line 27b, and the power line contact plug 25c is covered with the power voltage line 27c. The input signal line contact plug 25d is covered with an input signal line 27d.

Figure 16C:
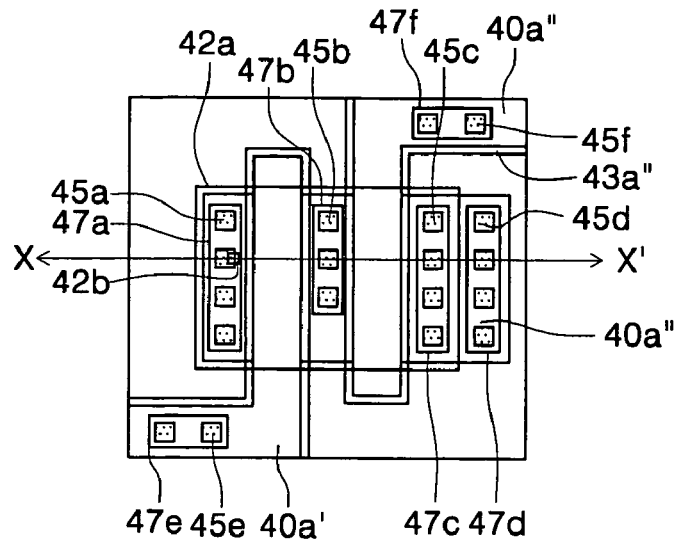

Referring to FIGS. 16C and 19, an interlayer insulator 48 is arranged on the interlayer insulator 46, the output signal line contact plug 45a is covered with an output signal line 47a, the power line contact plug 45b is covered with a power voltage line 47b, the output signal line contact plug 45c is covered with an output signal line 47c, and the ground line contact plug 45d is covered with the ground voltage line 47d. The first input signal line contact plug 45e is covered with a first input signal line 47e, and the second input signal line contact plug 45f is covered with a second input signal line 47f.

Figure 16D:
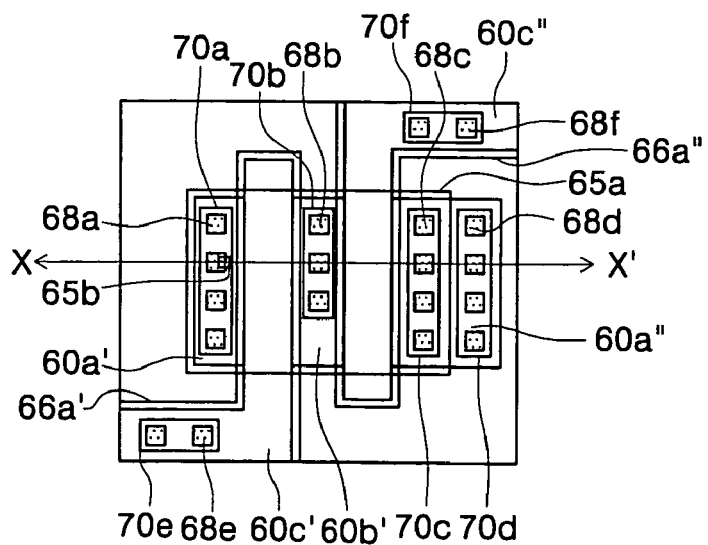

Referring to FIGS. 16D and 20, an interlayer insulator 71 is arranged on the interlayer insulator 69, the output signal line contact plug 68a is covered with an output signal line 70a, the ground line contact plug 68b is covered with a ground voltage line 70b, the output signal line contact plug 68c is covered with an output signal line 70a, and the power line contact plug 68d is covered with the power voltage line 70. The first input signal line contact plug 68e is covered with a first input signal line 70e, and the second input signal line contact plug 68f is covered with a second input signal line 70f.

The node contact plugs and the upper and lower body patterns may be single crystal silicon substrates. The upper and lower body patterns may be poly silicon substrates, and in such instance there is no node contact plugs.

In case where the bulk transistors are arranged on the first layer of the memory cell and the thin film transistors are arranged on the second and third layers like the memory cell described above, it is preferred that the thin film transistors to be arranged on the second and third layers of the peripheral circuit have the same type as the thin film transistors arranged on the second and third layers of the memory cell for the convenience of manufacturing process.

FIGS. 21A and 21B are views illustrating stacking structure of the memory cell array and the peripheral circuit according to a first embodiment of the present invention. In case where the bulk NMOS transistor, the thin film PMOS transistor, the thin film NMOS transistor are respectively arranged on the first to third layers of the memory cell array as shown in FIG. 21A, it is preferred that the transistors having the types of FIG. 21B are arranged on the first to third layers of the peripheral circuit. That is, it is preferred that the bulk NMOS transistor or the bulk PMOS transistor may be arranged on the first layer and the thin film PMOS transistor and the thin film NMOS transistor having the same type as the thin film transistors arranged on the second and third layers of the memory cell are arranged on the second and third layers of the peripheral circuit.

FIGS. 22A and 22B are views illustrating stacking structure of the memory cell array and the peripheral circuit according to a second embodiment of the present invention. In case where the bulk NMOS transistor, the thin film NMOS transistor, the thin film PMOS transistor are respectively arranged on the first to third layers of the memory cell array as shown in FIG. 22A, it is preferred that the transistors having the types of FIG. 22B are arranged on the first to third layers of the peripheral circuit. That is, it is preferred that the bulk NMOS transistor or the bulk PMOS transistor may be arranged on the first layer and the thin film NMOS transistor and the thin film PMOS transistor having the same type as the thin film transistors arranged on the second and third layers of the memory cell are arranged on the second and third layers of the peripheral circuit.

FIGS. 23A and 23B are views illustrating stacking structure of the memory cell array and the peripheral circuit according to a third embodiment of the present invention. In case where the bulk PMOS transistor, the thin film NMOS transistor, the thin film NMOS transistor are respectively arranged on the first to third layers of the memory cell array as shown in FIG. 23A, it is preferred that the transistors having the types of FIG. 23B are arranged on the first to third layers of the peripheral circuit. That is, it is preferred that the bulk NMOS transistor or the bulk PMOS transistor is arranged on the first layer and the thin film NMOS transistor and the thin film NMOS transistor having the same type as the thin film transistors arranged on the second and third layers of the memory cell are arranged on the second and third layers of the peripheral circuit.

Of course, the transistors to be arranged on the second and third layers of the peripheral circuit may have the different type from the transistors to be arranged on the second and third layers of the memory cell array. But, this makes the manufacturing process complicated.

The layout area size of the peripheral circuit as well as the layout area size of the memory cell can be reduced.

In the embodiments described above, stacking the transistors which constitute the inverter, the NAND gate, and the NOR gate are described. But, it is also possible to stack the transistors which constitute different logic circuits such as an AND gate and an OR gate.

The peripheral circuit of the present invention can be arranged such that only transistors which constitute some function blocks such as a row or column decoder other than all function blocks are stacked or only transistors which constitute a driver (which is comprised of an inverter in general) at an output terminal of a row and/or column decoder are stacked.

The above described arrangement method of the inverter, the NAND gate and the NOR gate which constitute the peripheral circuit can be usefully applied to different semiconductor devices.

If the transistors which form the peripheral circuit as well as the transistors which form the memory cell array are stacked the way described above, the layout area size of the peripheral circuit can be reduced, and thus the effect of the layout area size of the semiconductor memory device can be increased.

However, unlike the above described embodiments, the transistors which form the peripheral circuit may be arranged on a single layer even though the transistors of the memory cell array are stacked. In this case, it is possible to arrange high performance transistors even though it is difficult to reduce the layout area size of a region where the peripheral circuit is arranged.

Figure 24A:
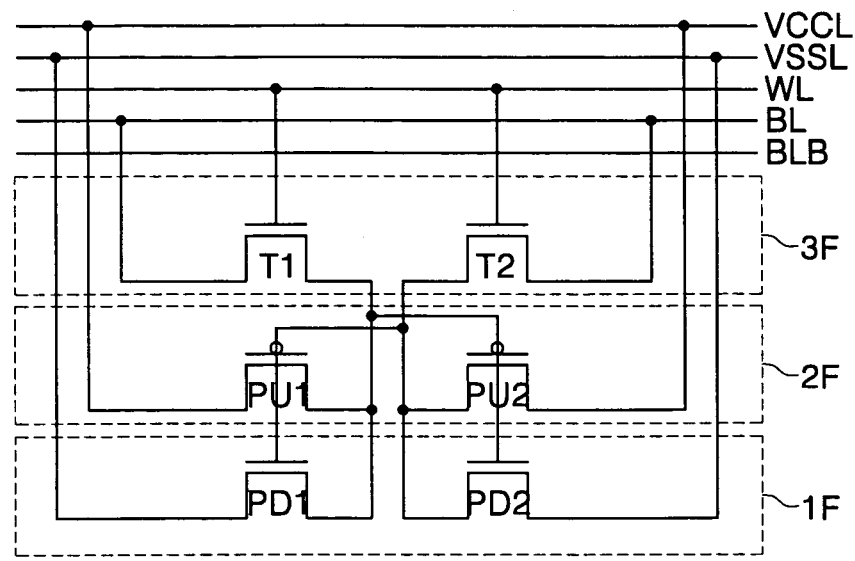
FIGS. 24A and 24B are views respectively illustrating arrangement of transistors of a static memory cell and transistors which constitute an inverter of a peripheral circuit of a semiconductor memory device according to a fourth embodiment of the present invention.
Figure 24B:
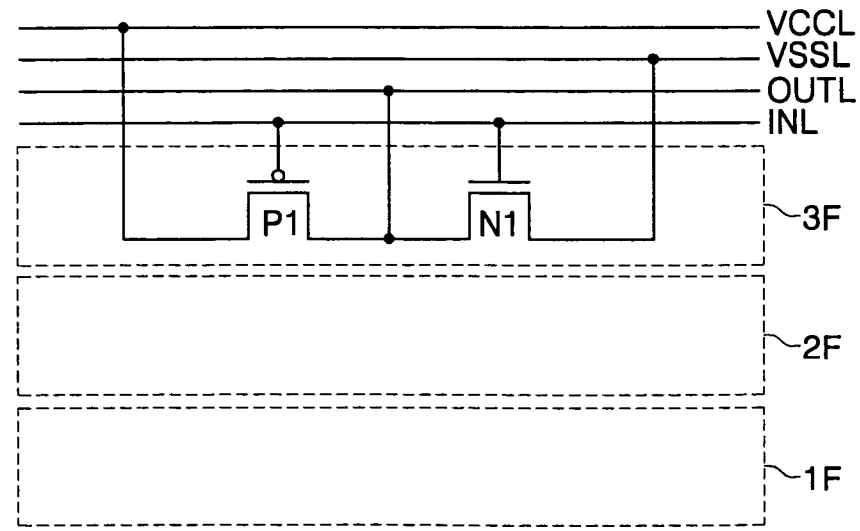

FIGS. 24A and 24B are views respectively illustrating arrangement of transistors of a static memory cell and transistors which constitute an inverter of a peripheral circuit of a semiconductor memory device according to a fourth embodiment of the present invention. The static memory cell is arrange the same way as that of FIG. 8A, and the inverter is arranged such that a PMOS transistor P1 and an NMOS transistor N1 are arranged on the same layer like FIG. 5B but are arranged on the third layer 3F other than 1F. Here, the first and second layers serve as dummy layers and do not have any transistors formed thereon.

A method of forming the transistors of the peripheral circuit is explained below by describing a structure of the inverter of the peripheral circuit of the inventive semiconductor memory device and manufacturing method thereof.

Figure 25:
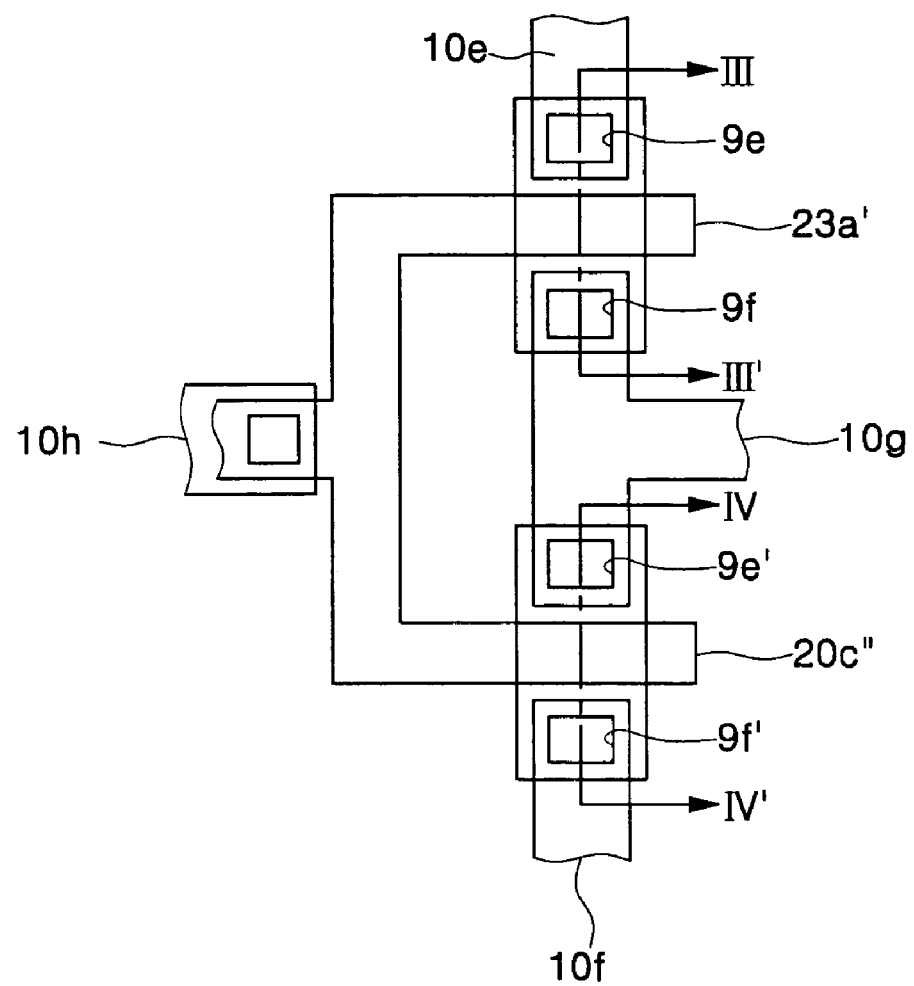
FIG. 25 is a plan view illustrating the inverter of the peripheral circuit of FIG. 24B.

FIG. 25 is a plan view illustrating the inverter of the peripheral circuit of FIG. 24B, and FIGS. 26A and 26B to FIGS. 34A and 34B are cross-sectional views illustrating a method for manufacturing the memory cell and the inverter. In FIGS. 26A and 26B to FIGS. 34A and 34B, references "C" and "P" denote a memory cell array region and a peripheral circuit region, respectively. The cross-sectional views of FIGS. 26A to 34a are taken along lines I-I' of FIG. 10A to FIG. 16A and III-III' of FIG. 25, and the cross-sectional views of FIGS. 26B to 34B are taken along lines II-II' of FIG. 16A and IV-IV' of FIG. 25.

A semiconductor memory substrate 100 includes a cell region C and a peripheral circuit region P. The structure and arrangement of the cell region C can be understood easily with the above description, and thus a structure and arrangement of the peripheral circuit region P is explained below.

Figure 26A:
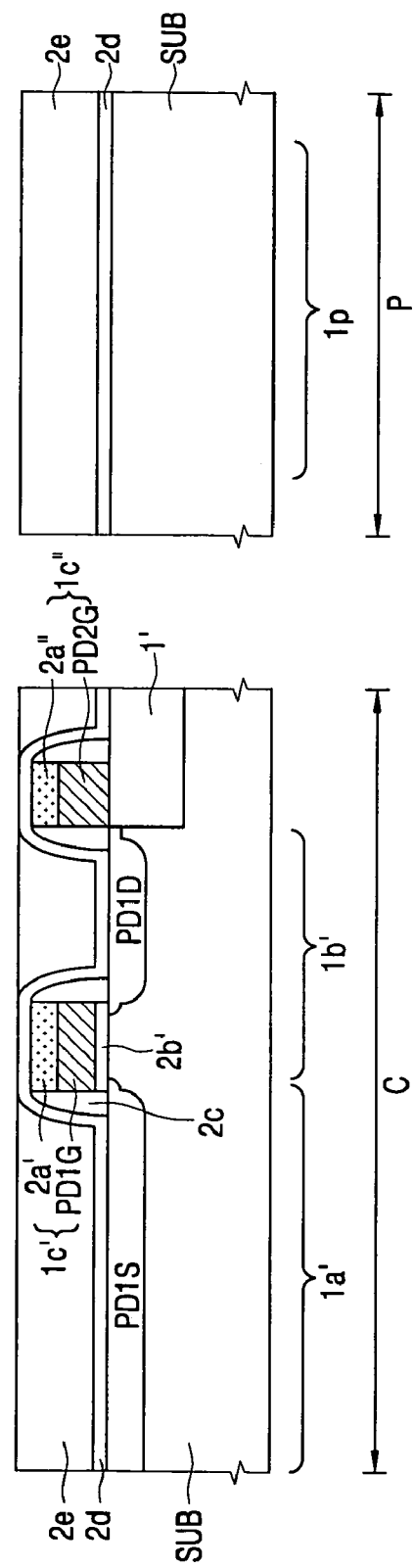
Figure 26B:
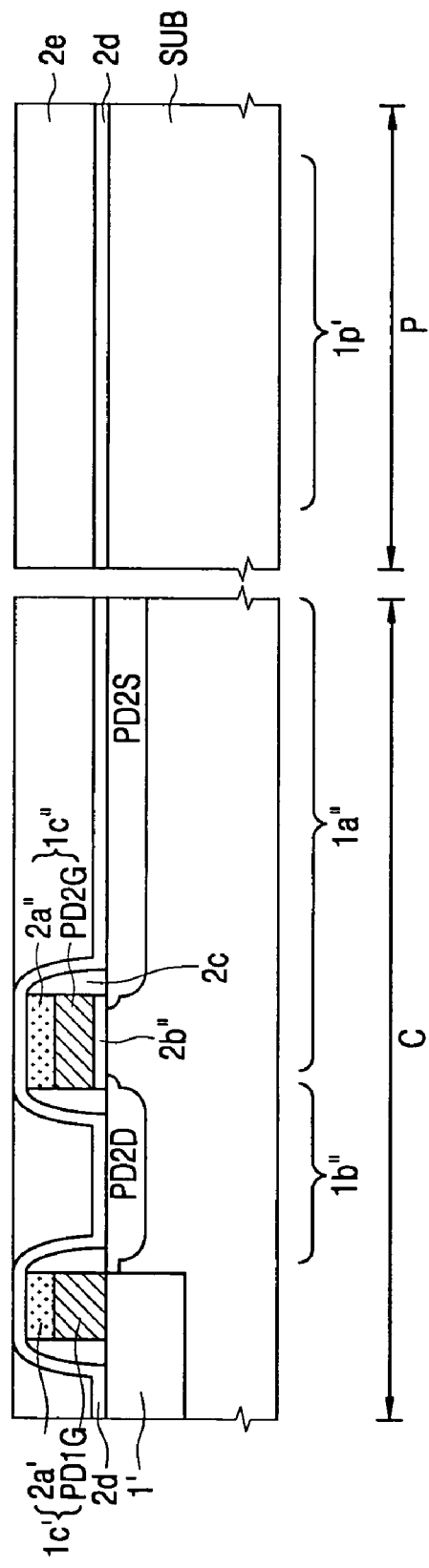

Referring to FIG. 25 and FIGS. 26A and 26B, when an interlayer insulator 2e is arranged above the cell region C, the interlayer insulator 2e is arranged above a portion of the semiconductor substrate SUB corresponding to the peripheral circuit region P. When an etching stopper layer 2d is arranged above the cell region C, the etching stopper layer 2d may be arranged above the peripheral circuit region P. The etching stopper layer 2d preferably has etching selectivity to the interlayer insulator 2e. For example, in case where the interlayer insulator 2e is formed of a silicon oxide layer, the etching stopper layer 2d may be formed of a silicon nitride layer or a silicon oxynitride layer.

Figure 27A:
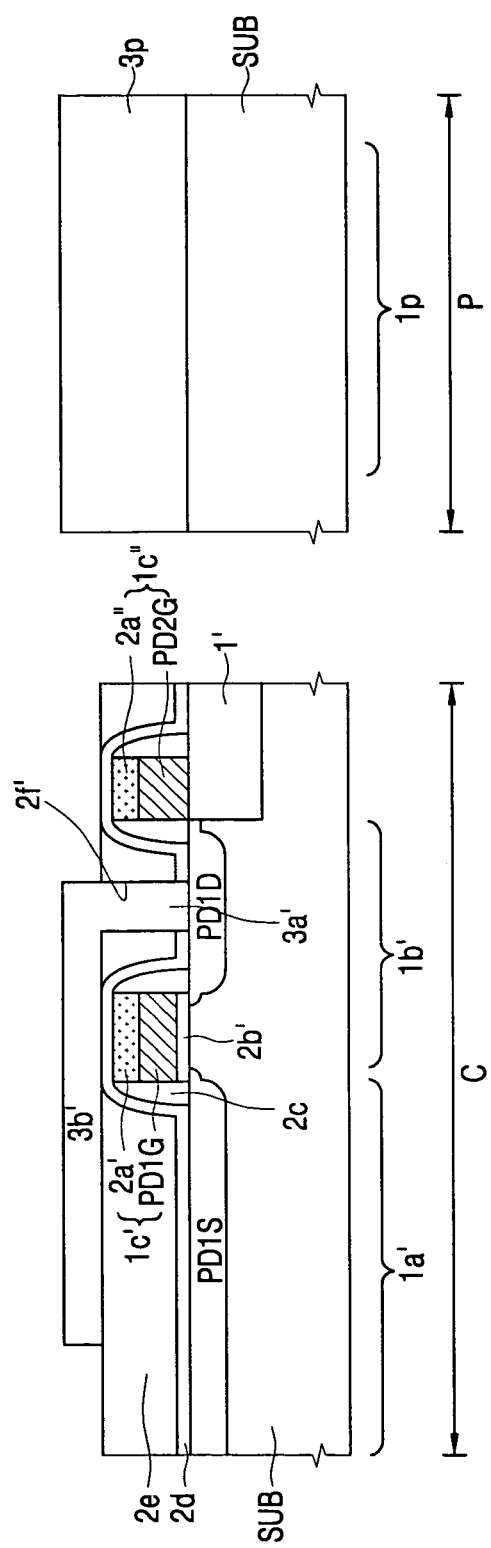
Figure 27B:
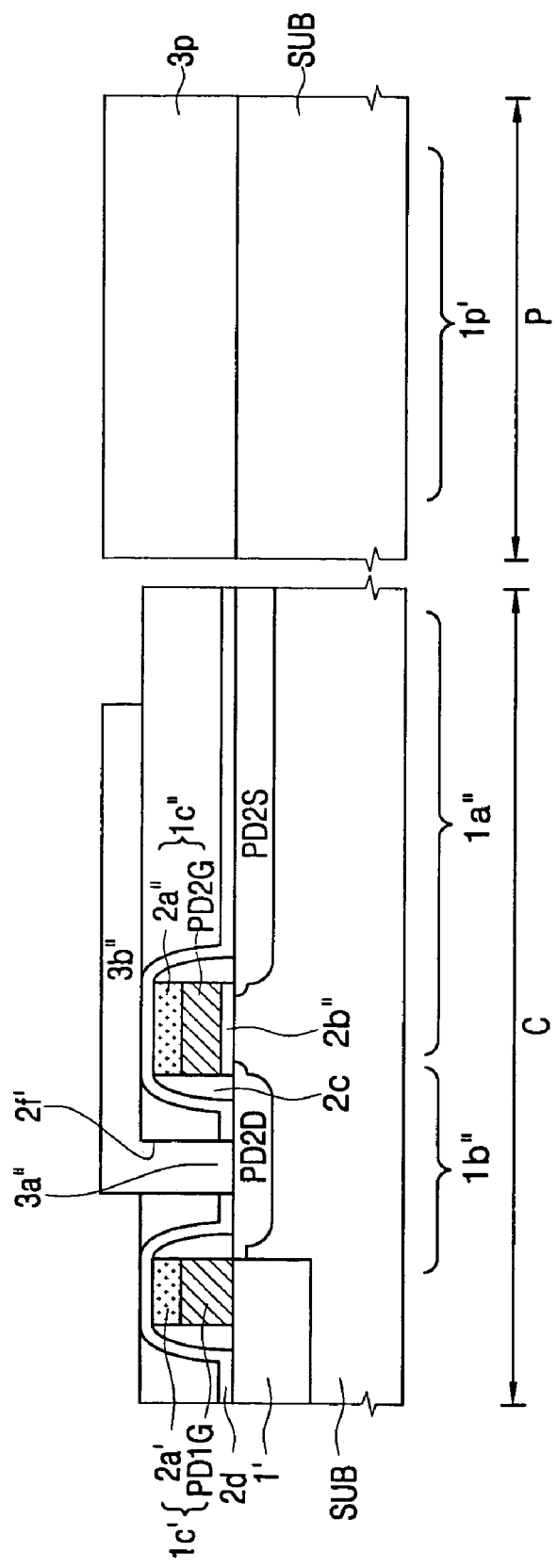

Referring to FIG. 25 and FIGS. 27A and 27B, when lower body patterns 3b' and 3b" are arranged above the cell region C, the etching stopper layer 2d and the interlayer insulator 2e arranged above the peripheral circuit region P are removed, and a peripheral lower body pattern 3p is arranged to cover the semiconductor substrate SUB above the peripheral circuit region P. In this case, the etching stopper layer 2d and the interlayer insulator 2e which remain in the cell region C may be respectively regarded as the etching stopper layer pattern and the interlayer insulator pattern. The peripheral lower body pattern 3p may be arranged such that its surface is located on the same imaginary horizontal line as surfaces of the lower body patterns 3b' and 3b" above the cell region C. The peripheral lower body pattern 3p may have a single crystal semiconductor structure. For example, in case where the semiconductor substrate SUB has a single crystal silicon structure, the peripheral lower body pattern 3p may have a single crystal silicon structure.

Figure 28A:
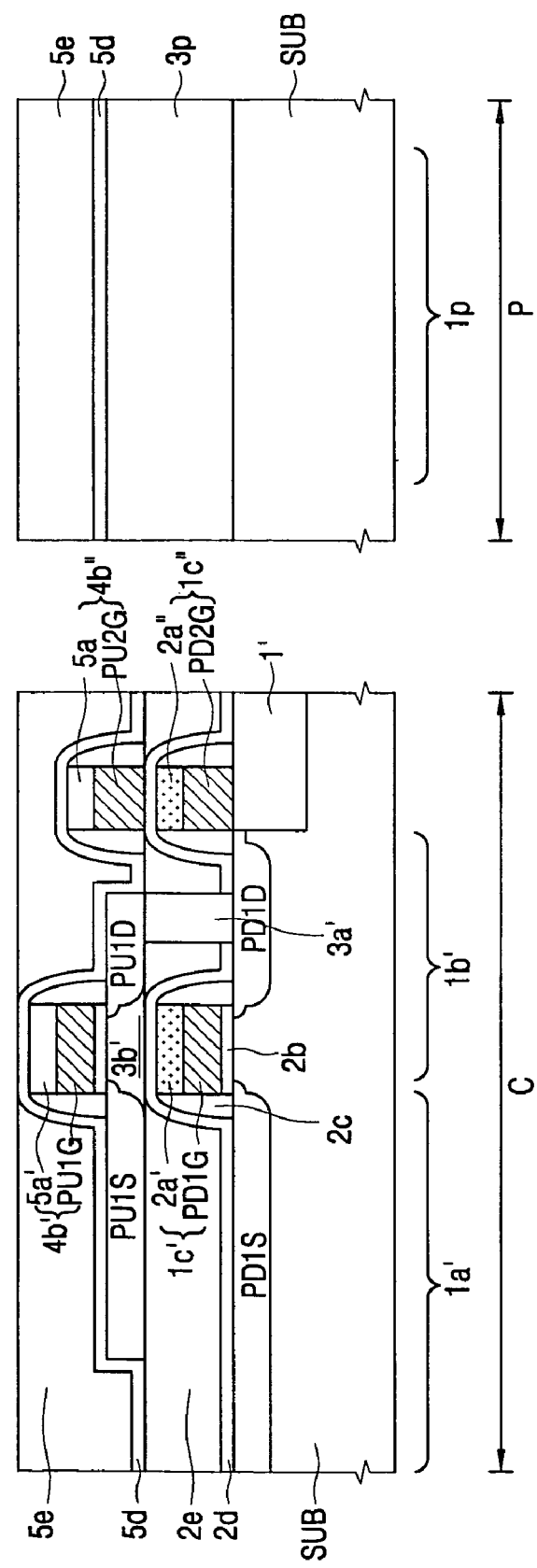
Figure 28B:
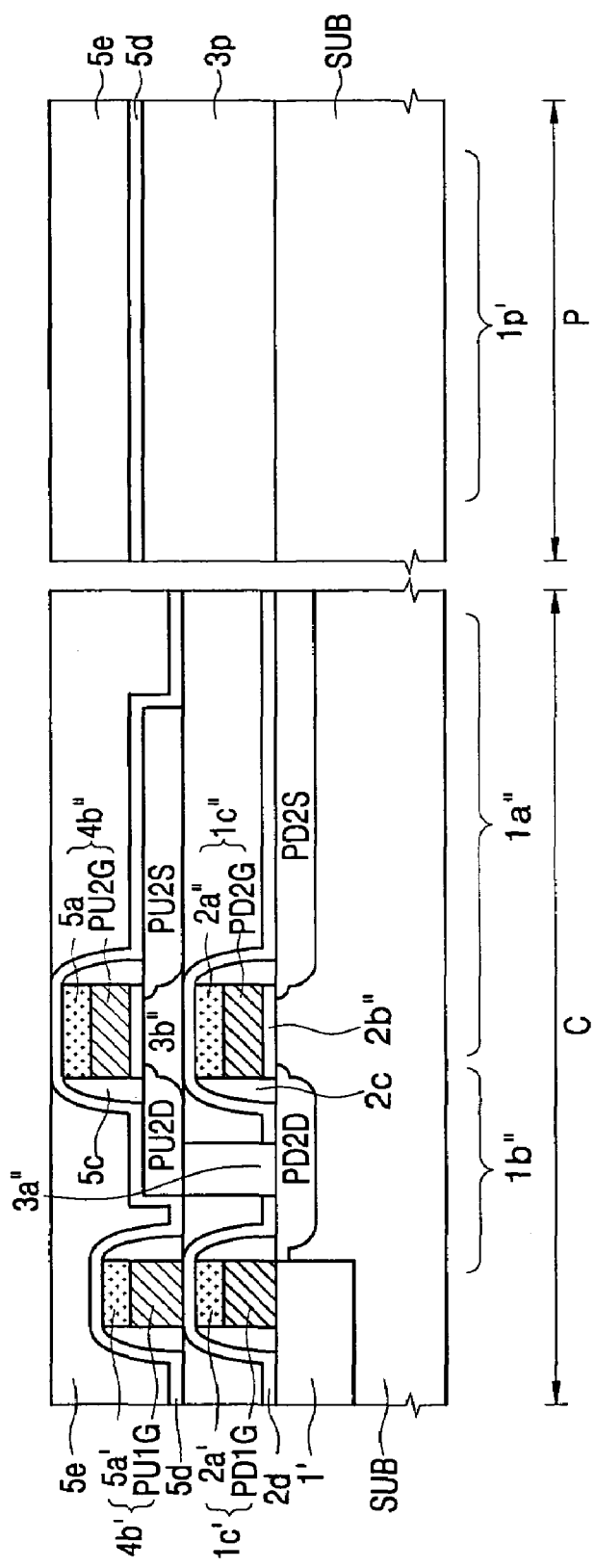

Referring to FIG. 25 and FIGS. 28A and 28B, when an etching stopper 5d and an interlayer insulator 5e which cover first and second load transistors TL1 and TL2 are arranged above the cell region C, the etching stopper 5d and the interlayer insulator 5e are arranged above the peripheral circuit region P. The etching stopper layer 5d preferably has etching selectivity to the interlayer insulator 5e. For example, in case where the interlayer insulator 5e is formed of a silicon oxide layer, the etching stopper layer 5d may be formed of a silicon nitride layer or a silicon oxynitride layer.

Figure 29A:
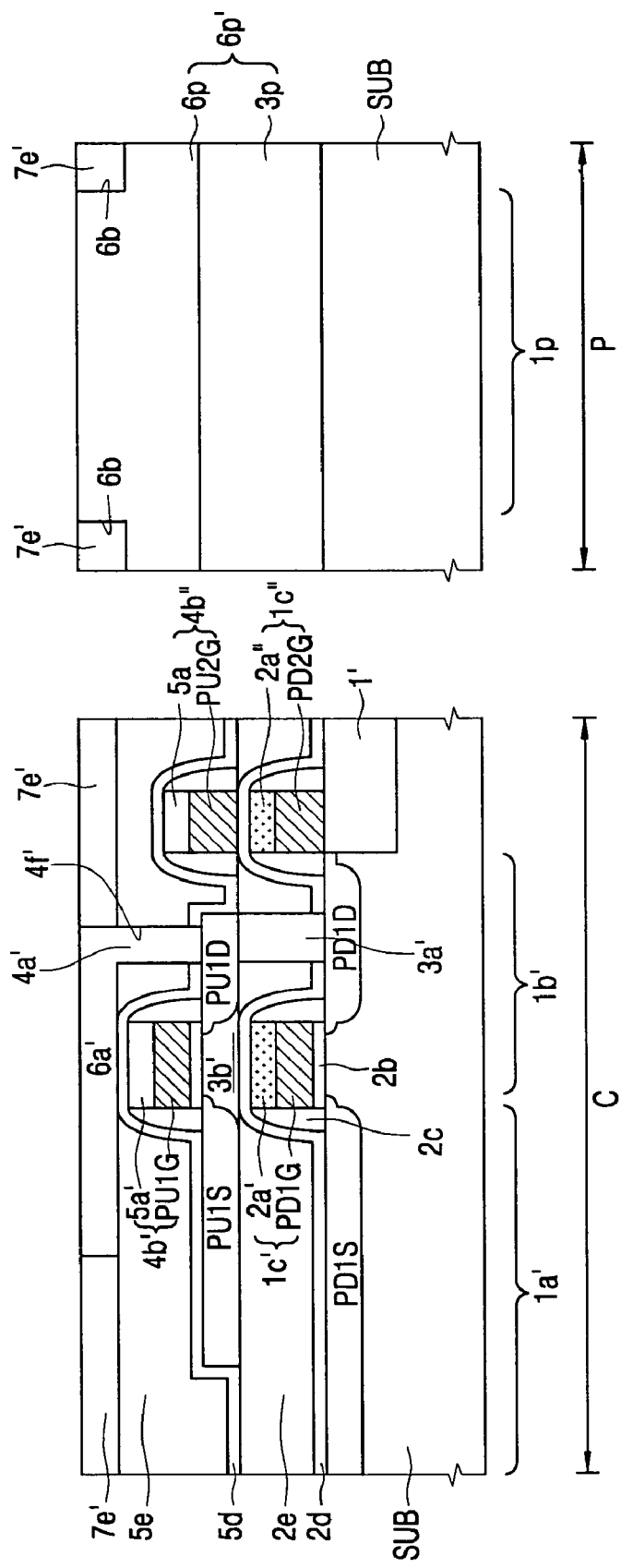
Figure 29B:
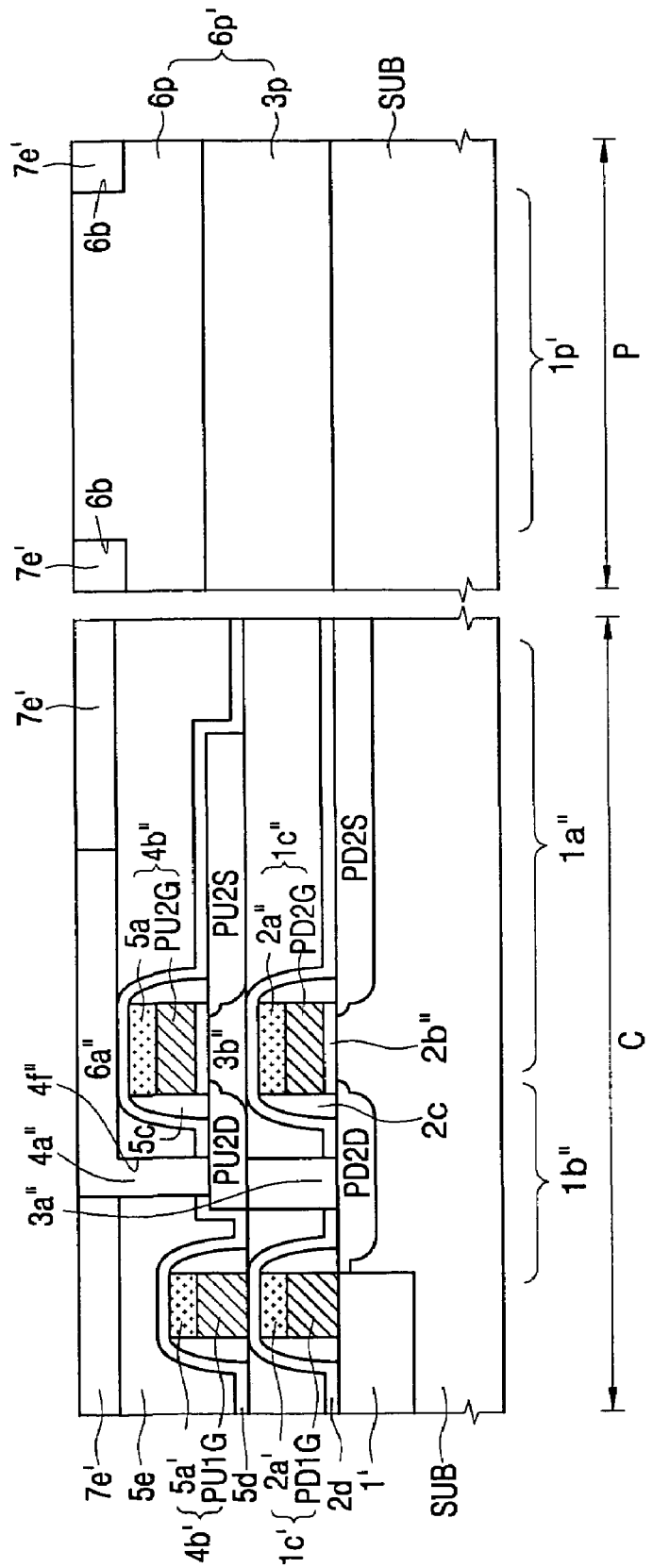

Referring to FIG. 25 and FIGS. 29A and 29B, upper body patterns 6a' and 6a" are arranged above the cell region C, the etching stopper layer 5d and the interlayer insulator 5e arranged above the peripheral circuit region P are removed, and a peripheral upper body pattern 6p covering the peripheral lower body pattern 3p is arranged above the peripheral circuit region P. The peripheral upper body pattern 6p may be arranged such that its surface is located on the same imaginary horizontal line as surfaces of the upper body patterns 6b' and 6b" above the cell region C. The peripheral upper body pattern 6p may have a single crystal semiconductor structure which is the same crystal structure as the peripheral lower body pattern 3p. For example, in case where the peripheral lower body pattern 3p has a single crystal silicon structure, the peripheral upper body pattern 6p may have a single crystal semiconductor structure such as a single crystal silicon structure. The peripheral upper and lower body patterns 6p and 3p form a peripheral body pattern 6p'.

The peripheral upper and lower body patterns 6p and 3p may have a single crystal semiconductor structure such as a single crystal silicon structure formed by a single process. An element isolating insulator 7e' is arranged on the peripheral upper body pattern 6p above the peripheral circuit region P.

Figure 30A:
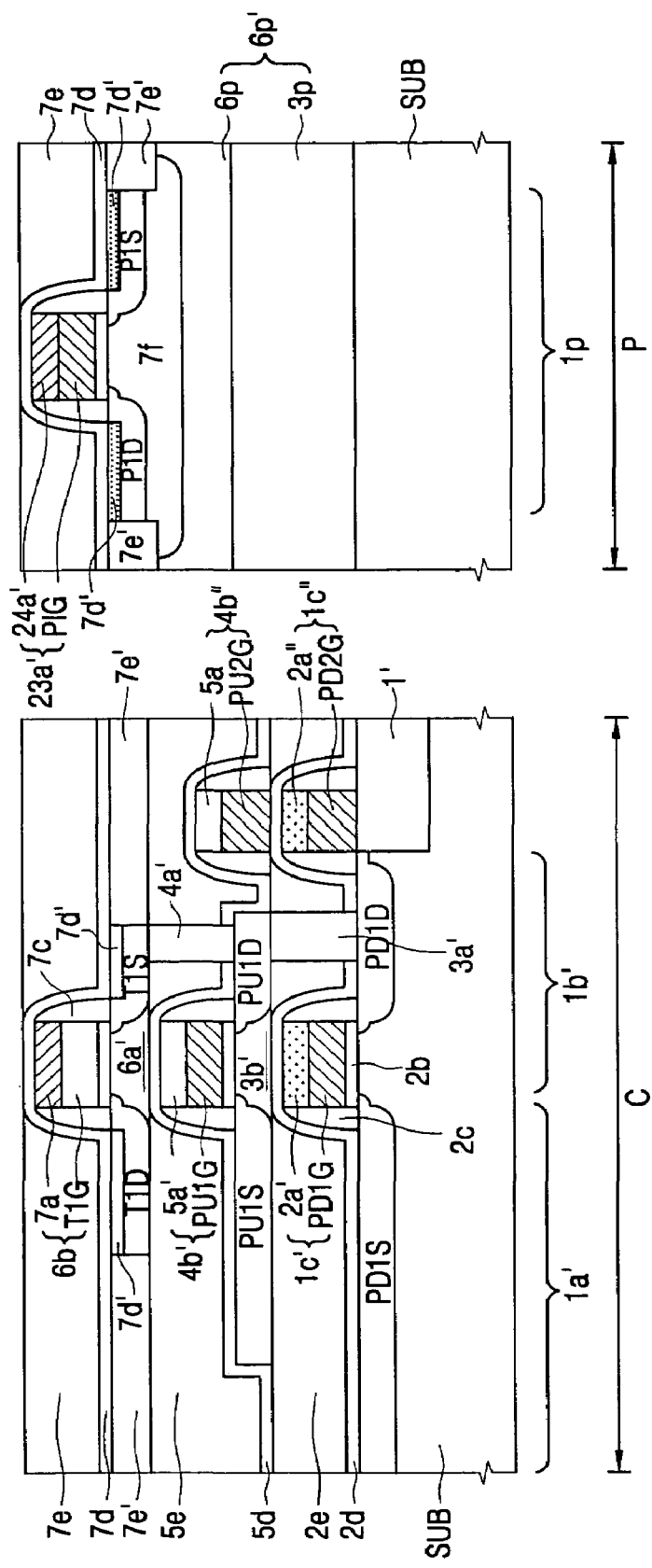
Figure 30B:
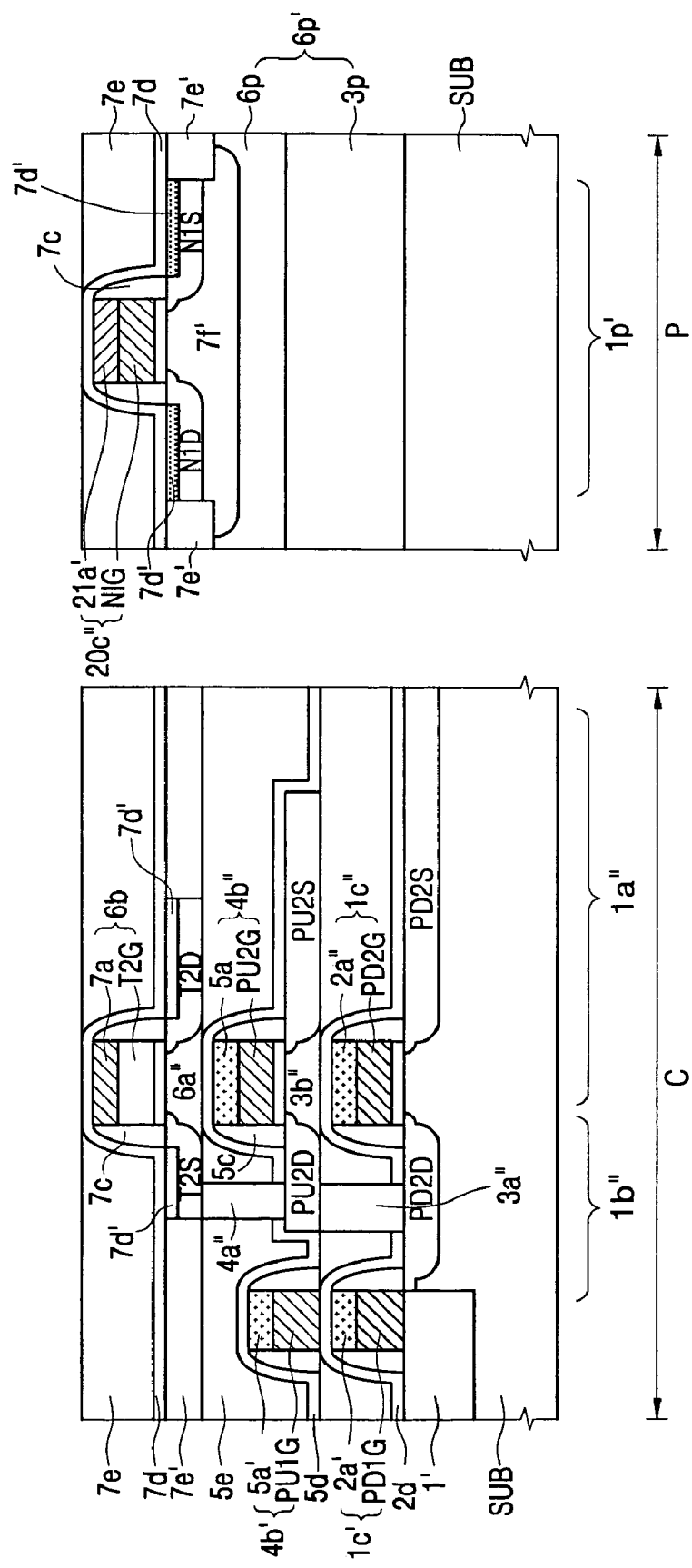

Referring to FIG. 25 and FIGS. 30A and 30B, when a word line pattern 6b of NMOS transistors T1 and T2 is arranged above the cell region C, a gate pattern 23a' of a PMOS transistor P1 which crosses a first peripheral active area 1p of the peripheral circuit region P is arranged. The gate pattern 23a' of the PMOS transistor P1 may include a poly silicon layer pattern P1G and a PMOS gate metal silicide layer 24a' which are sequentially stacked. A gate pattern 20c" of an NMOS transistor N1 which crosses a second peripheral active area 1p' is arranged. The gate pattern 20c" of the NMOS transistor N1 may include a poly silicon layer pattern N1G and an NMOS gate metal silicide layer 21a' which are sequentially stacked. The gate metal silicide layers 21a' and 24a' may be formed of a nickel silicide layer, a cobalt silicide layer, a titanium silicide layer or a tungsten silicide layer. The NMOS transistors T1 and T2 above the cell region C may also include a metal silicide layer 7d'. On surfaces of the first peripheral active area 1p located on both sides of the PMOS gate pattern 23a', a drain region P1D and a source region P1S of the PMOS transistor P1 are arranged. The PMOS gate pattern 23a' forms the PMOS transistor P1 together with the source and drain regions P1S and P1D. Similarly, on surfaces of the second peripheral active area 1p' located on both sides of the NMOS gate pattern 20c", a drain region N1D and a source region N1S of the NMOS transistor NP1 are arranged. The NMOS gate pattern 20c" forms the NMOS transistor N1 together with the source and drain regions N1S and N1D. On surfaces of the source and drain regions P1S and P1D of the PMOS transistor P1 and surfaces of the source and drain regions N1S and N1D of the NMOS transistor N1, metal silicide layers 7d' are respectively arranged. The metal silicide layers 7d' may be formed of a nickel silicide layer, a cobalt silicide layer, a titanium silicide layer or a tungsten silicide layer. An interlayer insulator 7e is arranged on the whole surface of the semiconductor substrate having the NMOS transistor N1 and the PMOS transistor P1. In addition, an etching stopper layer 7d may be interposed between the semiconductor substrate SUB and the interlayer insulator 7e. The etching stopper layer 7d preferably has etching selectivity to the interlayer insulator 7e. For example, in case where the interlayer insulator 7e is formed of a silicon oxide layer, the etching stopper layer 7d may be formed of a silicon nitride layer or a silicon oxynitride layer.

Figure 31B:
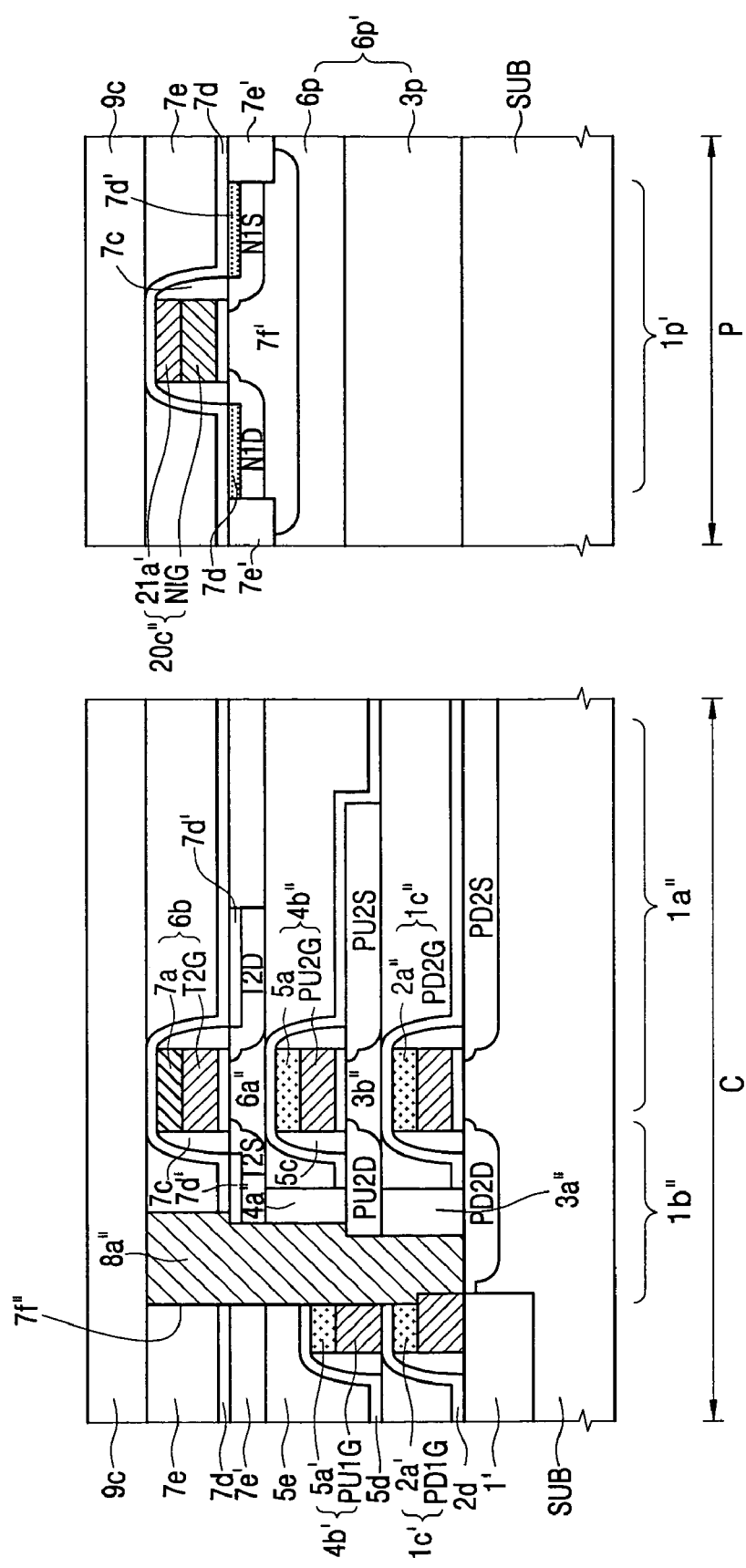

Referring to FIG. 25 and FIGS. 31A and 31B, an interlayer insulator 9c is arranged on the interlayer insulator 7e above the peripheral circuit region P like the cell region C.

Figure 32A:
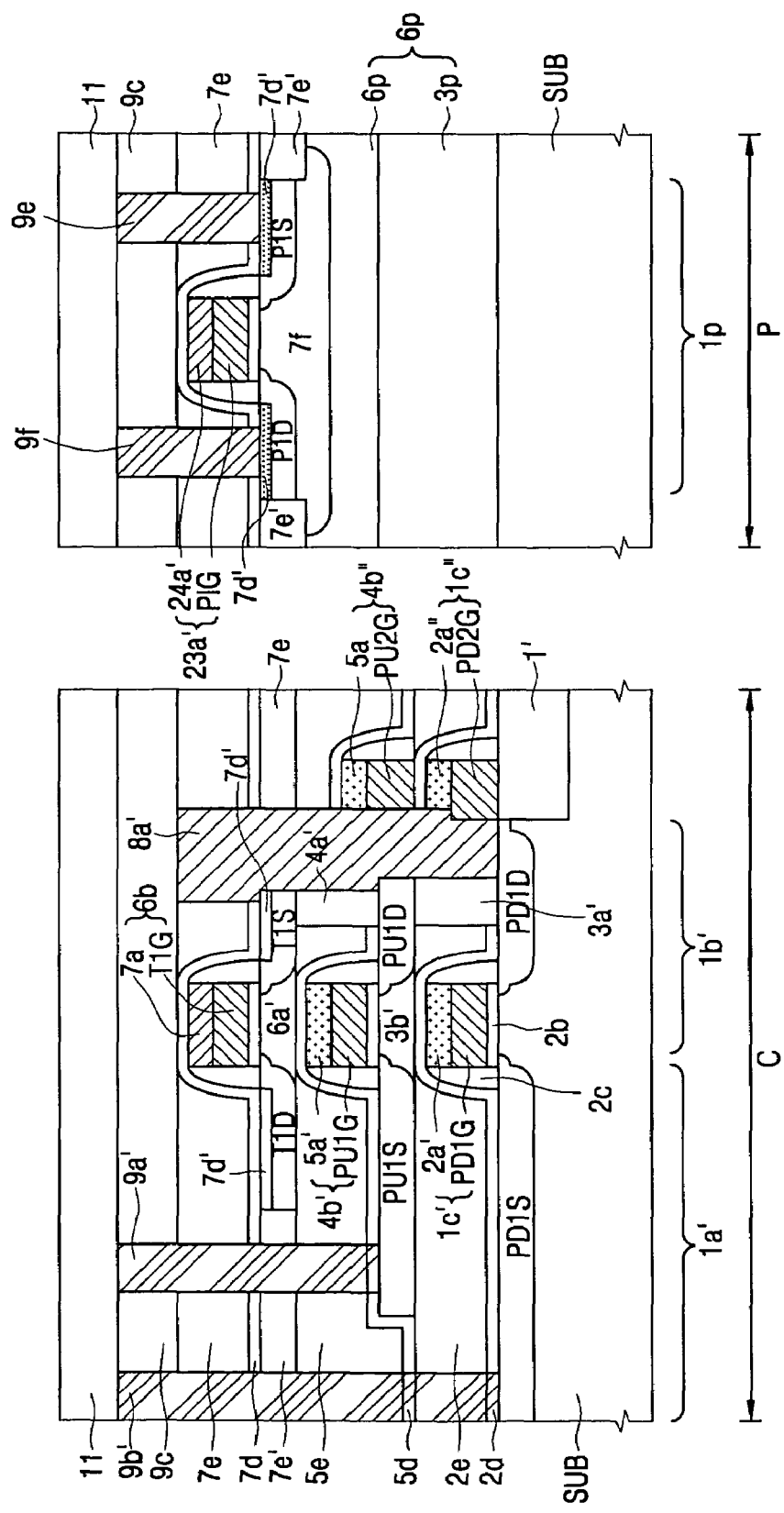
Figure 32B:
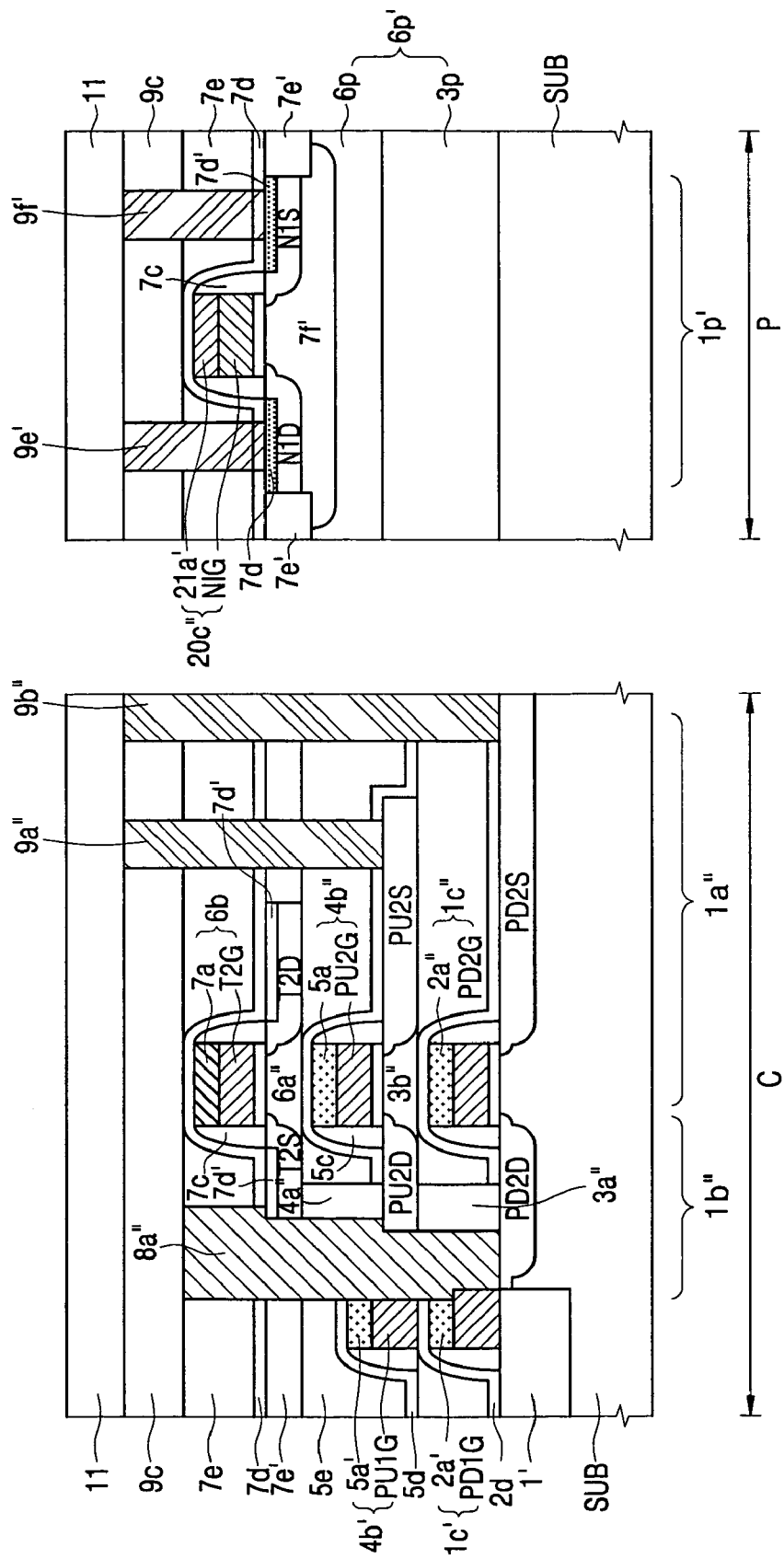

Referring to FIG. 25 and FIGS. 32A and 32B, a peripheral power line contact plug 9e, a peripheral ground line contact plug 9f, and output signal line contact plugs 9f and 9e' may be arranged in the interlayer insulator 9c above the peripheral circuit region P.

An interlayer insulator 11 which covers the peripheral power line contact plug 9e, the peripheral ground line contact plug 9f, and the output signal line contact plugs 9f and 9e' is arranged.

Figure 33A:
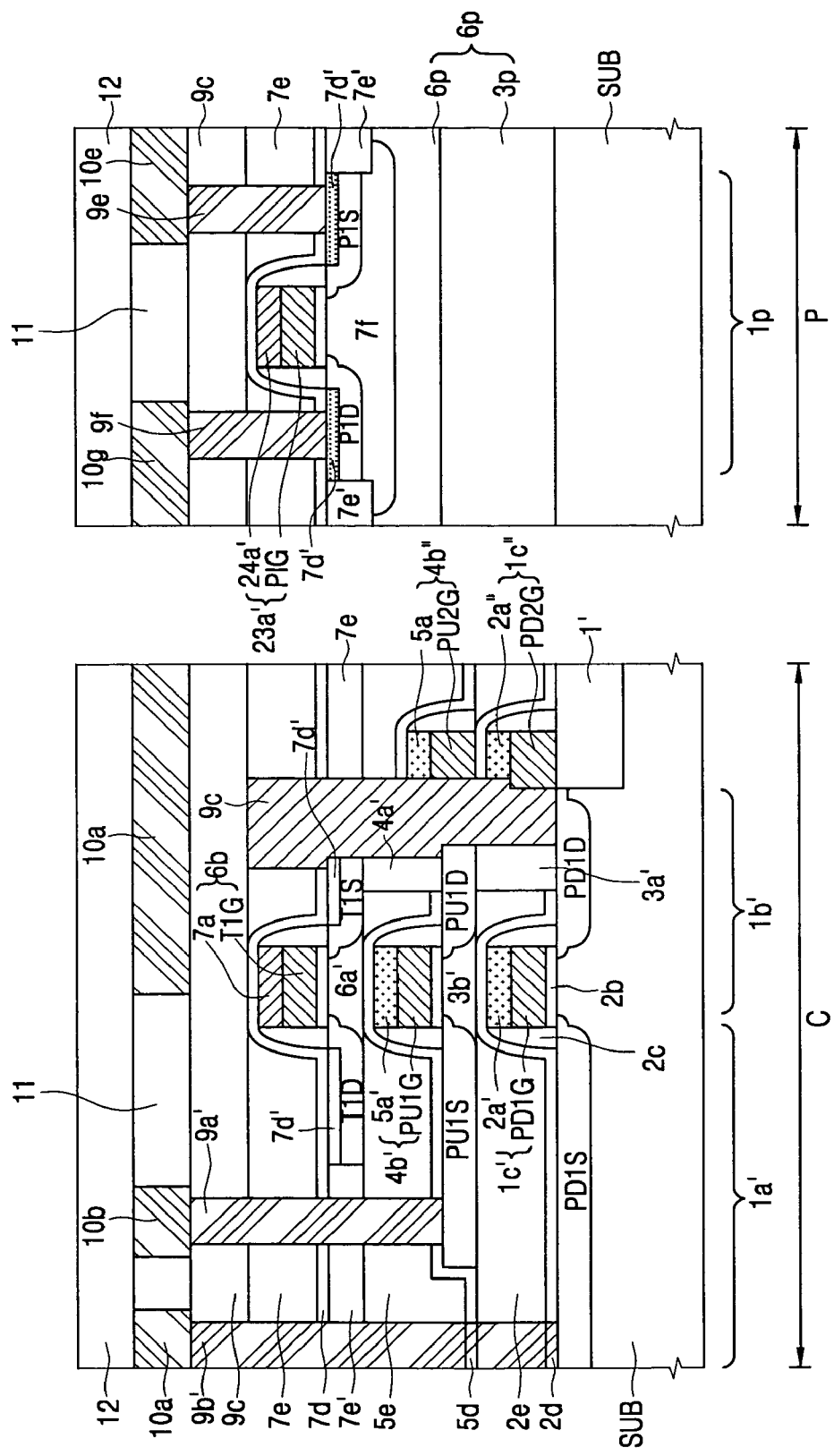
Figure 34A:
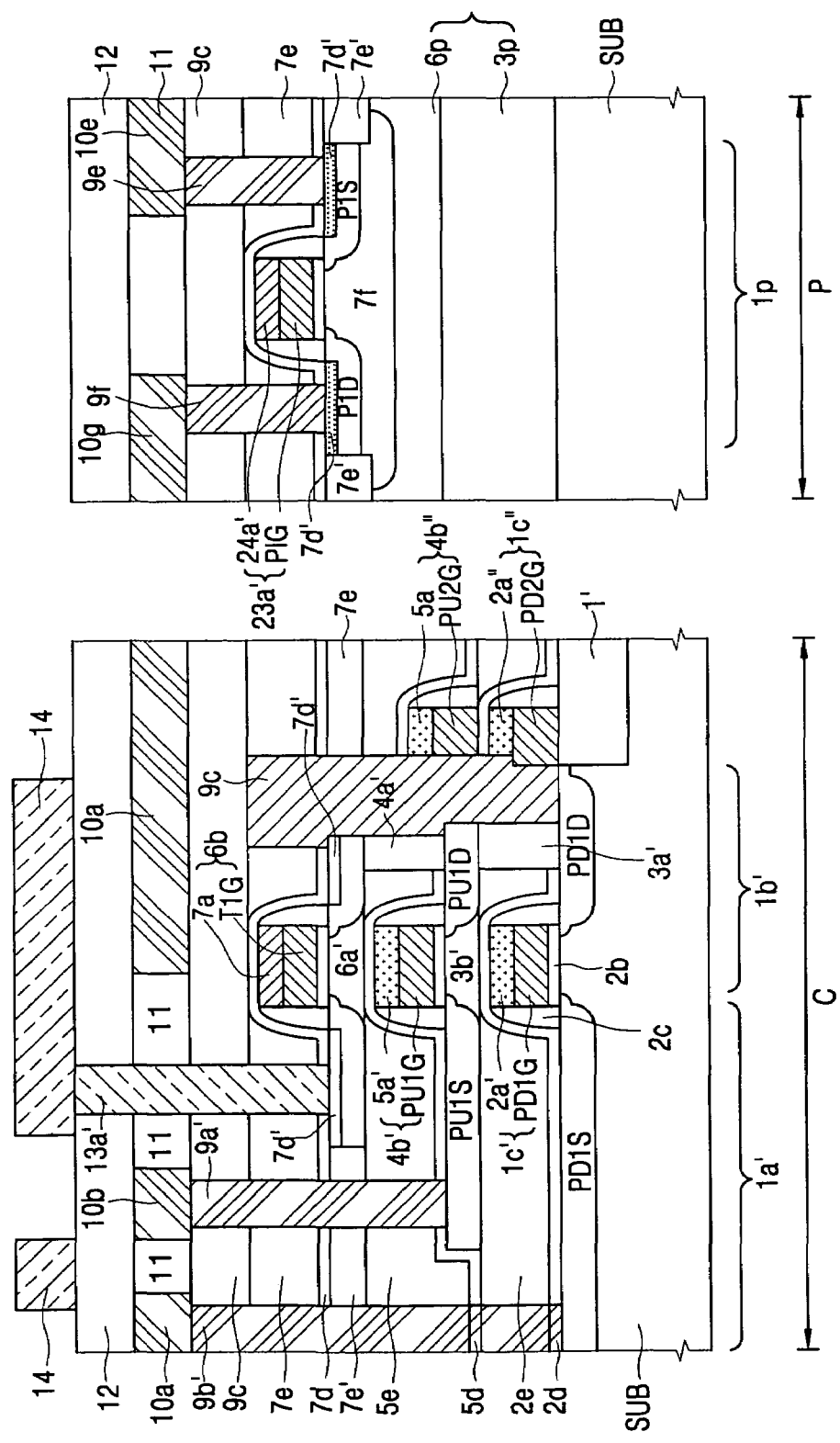
Figure 34B:
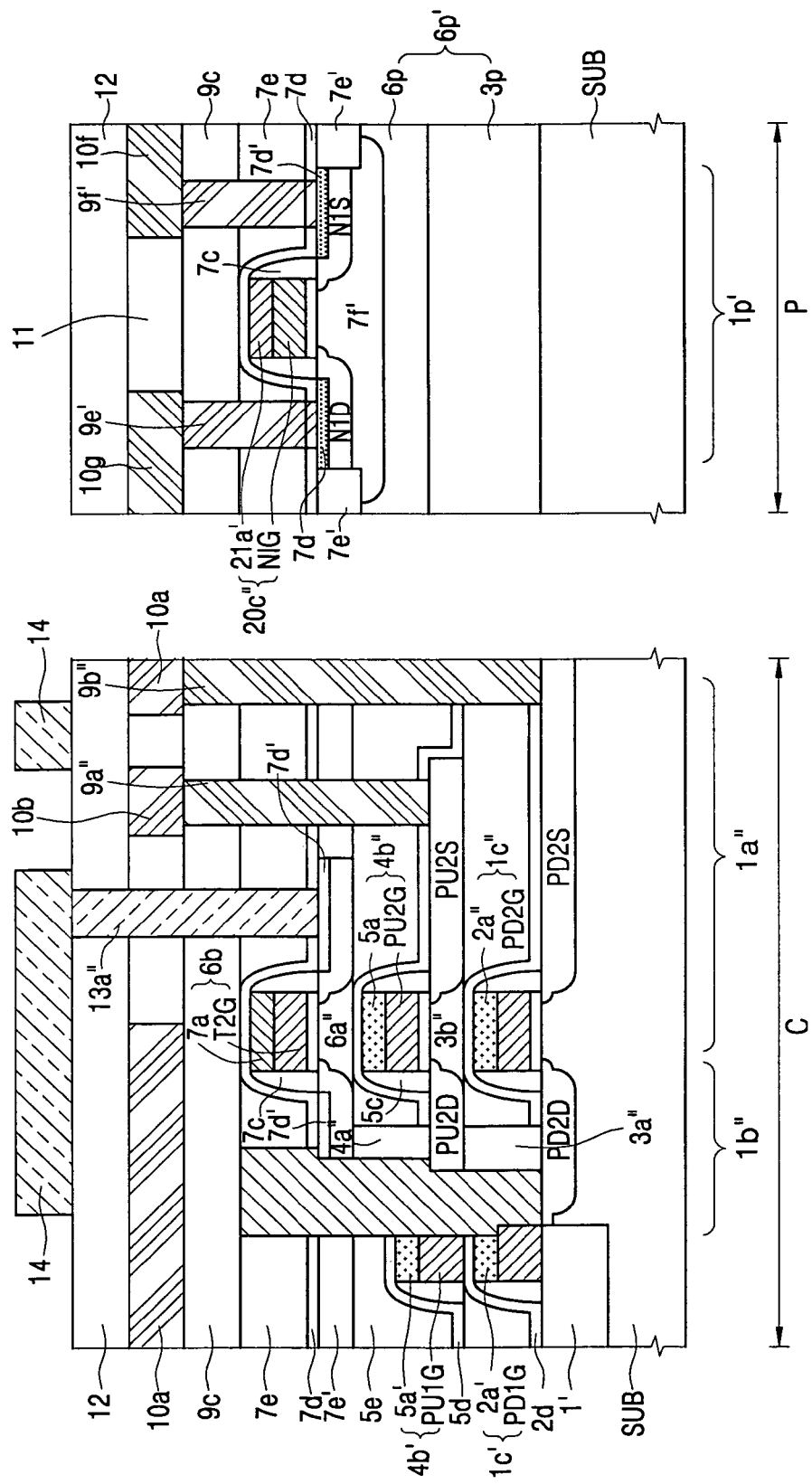

Referring to FIG. 25 and FIGS. 33A and 33B, in the interlayer insulator 11 above the peripheral circuit region P, a peripheral power line 10e is arranged to cover the peripheral power line contact plug 9e, a peripheral ground line 10f is arranged to cover the peripheral ground line contact plug 9f, and an output signal line 10g is arranged to cover the output signal line contact plugs 9f and 9e'.

An interlayer insulator 12 is arranged to cover the peripheral power line 10e, the peripheral ground line 10f, and the output signal line 10g.

In the above described way, the transistors P1 and N1 which form the inverter are arranged on the third layer of the peripheral circuit region P. Of course, transistors which form an NAND gate and a NOR gate may be also arranged on the third layer of the peripheral circuit region P.

A method for manufacturing an SRAM according to the present invention is explained below with reference to FIG. 16, FIG. 25, and FIGS. 26A and 26B to FIGS. 34A and 34B.

Referring to FIG. 16A, FIG. 25, and FIGS. 26A and 26B, a semiconductor substrate SUB having a cell region C and a peripheral circuit region P is prepared. The semiconductor substrate SUB may be a single crystal silicon substrate. The semiconductor substrate SUB may be a p-type silicon substrate. An element isolating layer 1' is formed on a predetermined region of the semiconductor substrate SUB to define first and second cell active areas 1b' and 1b". The element isolating layer 1' is preferably formed in the cell region C. The first and second active areas 1b' and 1b" are formed parallel to a y axis. In addition, the element isolating layer 1' is formed to provide a first ground active area 1a' which extends along an x axis from one end of the first active area 1b' and a fourth active area 1a" which extends along an x axis from one end of the second active area 1b". The second and fourth active areas 1a' and 1a" are formed to face each other.

Gate insulating layers 2b' and 2b" are formed on the first to fourth active areas 1a', 1b', 1a", and 1b". A gate conductive layer and a capping insulating layer are sequentially formed on the whole surface of the semiconductor substrate SUB having the gate insulating layers 2b' and 2b". The gate conductive layer may be formed of a silicon layer, and the capping insulating layer may be formed of a silicon oxide layer or a silicon nitride layer. The gate capping insulating layer and the gate conductive layer are patterned to form a gate pattern 1c' which crosses the first active area 1b' and a gate pattern 1c" which crosses the third active area 1b". As a result, the gate pattern 1c' is formed to have a gate electrode PD1G and a capping insulating layer 2a' which are sequentially stacked, and a gate pattern 1c" is formed to have a gate electrode PD2G and a capping insulating layer 2a" which are sequentially stacked. A process for forming the capping insulating layer may be omitted. In this case, the gate pattern 1c' has only the gate electrode, and the gate pattern 1c" has only the gate electrode.

Impurity ions are doped into the first to fourth active areas 1a', 1b', 1b", and 1a" by using the gate patterns 1c' and 1c" as an ion doping mask. As a result, a source region PD1S and a drain region PD1D which are separated from each other are formed in the first active area 1b', and a source region PD2S and a drain region PD2D which are separated from each other are formed in the third active area 1b". The source regions PD1S and PD2S and the drain regions PD1D and PD2D may be n-type ion-doped regions. The source region PD1S and the drain region PD1D are formed on both sides of a channel area below the driving gate pattern 1c', and the source region PD2S and the drain region PD2D are formed on both sides of a channel area below the driving gate pattern 1c". The source region PD2S is also formed in the second active area 1a', and the source region PD2S is also formed in the fourth active area 1a". The source regions PD1S and PD2S and the drain regions PD1D and PD2D may be formed to have a lightly doped drain (LDD) type structure. Gate spacers 2c are formed on sidewalls of the gate patterns 1c' and 1c". The gate spacers 2c may be formed of a silicon nitride layer or a silicon oxide layer.

The first driving gate pattern 1c', the source region PD1S and the drain region PD1D form the first bulk transistor, i.e., the first NMOS transistor PD1, and the second driving gate pattern 1c", the source region PD2S and the drain region PD2D form the second bulk transistor, i.e., the second NMOS transistor PD2.

An etching stopper layer 2d and an interlayer insulator 2e are sequentially formed on the whole surface of the semiconductor substrate SUB having the first and second transistors PD1 and PD2. The interlayer insulator 2e is preferably planarized by using a chemical mechanical polishing technique. In this case, the etching stopper layer 2d on the gate patterns 1c' and 1c" may serve as a chemical mechanical polishing stopper.

Referring to FIG. 16A, FIG. 25 and FIGS. 27A and 27B, the interlayer insulator 2e and the etching stopper layer 2d are patterned to expose predetermined regions of the drain regions PD1D and PD2D of the cell region C and expose the semiconductor substrate of the peripheral circuit region P. As a result, the lower node contact holes 2f' and 2f" which sequentially penetrate the interlayer insulator layer 2e and the etching stopper layer 2d to expose the predetermined regions of the drain regions PD1D and PD2D of the cell region C may be formed in the cell region C. In this case, the interlayer insulator layer 2e and the etching stopper layer 2d may be respectively regarded as the interlayer insulator layer pattern and the etching stopper layer pattern. A semiconductor layer 3p is formed to cover the interlayer insulator 2e and the semiconductor substrate SUB of the peripheral circuit region P while filling the lower node contact holes 2f' and 2f". The semiconductor layer 3p may be formed of a single crystal semiconductor structure. The single crystal semiconductor structure may be formed by an epitaxial technique. In more detail, a single crystal semiconductor structure, i.e., an epitaxial layer which covers the interlayer insulator 2e and the semiconductor substrate SUB above the peripheral circuit region P while filling the lower node contact holes 2f' and 2f" is formed. The epitaxial technique may be a selective epitaxial growth technique. The epitaxial layer may be formed by a selective epitaxial growth technique which uses as a seed layer a predetermined region of the semiconductor substrate SUB exposed by the lower node contact holes 2f' and 2f" and the semiconductor substrate SUB of the peripheral circuit region P. In case where the semiconductor substrate SUB is a single crystal silicon substrate, the epitaxial layer may be formed to have a single crystal silicon structure. That is, the epitaxial layer may be formed of a single crystal semiconductor structure. Then, an upper surface of the epitaxial layer may be planarized by using a planarization technique such as a chemical mechanical polishing (CMP) technique.

Meanwhile, a semiconductor layer which fills the lower node contact holes 2f' and 2f" and covers the interlayer insulator 2e and the semiconductor substrate SUB of the peripheral circuit region P may be formed of a non-single crystal semiconductor layer. For example, the semiconductor layer may be formed of an amorphous silicon layer or a poly silicon layer. The semiconductor layer may be planarized. In this case, before or after planarizing the semiconductor layer, the semiconductor layer may be crystallized using an epitaxial technique, i.e., solid phase epitaxial technique which employs as a seed layer the semiconductor substrate which contacts the semiconductor layer. As a result, the semiconductor layer can be formed as a single crystal semiconductor structure.

The single crystal semiconductor structure is patterned to form lower body patterns 3b' and 3b" above the cell region while forming a peripheral lower body pattern 3p which covers the semiconductor substrate SUB of the peripheral circuit region P. The lower body patterns 3b' and 3b" are preferably formed to overlap the first and third active areas 1b' and 1b", respectively. The lower body patterns 3b' and 3b" are formed to cover the lower node contact holes 2f' and 2f", respectively.

Preferably, the lower body pattern 3b' has an extension portion which overlaps a portion of the second active area 1a'. Similarly, it is preferred that the cell lower body pattern 3b" has an extension portion which overlaps a portion of the fourth active area 1a".

Meanwhile, a single crystal semiconductor layer is formed to fill the lower node contact holes 2f' and 2f" and cover the interlayer insulator 2e and the semiconductor substrate SUB of the peripheral circuit region P. The single crystal semiconductor is subjected to the chemical mechanical polishing process to form the lower node contact plugs 3a' and 3a" in the lower node contact holes 2f' and 2f" and form a peripheral single crystal semiconductor layer which covers the semiconductor substrate SUB of the peripheral circuit region P. The single crystal semiconductor layer may be formed by an epitaxial technology. Subsequently, a semiconductor layer, i.e., a lower body layer is formed on the whole surface of the semiconductor substrate SUB having the lower node contact plugs 3a' and 3a". In case where the lower node semiconductor plugs 3a' and 3a" are single crystal silicon plugs, the lower body layer may be formed of a non-single crystal semiconductor layer, i.e., an amorphous silicon layer or a polysilicon layer. The lower body layer may be crystallized using a solid phase epitaxial (SPE) technique which is well known to a person having ordinary skill in the art. For example, the solid phase epitaxial technique may include a process for heat-treating and crystallizing the lower body patterns 3b' and 3b" at a temperature of about 500° C. to about 800° C.

Meanwhile, the single crystal semiconductor structure is patterned to form the lower body patterns 3b' and 3b" while removing the single crystal semiconductor structure of the peripheral circuit region P to expose the semiconductor substrate SUB of the peripheral circuit region P.

Referring to FIG. 16A, FIG. 25, and FIGS. 28A and 28B, a gate insulating layer is formed on surfaces of the lower body patterns 3b' and 3b". Load gate patterns 4b' and 4b" are formed to cross over the lower body patterns 3b' and 3b". The gate patterns 4b' and 4b" are preferably formed to overlap the gate patterns 1c' and 1c", respectively. The gate patterns 4b' and 4b" may be formed the same way as the driving gate patterns 1c' and 1c". Thus, the gate pattern 4b' may be formed to have a gate electrode PU1G and a capping insulating layer 5a' which are sequentially stacked, and the gate pattern 4b" may be formed to have a gate electrode PU2G and a capping insulating layer 5a which are sequentially stacked.

Impurity ions are doped into the lower body patterns 3b' and 3b" using the gate patterns 4b' and 4b" as an ion doping make. As a result, source and drain regions PU1S and PU1D which are separated from each other are formed in the lower body pattern 3b', and source and drain regions PU2S and PU2D which are separated from each other are formed in the lower body pattern 3b". The source and drain regions PU1S and PU1D are formed on both sides of a channel area below the gate pattern 4b', and the source and drain regions PU2S and PU2D are formed on both sides of a channel area below the gate pattern 4b". The source regions PU1S and PU2S are formed in the extension portion of the lower body pattern 3b' and in the extension portion of the lower body pattern 3b", respectively. The source region PU1S is formed in the lower body pattern 3b' above the lower node contact plug 3a', and the drain region PU2D is formed in the lower body pattern 3b" above the lower node semiconductor plug 3a". Here, the drain region PU1D may contact the lower node semiconductor plug 3a', and the drain region PU2D may contact the lower node semiconductor plug 3a".

The source regions PU1S and PU2S and the drain regions PU1D and PU2D may be p-type ion-doped regions.

The source region PU1S and PU2S and the drain regions PU1D and PU2D may be formed to have an LDD-type structure.

Spacers 5c may be formed on sidewalls of the load gate patterns 4b' and 4b". The spacers 5c may be formed of a silicon nitride layer or a silicon oxide layer.

The gate pattern 4b', the source region PU1S and the drain region PU1D form a lower thin film transistor, i.e., a PMOS transistor PU1, and the gate pattern 4b", the source region PU2S and the drain region PU2D form a lower thin film transistor, i.e., a PMOS transistor PU2. The PMOS transistors PU1 and PU2 may be load transistors. An interlayer insulator 5e is formed on the whole surface of the semiconductor substrate having the load transistors PU1 and PU2. Before forming the interlayer insulator 5e, an etching stopper layer 5d may be additionally formed. The etching stopper layer 5d and the interlayer insulator 5e may be formed the same method as the etching stopper layer 3d and the interlayer insulator 3e. In this case, the interlayer insulator 5e and the etching stopper layer 5d may be respectively regarded as the interlayer insulator pattern and the etching stopper layer pattern.

Referring to FIG. 16A, FIG. 25, and FIGS. 29A and 29B, the etching stopper layer 5d and the interlayer insulator 5e are patterned to expose the source and drain regions PU1S and PU2D and expose the peripheral lower body pattern 3p of the peripheral circuit region P. As a result, the upper node contact holes 4f', and 4f" which sequentially penetrate the interlayer insulator 5e and the etching stopper layer 5d to expose the source and drain regions PU1S and PU2D may be formed in the cell region C. A semiconductor layer is formed to fill the upper node contact holes 4f' and 4f" on the interlayer insulator 5e and the peripheral circuit region P. The semiconductor layer may be formed of a single crystal semiconductor structure. The single crystal semiconductor structure may be formed by an epitaxial technique. The epitaxial technique may be a selective epitaxial technique. In more detail, a single crystal semiconductor structure, i.e., an epitaxial layer which covers the interlayer insulator 5e and the peripheral lower body pattern 3p and fills the upper node contact holes 4f' and 4f" is formed. The epitaxial layer may be formed to have a single crystal silicon structure. The epitaxial layer may be formed by a selective epitaxial growth technique which uses as a seed layer a predetermined region of the cell lower body patterns 3b' and 3b" exposed by the upper node contact holes 4f' and 4f" and the peripheral body pattern 3p.

As described in FIGS. 27A and 27B, in case where the single crystal semiconductor structure is patterned to form the cell lower body patterns 3b' and 3b" while removing the single crystal semiconductor structure of the peripheral circuit region P to expose the semiconductor substrate SUB of the peripheral circuit region P, the single crystal semiconductor structure, i.e., the epitaxial layer may be formed by a selective epitaxial growth technique which uses as a seed layer predetermined regions of the cell lower body patterns 3b' and 3b" exposed by the upper node contact holes 4f' and 4f" and the semiconductor substrate SUB of the peripheral circuit region P. Then, an upper surface of the epitaxial layer may be planarized by using a planarization technique such as a chemical mechanical polishing (CMP) technique.

Meanwhile, a semiconductor layer which fills the upper node contact holes 4f' and 4f" may be formed of a non-single crystal semiconductor layer on the interlayer insulator 5e and the peripheral circuit region P. For example, the semiconductor layer may be formed of an amorphous silicon layer or a poly silicon layer. The semiconductor layer may be planarized. In this case, before or after planarizing the semiconductor layer, the semiconductor layer may be crystallized using an epitaxial technique, i.e., solid phase epitaxial technique which employs as a seed layer the single crystal semiconductor structures which are arranged below the semiconductor layer and contact the semiconductor layer. As a result, the semiconductor layer can be formed as a single crystal semiconductor structure.

The single semiconductor structure is patterned to form upper body patterns 6a' and 6a" above the cell region C and form a peripheral upper body pattern 6p above the peripheral circuit region P. Here, the peripheral upper body pattern 6p is formed to have a peripheral trench 6b which defines first and second peripheral active areas 1p and 1p'. As a result, the peripheral upper body pattern 6p having the peripheral trench 6b is formed on the peripheral lower body pattern 3p of the peripheral circuit region P. The peripheral lower and upper body patterns 3p and 6p have the substantially same single crystal structure and may form a peripheral body pattern 6p'.

Meanwhile, in case of performing a process for patterning the previously formed single crystal semiconductor structure to expose the semiconductor substrate SUB of the peripheral circuit region P, the sequentially formed single crystal semiconductor structure may be formed to directly contact the semiconductor substrate SUB of the peripheral circuit region P. As a result, the peripheral body pattern 6p' may be formed of a single crystal semiconductor structure formed by a single process, i.e., a single crystal silicon structure. The upper body patterns 6a' and 6a" are formed to cover the upper node contact holes 4f' and 4f", respectively. The epitaxial layers formed in the upper node contact holes 4f' and 4f" may be defined as the upper node semiconductor plugs 4a' and 4a". The upper body patterns 6a' and 6a" are preferably formed to respectively overlap the lower body patterns 3b' and 3b". However, it is preferred that the upper body patterns 6a' and 6a" do not overlap the extension portions of the lower body patterns 3b' and 3b".

Meanwhile, a single crystal semiconductor layer which fills the upper node contact holes 4f' and 4f" may be formed on the interlayer insulator 5e and the semiconductor substrate SUB of the peripheral circuit region P. Subsequently, the single crystal semiconductor layer is planarized to form the first and second upper node contact plugs 4a' and 4a" and form a single crystal semiconductor layer which remains above the peripheral circuit region P. The single crystal semiconductor layer may be a single crystal silicon structure formed by the epitaxial technique. Then, a semiconductor layer, i.e., an upper body layer may be formed on the whole surface of the semiconductor substrate SUB having the upper node semiconductor plugs 4a' and 4a". In case where the upper node semiconductor plugs 4a' and 4a" are single crystal silicon plugs, the upper body layer may be formed of an amorphous silicon layer or a poly silicon layer. The upper body layer is patterned to form the first and second body patterns 6a' and 6a", and the upper body layer above the peripheral circuit region P is patterned to form a peripheral trench 6b which defines the first and second peripheral active areas 1p and 1p'. The first and second upper body patterns 6a' and 6a" may be crystallized by a solid phase epitaxial technique which is well known to a person having ordinary skill in the art. The element isolating insulating layer 7e' may be formed in the peripheral trench 6b. Here, when the element isolating insulating layer 7e' may be formed in the peripheral trench 6b, the element isolating insulating layer 7e' which fills a space between the upper body patterns 6a' and 6a" above the cell region C may be formed.

Meanwhile, the process for forming the element isolating insulating layer in the peripheral trench 6b may be omitted.

Referring to FIG. 16A, FIG. 25, and FIGS. 30A and 30B, a gate insulating layer is formed on the cell upper body patterns 6a' and 6a" and the peripheral body pattern 6p. A transmission gate pattern 6b, i.e., a word line insulated to cross over the upper body patterns 6a' and 6a" is formed, and a peripheral PMOS gate pattern 23a' and a peripheral NMOS gate pattern 20c" which are insulated to cross over the first and second peripheral active areas 1p and 1p' of the peripheral body pattern P are formed.

Meanwhile, before forming the peripheral gate patterns 23a' and 20c", impurity ions may be doped into the first and second peripheral active areas 1p and 1p' to form an n-type well 7f and a p-type well 7f'. In case where the peripheral body pattern 6p' is formed to have an n-type or p-type conductivity, a separate ion doping process for forming the n-type or p-type well may be omitted.

Impurity ions are doped into the upper body patterns 6a' and 6a" using the word line 6p as an ion doping mask. Further, impurity ions are doped into the first and second peripheral active areas 1p and 1p' using the peripheral gate patterns 23a' and 20c" of the peripheral circuit region P and the element isolating insulating layer 7e as an ion doping mask. As a result, source and drain regions T1S and T1D which are separated from each other are formed in the upper body pattern 6a', source and drain regions T2S and T2D which are separated from each other are formed in the upper body pattern 6a", source and drain regions P1S and P1D which are separated from each other are formed in the peripheral active area 1p, and source and drain regions N1S and N1D which are separated from each other are formed in the peripheral active area 1p'. In case where the source and drain regions T1S and T1D, T2S and T2D, P1S and P1D, and N1S and N1D have an LDD-type structure, an insulating spacer 7c may be formed on sidewalls of the word line 6b and sidewalls of the peripheral gate patterns 23a' and 20c".

The source regions T1S and T2S and the drain regions T1D and T2D of the cell region C may be n-type ion-doped regions. The source and drain regions P1S and P1D of the peripheral active area 1p may be p-type ion-doped regions, and the source and drain regions N1S and N1D of the peripheral active area 1p' may be n-type ion-doped regions. The word line 6b and the source and drain regions T1S and T1D constitute a cell upper thin film transistor, i.e., an NMOS transmission transistor T1, and the word line 6b and the source and drain regions T2S and T2D constitute a cell upper thin film transistor, i.e., an NMOS transmission transistor T2. The peripheral PMOS gate pattern 23a" and the source and drain regions P1S and P1D constitute a peripheral PMOS transistor P1, and the peripheral NMOS gate pattern 20c" and the source and drain regions N1S and N1D constitute a peripheral NMOS transistor N1.

A metal silicide layer may be selectively formed on surfaces of the gate electrodes and/or the source and drain regions of the peripheral transistors P1 and N1. For example, a silicide process for lowering electrical resistance of the gate electrodes and the source and drain regions of the NMOS transmission transistor T1, the NMOS transmission transistor T2, the peripheral PMOS transistor P1, the peripheral NMOS transmission transistor N1. The silicide process is a process technology for selectively forming the metal silicide layer on the gate electrode and the source and drain regions to lower the electrical resistance of the gate electrode and the source and drain regions. The silicide process includes a silicidation annealing process. As the silicidation annealing process, either a rapid thermal process which employs a radiation method using a light source such as a lamp or a conduction method using a hot plate or an annealing process of a convection method using a heat transfer gas.

In more detail, after forming the gate insulting layer on the cell upper body patterns 6a' and 6a" and the peripheral body pattern 6p, a silicon layer such as a poly silicon layer is formed on the substrate having the gate insulating layer. The poly silicon layer is patterned to form a poly silicon layer pattern which crosses over the cell upper body patterns 6a' and 6a" and form poly silicon layer patterns P1G and N1G which cross over the peripheral active areas 1p and 1p' of the peripheral body pattern 6p. An insulating spacer 7c is formed on sidewalls of the poly silicon layer patterns T1G, T2G, P1G, and N1G. The insulating spacer 7c may include a silicon oxide layer or a silicon nitride layer. Subsequently, the source and drain regions T1S and T1D, T2S and T2D, P1S and P1D, and N1S and N1D are formed. The poly silicon layer patterns T1G, T2G, P1G, and N1G and the source and drain regions T1S and T1D, T2S and T2D, P1S and P1D, and N1S and N1D may be exposed. Subsequently, a metal layer is formed on the semiconductor substrate having the poly silicon layer patterns T1G, T2G, P1G, and N1G and the source and drain regions T1S and T1D, T2S and T2D, P1S and P1D, and N1S and N1D. The metal layer may be formed of a nickel layer, a tungsten layer, a titanium layer, or a cobalt layer. Then, the metal layer may be subjected to the silicidation annealing process.

On the other hand, after forming the gate insulating layer on the cell upper body patterns 6a' and 6a" and the peripheral body pattern 6p, a gate conductive layer containing a metal silicide layer, for example, a poly silicon layer and a metal silicide layer which are sequentially stacked may be formed on the semiconductor substrate having the gate insulating layer. Next, a hard mask insulating layer may be formed on the gate conductive layer. The hard mask insulating layer and the gate conductive layer may be patterned to form a poly silicon layer pattern, a metal silicide layer pattern and a hard mask pattern which are sequentially stacked. As a result, the poly silicon layer pattern, the metal silicide layer pattern and the hard mask pattern which are sequentially stacked may be formed as a gate pattern, and the source and drain regions may be exposed. A metal layer may be formed on the semiconductor substrate having the gate pattern and then may be subjected to the silicidation annealing process. As a result, metal silicide layers may be formed in the source an drain region.

Using the silicide process, a gate metal silicide layer 7a, a PMOS gate metal silicide layer 24a' and the NMOS gate metal silicide layer 21a' may be respectively formed on the word line 6p, the peripheral PMOS gate pattern 23a' and the peripheral NMOS gate pattern 20c", the metal silicide layers may be formed on respective surfaces of the source and drain regions T1S and T1D and T2S and T2D of the word line 6b, the metal silicide layers 7d' may be formed on respective surfaces of the source and drain regions P1S and P1D of the peripheral PMOS gate pattern 24a', the metal silicide layers 7d' may be formed on the respective surfaces of the source and drain regions N1S and N1D of the peripheral NMOS gate pattern 20c". As a result, the word line 6p may be formed to have the poly silicon layer patterns T1G and T2G and the gate metal silicide layer 7a which are sequentially stacked. The peripheral PMOS gate pattern 23a' may be formed to have the poly silicon layer pattern P1G and the PMOS gate metal silicide layer 24a' which are sequentially stacked. The peripheral NMOS gate pattern 20c" may be formed to have the poly silicon layer pattern N1G and the NMOS gate metal silicide layer 24a' which are sequentially stacked. Accordingly, it is possible to lower the electrical resistance of the gate electrode and the source and drain regions of the peripheral transistors P1 and N1. That is, transmission rate of the electrical signal applied to the gate electrodes of the peripheral transistors P1 and N1 can be improved. Further, since the sheet resistance of the source and drain regions of the peripheral transistors P1 and N1 can be improved, drivability of the peripheral transistors P1 and N1 can be improved. As a result, it is possible to implement the high performance MOS transistors in the peripheral circuit region P. Furthermore, since the electrical characteristics of the gate electrode and the source and drain regions of the transmission transistors T1 and T2 of the cell region C can be improved, performance of the transmission transistors T1 and T2 can be improved.

Thus, since the silicide process for improving the performance of the transistors of the peripheral circuit region P can be performed, performance of the SRAM can be improved. Further, in the semiconductor integrated circuits which employ the thin film transistors, the high performance MOS transistors having improved electrical characteristics can be obtained since the MOS transistors of the peripheral circuit region are formed after the peripheral body pattern is formed, as described above. The performance of the SRAM depends on the peripheral circuits formed in the peripheral circuit region, and thus the performance of the SRAM is determined by the performance of the transistors which are necessary components of the peripheral circuits. In the embodiments of the present invention, since the peripheral body pattern 6p is formed by using the semiconductor substrate of the peripheral circuit region as the seed layer, the peripheral body pattern 6p may be closer in crystallinity to the semiconductor substrate. That is, since the epitaxial layer is formed from the whole surface of the semiconductor substrate of the peripheral circuit region, the single crystal structure of the peripheral body pattern may be closer to the single crystal structure of the semiconductor substrate. The peripheral transistors formed in the peripheral circuit region P may have similar characteristics to the bulk transistors substantially formed on the semiconductor substrate. Further, the peripheral transistors formed in the peripheral circuit region P are not affected by heat which may be generated during a process for forming the thin film transistors of the cell region C. That is, the epitaxial process and the spacer process for manufacture the thin film transistors of the cell region C can be performed at a typical high temperature. Characteristics of the transistors exposed to the processes performed at the high temperature may be degraded, but the transistors of the peripheral circuit region P are not affected by the high temperature processes. Furthermore, since the metal silicide layers can be respectively formed on the gate electrode and the source and drain regions of the transistors of the peripheral circuit region P, the performance of the transistors of the peripheral circuit region P can be more improved. Thus, reliability of the semiconductor device can be more improved.

The interlayer insulator 7e is formed on the whole surface of the semiconductor substrate having the NMOS transistors T1 and T2, the PMOS transistor P1, and the NMOS transistor N1. The etching stopper layer 7d may be additionally formed before forming the interlayer insulating layer 7e.

Referring to FIG. 16A, FIG. 25, and FIGS. 31A and 31B, the interlayer insulators 2e, 5e and 7e and the etching stopper layers 2d, 5d and 7d are etched to form a node contact hole 7f which exposes the source region T1S of the NMOS transistor T1, the upper node semiconductor plug 4a', the drain region PU1D of the transistor PU1, the lower node semiconductor plug 3a', the gate electrode PU2G, and the gate electrode PD2G and to form a node contact hole 7f" which exposes the source region T2S of the NMOS transistor T2, the upper node semiconductor plug 4a''', the drain region PU2D of the transistor PU2, the lower node semiconductor plug 3a''' the gate electrode PU1G, and the gate electrode PD1G.

Meanwhile, in case where the lower node semiconductor plugs 3a' and 3a'' have the different conductive type from the drain regions PD1D and PD2D or are intrinsic semiconductors, the node contact holes 7f' and 7f'' may be formed to expose the drain regions PD1D and PD2D of the MOS transistors PD1 and PD2, respectively.

A conductive layer is formed on the semiconductor substrate having the node contact holes 7f' and 7f''. The conductive layer is planarized to expose the interlayer insulator 7e. As a result, the node contact plugs 8a' and 8a'' are formed. The node contact plugs 8a' and 8a'' are preferably formed of a conductive layer which shows ohmic contact characteristics to both p- and n-type semiconductors. For example, the conductive layer may be formed of a metal layer such as a tungsten layer. Further, the conductive layer may be formed by sequentially stacking a barrier metal layer such as a titanium nitride layer and a metal layer such as a tungsten layer. In this case, each of the node contact plugs 8a' and 8a'' may be formed to have a tungsten plug and a barrier metal layer pattern which surrounds the tungsten plug.

The interlayer insulator 9c is formed on the semiconductor substrate having the node contact plugs 8a' and 8a''.

Referring to FIG. 16A, FIG. 25, and FIGS. 32A and 32B, the ground line contact plugs 9b' and 9b'' which penetrate the interlayer insulators 2e, 5e, 7e, and 9c and the etching stoppers 2d, 5d and 7d to respectively contact the source region PD1S in the second active area 1a' and the source region PD2S of the fourth active area 1a'' are formed. While forming the ground line contact plugs 9b' and 9b'', the power line contact plugs 9a' and 9a'' are formed which respectively contact the extension portion of the lower body pattern 3b' (source region PU1S of the load transistor) and the extension portion of the lower body pattern 3b'' (source region PU2S of the load transistor). Further, while forming the ground line contact plugs 9b' and 9b'', the output signal line contact plug 9e and the peripheral power line contact plug 9f which respectively contact the source and drain regions P1S and P1D of the PMOS transistor P1, and the output signal line contact plug 9e' and the peripheral power line contact plug 9f' which respectively contact the source and drain regions N1S and N1D of the NMOS transistor N1. The contact plugs 9a', 9a'', 9b', 9b'', 9f, 9e, 9f', and 9e' are preferably formed of a conductive layer which shows the ohmic contact characteristics to both p- and n-type semiconductors. For example, the contact plugs 9a', 9a'', 9b', 9b'', 9f, 9e, 9f', and 9e' may be formed the same way as the method of forming the node contact plugs 8a' and 8a'' which is described with reference to FIGS. 31A and 31B.

The interlayer insulator 11 is formed on the semiconductor substrate having the contact plugs 9a', 9a'', 9b', 9b'', 9f, 9e, 9f', and 9e'.

Referring to FIG. 16A, FIG. 25, and FIGS. 33A and 33B, the cell ground line 10a and the cell power line 10b are formed in the interlayer insulator 11. While forming the cell ground line 10a and the cell power line 10b, the peripheral power line 10e, the peripheral ground line 10f and the output signal line 10g may be formed in the interlayer insulator 11 of the peripheral circuit region P.

In the embodiments of the present invention, the inverter is depicted in the drawings as an example of the peripheral circuit, but the peripheral circuit is not limited to this. That is, the MOS transistors of the peripheral circuit region P can be used as components of the various peripheral circuits. That is, the peripheral power line 10e, the peripheral ground line 10f and the output signal line 10g are to implement the inverter as an example of the peripheral circuit, and the PMOS transistor and the NMOS transistor of the peripheral circuit region P can constitute various peripheral circuits.

The cell ground line 10a and the cell power line 10b may be formed to be substantially parallel to the word line 6b. The cell ground line 10 is formed to cover the ground line contact plugs 9b' and 9b'', and the cell power line 10b is formed to cover the power line contact plugs 9a' and 9a''. The output signal line 10g is formed to cover the output signal line contact plugs 9e' and 9f. The peripheral ground line 10f is formed to cover the peripheral ground line contact plug 9f'. While forming the output signal line 10g, the input signal line 10h which is electrically connected to the peripheral PMOS gate electrode 23a' and the peripheral NMOS gate electrode 20c'' may be formed. The input signal line 10h may be electrically connected to the peripheral PMOS gate electrode 23a' and the peripheral NMOS gate electrode 20c'' by the input signal line contact plug. The interlayer insulator 12 is formed on the semiconductor substrate having the ground lines 10a and 10f, the power lines 10b and 10e, the output signal line 10g, the input signal line 10h.

Referring to FIG. 16A, FIG. 25, and FIGS. 34A and 34B, the interlayer insulators 7e, 9c, 11, and 12 and the etching stopper layer 7d are etched to form the first and second contact plugs 13a' and 13a'' which respectively contact the drain region T1D of the NMOS transistor T1 and the drain region T2D of the NMOS transistor T2. The first and second parallel bit lines 14 are formed on the interlayer insulator 12. The first and second bit lines 14 are formed to cross over the cell ground line 10a and the cell power line 10b. The first bit line 14 is formed to cover the bit line contact plug 13a', and the second bit line 14 is formed to cover the bit line contact plug 13a''.

The above described embodiments have been described focusing on the static semiconductor memory device, but the peripheral circuit of the present invention can be employed in the dynamic semiconductor memory device to reduce the layout area size.

As described herein before, the semiconductor memory device and the arrangement method thereof according to the present invention can reduce the whole layout area size because it is possible to stack the transistors which constitute the peripheral circuit as well as the memory cell array.

Further, the semiconductor memory device and the manufacturing method thereof according to the present invention can provide the semiconductor integrated circuits having high integrated memory cells and high performance peripheral transistors because the memory cell having the thin film transistors is provided in the memory cell array and the peripheral transistors are provided in the peripheral body pattern of the single crystal semiconductor structure grown from the semiconductor substrate of the peripheral circuit region. That is, stable operation can be performed by stacking the transistors which constitute the memory cell array and arranging the transistors which constitute the peripheral circuit on the third layer.

What is claimed is:
1. An integrated circuit memory device, comprising:
   a semiconductor substrate;
   a static random access memory (SRAM) cell comprising a vertically stacked arrangement of a pair of NMOS access transistors, a pair of NMOS pull-down transistors and a pair of PMOS pull-up transistors, on said semiconductor substrate; and a logic gate comprising a vertically stacked arrangement of MOS transistors at three levels, on said semiconductor substrate.

2. The memory device of claim 1, wherein said SRAM cell is disposed in a memory cell portion of said semiconductor substrate; and wherein said logic gate is disposed in a peripheral circuit portion of said semiconductor substrate.

3. The memory device of claim 2, wherein said logic gate is selected from a group consisting of inverters, NAND gates and NOR gates.

4. The memory device of claim 1, wherein said logic gate is selected from a group consisting of inverters, NAND gates and NOR gates.

5. The memory device of claim 1, wherein said logic gate is an inverter comprising two NMOS transistors connected in parallel and one PMOS transistor.

6. The memory device of claim 1, wherein said logic gate is an inverter comprising at least one NMOS transistor and at least one PMOS transistor.

7. An integrated circuit memory device, comprising:
a semiconductor substrate;
a static random access memory (SRAM) cell comprising a vertically stacked arrangement of a pair of NMOS access transistors, a pair of NMOS pull-down transistors and a pair of PMOS pull-up transistors, on said semiconductor substrate; and
a logic gate comprising a vertically stacked arrangement of MOS transistors at three levels, on said semiconductor substrate;
wherein said logic gate is an inverter comprising two NMOS transistors connected in parallel and one PMOS transistor; and
wherein the two NMOS transistors in the inverter are vertically stacked relative to each other on two of the three levels.

8. The memory device of claim 7, wherein one of the two NMOS transistors is a bulk NMOS transistor.

9. The memory device of claim 8, wherein the PMOS transistor in the inverter is disposed between the two NMOS transistors.

10. An integrated circuit memory device, comprising:
a semiconductor substrate;
a static random access memory (SRAM) cell comprising a vertically stacked arrangement of a pair of NMOS access transistors, a pair of NMOS pull-down transistors and a pair of PMOS pull-up transistors, on said semiconductor substrate; and
a logic gate comprising a vertically stacked arrangement of MOS transistors at three levels, on said semiconductor substrate;
wherein said logic gate is an inverter comprising two PMOS transistors connected in parallel and one NMOS transistor; and
wherein the two PMOS transistors in the inverter are vertically stacked relative to each other on two of the three levels.

11. An integrated circuit memory device, comprising:
a semiconductor substrate;
a static random access memory (SRAM) cell comprising a vertically stacked arrangement of a pair of NMOS access transistors, a pair of NMOS pull-down transistors and a pair of PMOS pull-up transistors, on said semiconductor substrate; and
a logic gate comprising a vertically stacked arrangement of MOS transistors at three levels, on said semiconductor substrate;
wherein said logic gate is an inverter comprising two PMOS transistors connected in parallel and one NMOS transistor;
wherein one of the two PMOS transistors is a bulk PMOS transistor; and
wherein the NMOS transistor in the inverter is disposed between the two PMOS transistors.

12. The memory device of claim 11, wherein the NMOS transistor in the inverter is a thin-film transistor.

13. A semiconductor device, comprising:
a plurality of inverters including at least one first pull-up transistor and first pull-down transistor and inverting and outputting an input signal, respectively; and
a plurality of NAND pates including at least two second pull-up transistor and second pull-down transistor and generating an output signal having a high level if at least one of at least two input signals has a low level, respectively, wherein the at least one first pull-up transistor and first pull-down transistor and the at least two second pull-up transistor and second pull-down transistor are stacked and arranged on at least two layers;
wherein the first and second pull-up transistors are PMOS transistors, and the first and second pull-down transistors are NMOS transistors
wherein a transistor to be arranged on a first layer is a bulk transistor, and a transistor to be arranged on a second or more layer is a thin film transistor;
wherein some of the first and second pull-up transistors and some of the first and second pull-down transistors are arranged together on the first layer; and
wherein only the first and second pull-up transistors or only the first and second pull-down transistors are arranged on the second or more layer.

14. An integrated circuit memory device, comprising:
a semiconductor substrate;
a static random access memory (SRAM) cell comprising a vertically stacked arrangement of a pair of NMOS access transistors, a pair of NMOS pull-down transistors and a pair of PMOS pull-up transistors, on said semiconductor substrate; and
a logic gate comprising a vertically stacked arrangement of MOS transistors at three levels, on said semiconductor substrate;
wherein said logic gate is an inverter comprising an NMOS transistor and a PMOS transistor; and
wherein the NMOS transistor in the inverter and the PMOS transistor in the inverter are vertically stacked relative to each other on two of the three levels.

* * * * *